(12) United States Patent
Veyres et al.

(10) Patent No.: US 6,870,441 B2
(45) Date of Patent: Mar. 22, 2005

(54) METHOD FOR TRANSFORMING BANDPASS FILTERS TO FACILITATE THEIR PRODUCTION AND RESULTING DEVICES

(75) Inventors: Camille Veyres, Paris (FR); Jacques Detaint, Villemomble (FR)

(73) Assignee: France Telecom, Paris (FR)

( * ) Notice: Subject to any disclaimer, the term of this patent is extended or adjusted under 35 U.S.C. 154(b) by 34 days.

(21) Appl. No.: 10/415,056

(22) PCT Filed: Oct. 23, 2001

(86) PCT No.: PCT/FR01/03284
§ 371 (c)(1),
(2), (4) Date: Apr. 23, 2003

(87) PCT Pub. No.: WO02/35701
PCT Pub. Date: May 2, 2002

(65) Prior Publication Data
US 2004/0036554 A1 Feb. 26, 2004

(30) Foreign Application Priority Data
Oct. 24, 2000 (FR) .............................. 00 13606

(51) Int. Cl.[7] .......................... H03H 9/64; H03H 6/70; H01P 1/202; H01P 1/213
(52) U.S. Cl. ...................... 333/133; 333/127; 333/187; 333/193; 333/206
(58) Field of Search ................... 333/124–129, 333/131–134, 187, 189, 193, 206

(56) References Cited

U.S. PATENT DOCUMENTS

| | | | |
|---|---|---|---|
| 5,387,099 A | 2/1995 | Gellert | ........................ 425/564 |
| 6,081,171 A | * 6/2000 | Ella | ............................ 333/189 |

FOREIGN PATENT DOCUMENTS

| | | |
|---|---|---|
| DE | 2615282 | 11/1976 |
| EP | 0099088 | 1/1984 |
| FR | 1500630 | 11/1967 |
| FR | 2795993 | 1/2001 |

OTHER PUBLICATIONS

Dube. G., "Un Ensemble De Programmes Relatifs Aux Filtres Passifs", Revue Technique Thomason CSF, Thomason–CSF, FR, vol. 6, mrs 1974, pp. 81–104, XP001012535.

Amstutz P, "Elliptic approximation and elliptic filter design on small computers" IEEE Transactions on Circuits and Systems, Dec. 1978, XP001002946, pp. 1001–1011.

Skwirzynski JK, "On synthesis of filters", IEEE Transactions on Circuit Theory, Jan. 1971, XP001002945, vol. cd–18, No. 1, pp. 152–163.

R. Saal et al., "On the Design of Filters by Synthesis", IEEE Transactions on Circuity Theory. vol. 5, Dec. 1958, pp. 284–327, XP001002944, IEEE Inc., New York.

Guenther A E: "Electro–Mechanical Filters Satisfying Additional Demands", Int'l Symposium on Circuit Theory, 1973, pp. 142–145, XP001012533.

* cited by examiner

*Primary Examiner*—Barbara Summons
(74) *Attorney, Agent, or Firm*—Blakley Sokoloff Taylor & Zafman

(57) ABSTRACT

The invention concerns a method for optimizing elements of a narrow or intermediate band bandpass filter whereof the LC prototype has been determined. The invention is characterized in that it comprises steps which consist in: (i) breaking down several parallel or series capacitors of resonators with X elements, (ii) inserting pairs of transformers between the first and second separated element and the rest of the resonator, (iii) displacing the residual transformers to modify the impedance levels of the resonators, and (iv) absorbing the residual transformers by transformation. The invention also concerns the resulting filters.

44 Claims, 19 Drawing Sheets

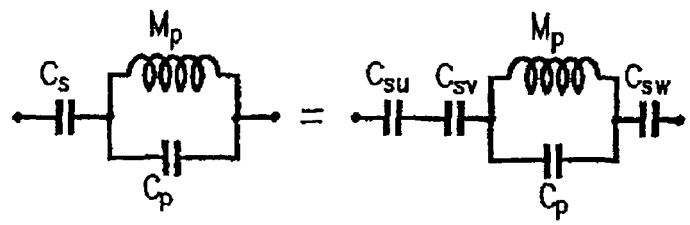
FIG. 4a
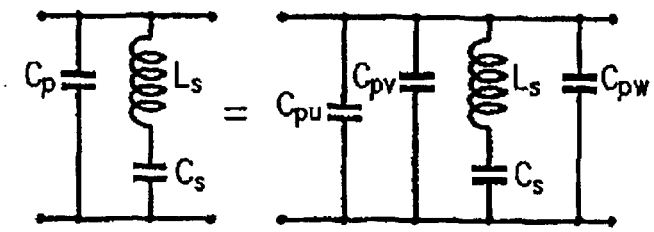
FIG. 4b
FIG. 5
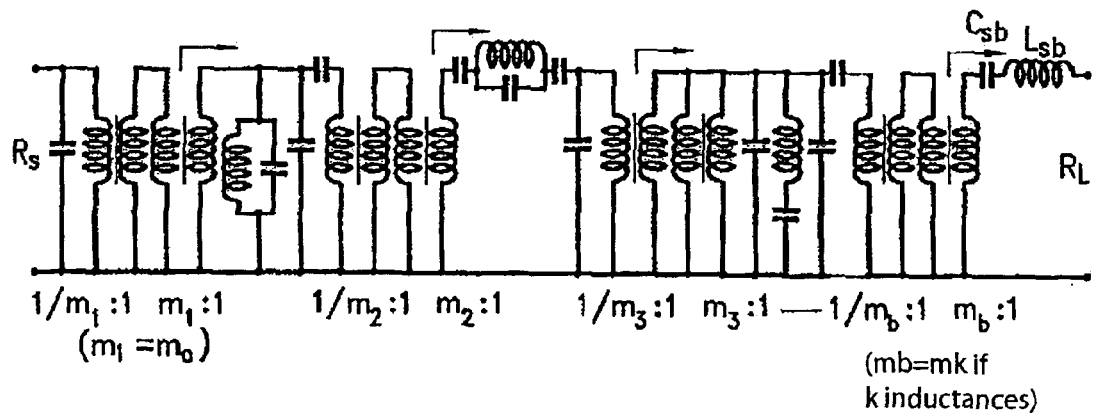
FIG. 6
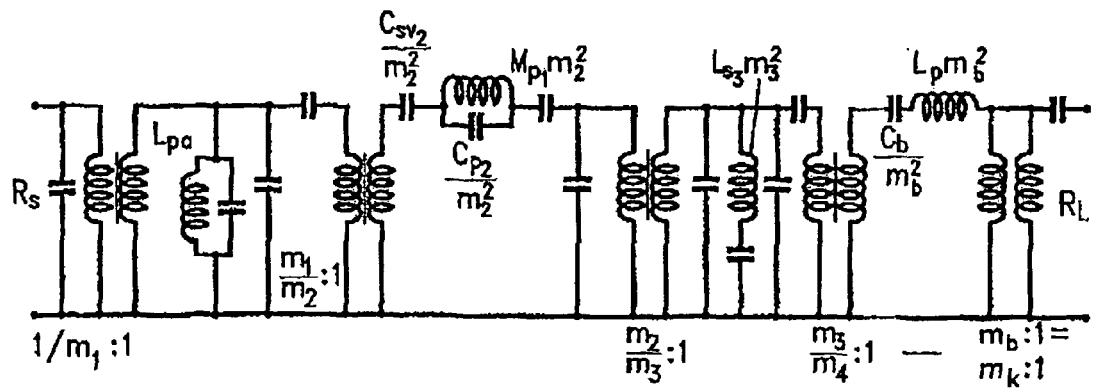

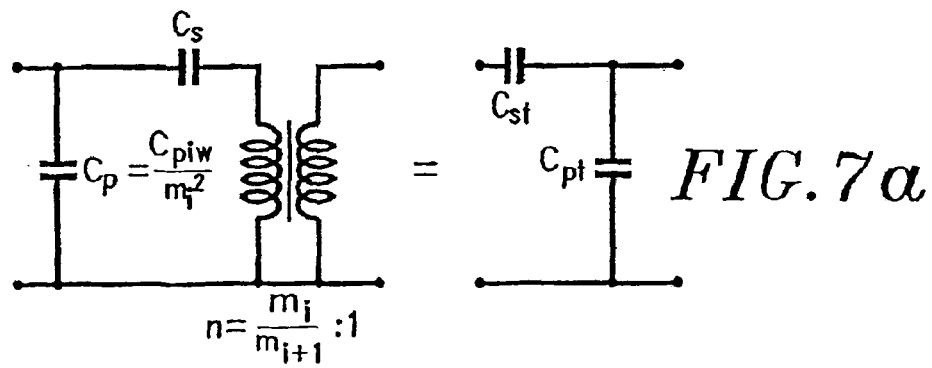
FIG. 7a
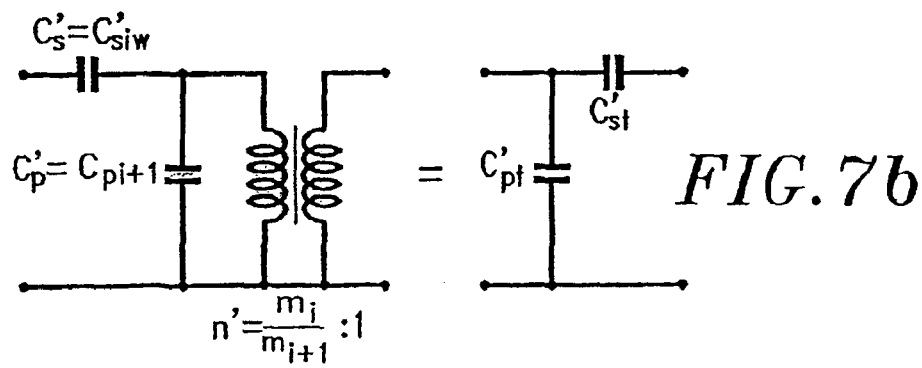
FIG. 7b
FIG. 8a
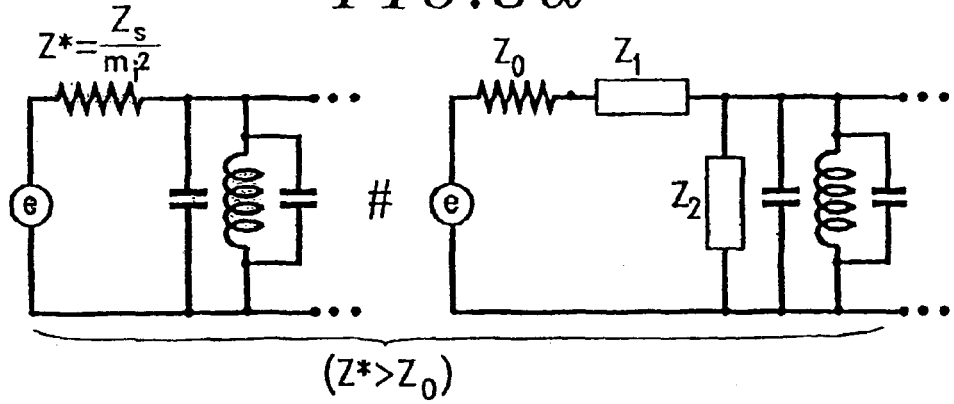
FIG. 8b
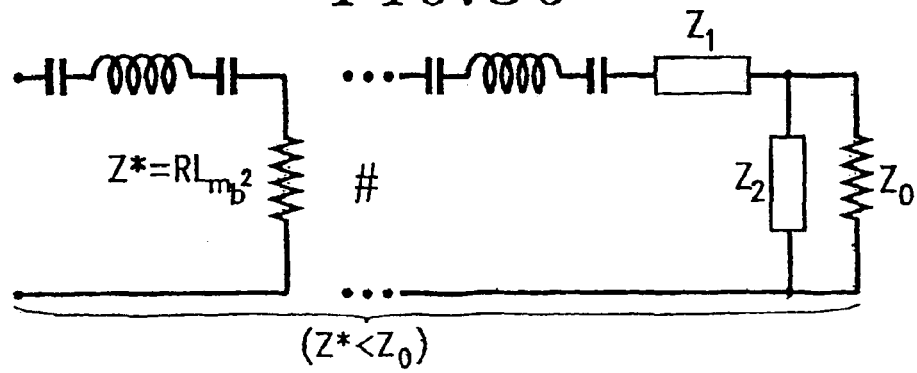

FIG.23
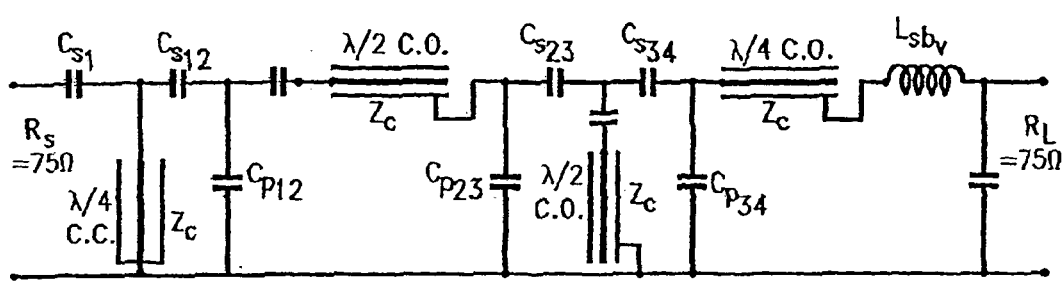
FIG.24
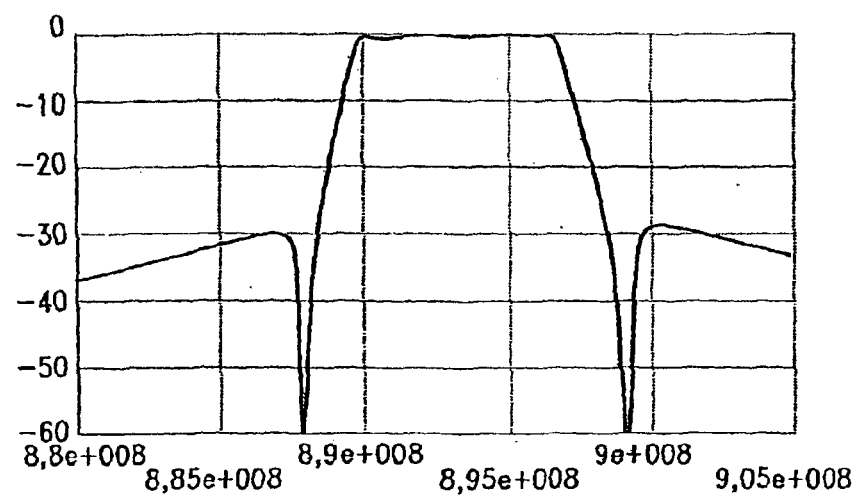
FIG.25

Order 12 zigzag
prototype Fc=520 MHz

Frequency (MHz)

Response of the transformed filter for TEM resonators Zc = 11.5 ohms (matching for inductances at both ends)

A (dB) Transformed filter (matching by two capacitances)

A (dB) Transformed filter (matching by two capacitances)

Response of the crystal filter obtained by transformation (lossless)

Transformed filter response taking account of losses

Transformed filter response taking account of losses (pass bands)

FIG.36
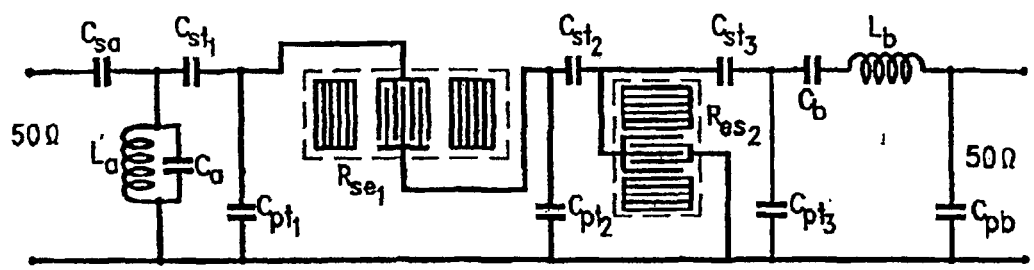
FIG.37
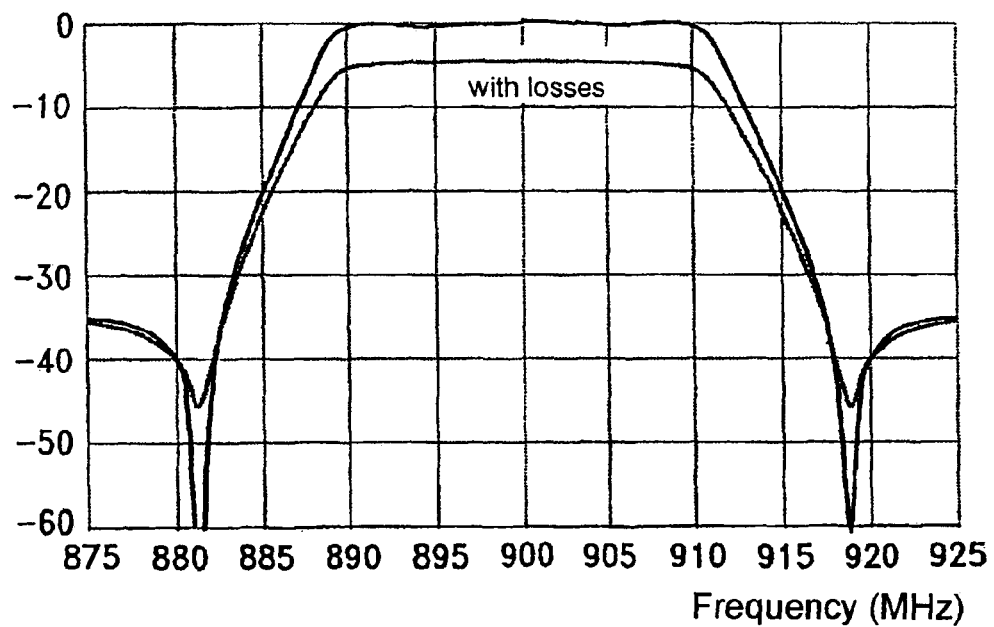
FIG.38a
FIG.38b
FIG.38c
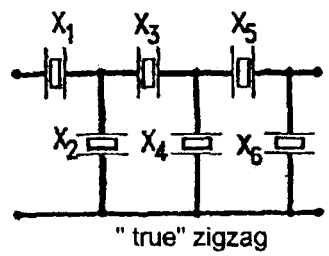
"true" zigzag
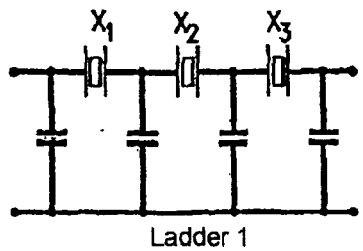
Ladder 1
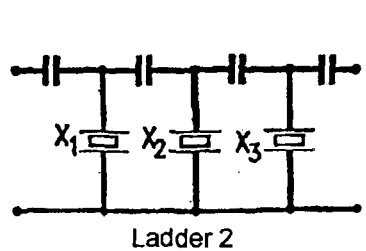
Ladder 2

Frequency (MHz)

Frequency (MHz)

(a) ⇔ (b)

METHOD FOR TRANSFORMING BANDPASS FILTERS TO FACILITATE THEIR PRODUCTION AND RESULTING DEVICES

The present patent application is a non-provisional application of International Application No. PCT FR 01/03284, filed Oct. 23, 2001.

The present invention relates to the field of pass band filters.

INVENTION GENERAL PURPOSE

The present invention relates to a process for transformation of a circuit for the manufacture of high performance filters or multiplexers under acceptable technical and economic conditions.

It is used to make pass band filters and multiplexers from prototypes with different topologies with response types varying from the simplest to the most general, and only using inductances all equal to fixed values (or only a small number of different predetermined values) to maximize performances and/or minimize the cost and/or predetermined values of capacitances.

It is also used to make filters exclusively using dielectric resonators with the same characteristic impedance, or piezoelectric resonators with approximately or exactly the same ratio of capacitances and with similar or equal inductances.

The process can be applied to hybrid filters or multiplexers using inductances and dielectric resonators and/or piezoelectric resonators and obtaining the same advantages.

The essential purpose of the present invention is to obtain high performance filters and multiplexers under better technical and economic conditions than are possible according to the state of prior art.

The design process proposed within the present invention applies particularly to ladder pass band filter classes with a general response (characterised by a transfer function that is a rational fraction) that may be obtained by synthesis (or by a circuit transformation after synthesis), in order to obtain a minimum inductance topology (zigzag). These filter classes are necessary in practice when it is required to make high performance filters economically because they make more efficient use of expensive filter elements. The process is equally applicable to other filter topologies including filter topologies conventionally used to make polynomial filters.

The technique proposed within the framework of the present invention comprises three main variants applicable particularly to filters using inductances and capacitances, filters with dielectric resonators and filters using piezoelectric resonators with bulk or surface waves that will be described one after the other.

GENERAL CONTEXT OF THE INVENTION

Passive filters with LC circuit or dielectric resonators, or surface or bulk wave acousto-electric resonators are widely used in telecommunications and particularly in radioelectric transmissions or on cable to limit the signal spectrum or for switching to enable sending (and extraction) of several signals occupying different frequency bands on the same antenna or on the same transmission support. In most cases, they are filters used in large numbers for which high performances are required at the lowest possible cost.

The cost of filters, and often their insertion losses, depends largely on the number of inductances (and/or resonators) used since inductances and the various resonator types are significantly more expensive than capacitors. For a given number of these elements, the cost is very strongly reduced if the filters only comprise one standard model. It is further reduced if the only distinction in the manufacture of the expensive elements used is in the use of an inexpensive and necessarily individual technological step (for example this is the case for the frequency adjustment of dielectric resonators with the same characteristic impedance, or piezoelectric resonators with the same design).

Note also that dissipation from inductances and TEM dielectric resonators is usually greater than from capacitances, and that there are ranges of values or of parameters that minimize their losses for each frequency.

Thus, for a given technique, the range in which inductances or resonators with good characteristics (overvoltage, parasite elements, etc.) can be made is much narrower than the range in which capacitances with favourable characteristics can be made. These elements are also made in smaller quantities, and in prior art often had to be made specially to make a given filter.

More precisely, there is only a fairly narrow range of inductance values that can be bought off-the-shelf or specially made for which good performances (overvoltage, natural resonant frequency, etc.) can be obtained at an attractive cost, for frequencies higher than a few Megahertz.

Filters calculated by conventional methods usually include inductances with different values, and therefore are unlikely to correspond to standardized values available off-the-shelf.

In practice, for TEM dielectric resonators, there are only a few values of permittivity and a small number of dimensions (sections) and therefore characteristic impedances of resonators.

For resonators that use a bulk or surface acousto-electric interaction, it is only known how to make devices with a small number of values of the ratio of the two capacitances (as a first approximation, this magnitude only depends on the material (for example quartz), the wave type and the crystalline orientation), and for a given frequency, inductances located within a very narrow range of values. In practice at the present time, this state of affairs reduces the number of circuit topologies used to make crystal filters.

Therefore, it is very useful to find techniques that only use a few (if possible only one which will optimise the cost) well chosen value(s) for all inductances, in inductance filters and capacitances. Similarly, for dielectric resonator filters, it is necessary to use only the few available values of characteristic impedances (only one will give the most economic solution, if possible). Similarly, for a piezoelectric resonators filter, it must be possible to use devices with a value very close to a given value of the capacitances ratio and an inductance located within a narrow range. It is also very useful to make ladder crystal filters with a general response, since sensitivity properties to dispersions obtained for this topology are better than dispersions obtained for differential structure filters.

For obvious reasons of efficiency, the invention broadly covers filter classes that make very good use of inductances (or various types of resonators); in this presentation, efficiency is understood as being characterised by selectivity, for example measured by a shape factor obtained for a given number of inductances or resonators.

The most attractive of these filter classes are called "minimum inductances" filter classes, and have a ladder topology. This "zigzag" topology (using an extended meaning beyond the definition of reference [5]), is called zigzag because (in the discrete elements representation), it is composed of an alternation of horizontal and vertical arms composed of irreducible three-element dipoles (one inductance and two capacitances forming a resonator with a series inductance (Z=0) and a parallel resonance (Y=0)), possibly except for the arms at the ends. These resonators themselves can also be arranged according to two topologies (known transformation formulas can be used to change from one to the other, and will be described later). The dipoles at the ends of the filter may comprise one, two or three L, C elements. The zigzag filters are considered as being technologically better [1] [2] [3] than the more usual ladder topology filters (except for a few reserves for some cases, possibly except for filters with this same ladder shape and that would comprise more complex irreducible dipoles than those with three elements in each of their arms). These latter filters have not been studied very much, and rarely have any additional interest. Furthermore, unlike the case of dipoles with three elements, there is only a small number of distributed dipoles that can be represented by such equivalent circuits and that have a particular interest (in practice, only multimode distributor resonators can have any particular interest).

Filter classes [1] [5] with a zigzag topology thus defined (Skwirzynski classification based on the properties of the numerator and denominator polynomials of the transfer function S(p) and the characteristic function Φ(p), and more particularly the functions that affect the behaviour at zero and infinite frequencies), include particularly the even order elliptical filters (equal ripple in pass band and in attenuated band) that make the most efficient use of inductances to approximate a rectangular envelope curve (a Chebyshev approximation both in pass band and in attenuated band). For these filters, the zigzag topology is obtained by synthesis or from more usual topologies using the Saal and Ulbrich [2] transformation. It includes LC resonators with two elements of two different types at the two ends.

Other filter types with the same topology or with a similar topology (that are different due to the dipoles at the ends) are also known. The responses of some filters are more attractive than the responses of the above filters in cases in which it is desirable to have asymmetry of the slopes of the transition bands, or different attenuations in the two attenuated bands, and different behaviours at f=0 and at f=∞.

Ladder filters composed entirely of three-element dipoles (zigzag in the strict sense for reference [5]) also have the advantage of having the maximum number of attenuation poles at finite frequencies that can be made simply with a given number of inductances, the properties of functions forming their distribution matrix are such that they have some minor theoretical and practical disadvantages compared with the previous filters (including more complex calculation and manufacture). However, like all topologies composed only of this type of resonator and capacitance, their main usefulness is for making filters using distributed elements that can be represented by this type of circuits, at least close to some of their characteristic frequencies.

FIG. 1 shows an example of a minimum inductance filter (zigzag).

This FIG. 1 shows two end quadripoles A and B separated by four dipoles $R_{31}$, $R_{32}$, $R_{33}$, $R_{34}$.

In this case, quadripole A comprises an inductance and a capacitance placed in parallel between two horizontal conducting arms (two-element dipole).

In this case, quadripole B comprises an inductance and a capacitance in series on the horizontal upper arm, and a horizontal lower conducting arm (also a two-element dipole).

Dipoles $R_{31}$ and $R_{33}$ are placed in series on the upper horizontal arm between the two quadripoles A and B.

Dipole $R_{33}$ forms a vertical arm placed between the two dipoles $R_{31}$ and $R_{33}$. The dipole $R_{34}$ forms another vertical arm placed between dipole $R_{33}$ and quadripole B.

Each of the four quadripoles $R_{31}$, $R_{32}$, $R_{33}$ and $R_{34}$ comprises an inductance and two capacitances (three-element dipole) arranged:

either in the form of a capacitance in series with a circuit comprising a second capacitance in parallel with an inductance, or in the form of a capacitance in parallel with a circuit comprising a second capacitance in series with an inductance, as shown diagrammatically in FIG. 2.

The circuits for the zigzag filters obtained directly by different synthesis methods (or by a transformation) almost always contain inductances (or equivalent inductances for dielectric or piezoelectric resonators) with very different values.

Pass band multiplexers are sets of filters with at least one (and sometimes n) common access and p other accesses and performing selective switching of signals contained in a given frequency band from an access (for example the single common access) to another. Known methods of calculating multiplexers are usually based on digital optimisation techniques.

STATE OF PRIOR ART

Minimum inductance filters have been known for a long time (for example see the book by Zverev [3]). Elliptical filters (Cauer) have also been known for a long time, and have been described in many articles and tabulated by many authors (for example see [2] and [3]). The method proposed by P. Amstutz [4] and the method of transforming conventional topologies of even filters into minimum inductance filters (zigzag) as proposed by Saal and Ulbrich [2], are often used for the synthesis of these filters.

The design of filters with "infinite" attenuation points at frequencies fixed in advance and with equal ripple in the pass band by transformation in z is described in reference [2] that is used to determine the characteristic polynomials of the filter and to synthesize them using methods clearly described in the same article and described in the book by Mr. Hassler and Mr. Neyrinck [5] and also in the *Techniques de l'Ingénieur* (Engineering Techniques) [6] collection.

It is also important to remember that there are some known examples of methods of synthesizing polynomial pass band filters with very narrow bands, so that they can use inductances with the same values or identical resonators (P. Amstutz [7]). These methods usually use impedance inverters (or admittance inverters) that can only be made approximately by quadripoles with known discrete passive elements (valid approximation within a very narrow frequency band). Note also that when an attempt is made to economically obtain high performances, polynomial filters are less attractive since their performance is not as good for the same number of inductances (or resonators) as filters with more general responses.

Impedance or admittance inverters can be made fairly approximately by the use of distributed elements, and the use of such components is fairly natural in filters using resonators that are themselves distributed. For example, the design of filters with impedance inverters with determination of the transfer function to have the same ripple in the pass band with "infinite" attenuation points at frequencies given in advance and a direct synthesis, is described by R. J. Cameron in references [8], [9], whereas a precise example of making impedance inverters was given by G. Macchiarella [10].

Note also that there are many other techniques for calculating dielectric resonator and piezoelectric resonator filters. This calculation is usually made starting from the calculation of inductance filters and capacitances by circuit transformations leading to the appearance of equivalent circuits with discrete elements of these components making use of different approximation techniques. References [11 to 15] describe elements concerning dielectric resonators and particularly resonators using transverse electromagnetic (T.E.M.) modes of dielectric solids with simple geometries (usually coaxial) and they are used to make filters used in the field of mobile radio communications. References [16 to 20] describe principles governing the operation of piezoelectric resonators with bulk and surface waves, and principles about their use to make pass band filters.

Furthermore, there are several known techniques for the transformation of circuits (Norton, Haas, Colin transformations, etc.). However, apart from Saal and Ulbrich transformation that only aims at a topology modification, transformations of LC filter circuits are always presented as being made on only some elements of the filter, and not systematically [23 to 26].

The calculation of pass band multiplexers has almost always been based on digital optimisation techniques, and has been known for some time [27]. However, a great deal of recent progress has been made with this technique [28–29]. Apparently there has been no attempt to make systematic circuit transformations on these devices.

Despite the very abundant literature available on filters, no fully satisfactory technique has yet been proposed for their design.

Due to the lack of a systematic approach in the past, circuit transformations were only made to modify the values of some components of a filter (often the inductances). Known transformations were usually made manually, and additional degrees of freedom that could have been introduced by separating components were not used systematically.

One particular result was that the real advantages of "minimum inductance" filters were rarely used for LC filters with inductances and capacitances for frequencies higher than about 10 MHz, and even more rarely (no known examples to the inventors) for dielectric resonator filters or piezoelectric resonator filters. This was mainly due to the fact that filters made using partial transformations, made only to modify a few values of inductances (in practice impossible to achieve or that excessively degraded performances), were not sufficiently attractive economically, or did not make a sufficient improvement to the ease of manufacturing.

In particular, work done by the inventors shows that the only way of obtaining an important economic advantage while facilitating manufacturing is by a global consideration of all transformations and the simultaneous use of additional degrees of freedom possible using this global approach.

DESCRIPTION OF THE INVENTION

The systematic and global process for transformation of "minimum inductance" pass band filters and several other filter topologies according to the present invention, is intended to obtain filters using only one (or few) determined value(s) of inductances, or using dielectric resonators with the same characteristic impedance, or using piezoelectric resonators with approximately or exactly the same capacitance ratios and approximately or exactly the same inductances. This process also has advantages other than those mentioned above, such as the choice of equal values for some capacitances or the choice of typical off-the-shelf values for some capacitances. The process is equally applicable under similar conditions to connection filters composed of filters made according to previously mentioned technologies.

The process will be described principally for the case of filters with a minimum number of inductances that are among the most general filters, and in practice among the most useful for economically obtaining high performances. We will mention later on that, without any significant change to the principle the process is applicable to other simpler filter topologies (for example polynomial pass band filter topologies) that, although they do not use inductances or resonators as efficiently as the previous filters, may be attractive in some special cases.

In order to get a clear understanding of the invention, remember that three-element resonators (one inductance and two capacitances) may occur in one of the two forms illustrated in FIG. 2 comprising a capacitance $C_{sa}$ in series with a parallel resonator LC formed from the capacitance $C_{pa}$ and the inductance $M_{pa}$, or in a dual manner by putting a capacitance $C_{pb}$ in parallel and a series resonator formed by the inductance $L_{sb}$, in series with the capacitance $C_{sb}$. By convention, the first form a will be called a "series form" and the second form b will be called a "parallel form" in the rest of this text.

The following relations show the correspondences between the two forms "a" and "b":

$C_{pa}/C_{sa}=C_{pb}/C_{sb}=$"ratio of resonator capacitances" with three elements $M_{pa} C_{pa} \omega_a^2 = 1$  $L_{sb} C_{sb} \omega_b^2 = 1$ $\omega_b^2 = \omega_a^2/[1+C_{sa}/C_{pa}] = \omega_a^2/[1+C_{sb}/C_{pb}]$ $C_{sa}=C_{pb}+C_{sb}$;  $C_{pa}=C_{pb}[1+C_{pb}/C_{sb}]$;  $M_{pa}=L_{sb}[1+C_{pb}/C_{sb}]^2$ $C_{pb}=C_{pa}/[1+C_{pa}/C_{sa}]=C_{sb}+C_{sa}/[1+C_{pa}/C_{sa}]$  $L_{sb}=M_{pa}[1+C_{pa}/C_{sa}]^2$ where $\omega_a$ and $\omega_b$ are the anti-resonant frequency (Y=0) and the resonant frequency (Z=0) angular frequencies of the lossless resonator. These dipoles are characterised by three parameters that can be chosen in different manners. The capacitances ratio is a useful parameter because it is independent of the "impedance level" (for example characterised by the value of the inductance) and it depends only on the ratio of remarkable frequencies and their relative difference.

We will describe the process according to this invention firstly by considering the example of the case of a zigzag filter with a topology similar to the topology indicated in FIG. 1, for which the number of three-element resonators is K (even) and that has two resonators with two elements at the ends as shown in FIG. 1. The proposed process is also applicable to cases of zigzag filters with other types of dipoles at the ends (comprising not more than one inductance) and also to the case of usual topologies of polynomial filters (sequence of series LC dipoles in horizontal arms and parallel LC dipoles in vertical arms). It is also more generally applicable to the case of ladder filters comprising a maximum of one inductance per arm and satisfying conditions that will be specified later.

The process according to this invention for systematic modification of impedance levels of resonators in a synthesis LC filter or obtained by transformation from a prototype as described above is preferably based on the following steps:

A/ Decomposition of Capacitances

Decomposition into three parts of parallel capacitances $C_p$ or series capacitances $C_s$, into resonant circuits with two LC elements in parallel or in series (in this case located at the ends of the filter), for example as illustrated in FIGS. 3a and 3b.

The decomposition illustrated in FIG. 3a consists of replacing a parallel circuit comprising an inductance $L_p$ in parallel with a capacitance $C_p$ by a circuit comprising an inductance $L_p$ in parallel with three capacitances $C_{pu}$, $C_{pv}$ and $C_{pw}$.

The decomposition illustrated in FIG. 3b consists of replacing a series circuit comprising an inductance $L_s$ in series with a capacitance $C_s$ by a circuit comprising an inductance $L_s$ in series with three capacitances $C_{su}$, $C_{sv}$ and $C_{sw}$.

The result is:

$$C_{pa} = C_{pa\;u} + C_{pa\;v} + C_{pa\;w} \text{ (input side A)}$$

$$C_{sb} = C_{sb\;u}^{-1} + C_{sb\;v}^{-1} + C_{sb\;w}^{-1} \text{ (output side B)}$$

Decomposition of series capacitances $C_s$ associated with the three-element resonators (horizontal) in series form, into three parts, for resonator number q (as illustrated in FIG. 4a). This gives $C_{s\;q}^{-1} = C_{s\;qu}^{-1} + C_{s\;qv}^{-1} + C_{s\;qw}^{-1}$.

The decomposition illustrated in FIG. 4a consists of replacing a circuit comprising a capacitance $C_s$ in series with a resonator formed from an inductance $M_p$ in parallel with a capacitance $C_p$, by a circuit comprising two capacitances $C_{su}$, $C_{sw}$ in series on the input side of a resonator formed from an inductance $M_p$ in parallel with a capacitance $C_p$ and a third capacitance $C_{sw}$ in series on the output side of this resonator.

Decomposition of shunt capacitances $C_p$ associated with the three-element resonators (vertical) in parallel form into three parts, for resonator number r (as illustrated in FIG. 4b). This gives $C_{pr} = C_{pru} + C_{prv} + C_{prw}$.

B/ Insert pairs of transformers with ratios $1/m_i$ and $m_i/1$ between the first element thus separated with subscript u and the rest of the resonator, for example between $C_{p\;ru}$ and the residual shunt resonator formed from $L_{sr}$ in series with $C_{sr}$, with $C_{p\;rv}$ and $C_{p\;rw}$ in parallel (see FIG. 5). One pair of transformers will be input for each inductance to be transformed.

C/ Displace a transformer from each pair to the next resonator transformer (FIG. 6). The consequences are to:
- modify impedance levels of resonators (which is one essential purpose of the invention),
- make transformers with ratios such as $m_1/m_2=1$, then $m_2/m_3=1$ then $m_3/m_4=1$, ..., etc. appear, and to modify the value of the filter closing impedance at end B.

D/ Eliminate internal transformers by Norton equivalence, and replace these transformers and two capacitances determined in the previous decomposition and the values of which were modified by displacement of transformers, by two other capacitances. For filters with the topology given in FIG. 2, the transformation relations give $2*(N/2-1)$ relations (N=filter order, which in this case includes a total of N/2 resonators) relating the values of the new capacitances to the old capacitances and to transformation ratios and conditions on transformation ratios ($m_i/m_{i+1}$) such that these transformations are possible (positive signs of transformed elements).

FIGS. 7a and 7b diagrammatically show two of these transformations, according to the original configuration of capacitances.

The transformation illustrated in FIG. 7a consists of replacing a circuit comprising a parallel capacitance $C_p$ on the input side and a parallel transformer on the output side, connected through a series capacitance $C_s$ on the head arm by a circuit comprising a series capacitance $C_{st}$ on the input side and a parallel capacitance $C_{pt}$ on the output side.

For the case in FIG. 7a, if n is the transformation ratio ($n = m_i/m_{i+1}$, where i is odd):

The imposed condition necessary to be able to make the transformation is:

$$C_p = C_{piw}/m_i^2 = C_s[(m_i/m_{i+1})-1] = (C_{si+1\;u}/m_i^2)[(m_i/m_{i+1})-1]$$

where $C_{piw} = C_{si+1u}(m_i - m_{i+1})/m_{i+1}$
and $m_i > m_{i+1}$ or $n > 1$.

The values of elements resulting from the transformation are then:

$$C_{st} = C_{si,i+1} = C_{piw}/[m_i(m_i - m_{i+1})] = C_{si+1u}/(m_i - m_{i+1})$$

$$C_{pt} = C_{pi,i+1} = C_{piw}/m_i(m_i - m_{i+1}) = C_{si+1u}(m_i - m_{i+1})/(m_{i+1}^2 m_i)$$

The condition necessary to only have positive elements is then that $n>1$ or $m_i > m_{i+1}$ (where i is odd and for a zigzag filter according to FIG. 1).

The transformation illustrated in FIG. 7b consists of replacing a circuit comprising a series capacitance $C'_s$ on the input side and a parallel capacitance $C'_p$ on the output side with a parallel transformer on the output side, by a circuit comprising a parallel capacitance on the input side $C'_{pt}$ and a series capacitance on the output side $C'_{st}$.

For the case shown in FIG. 7b, if n' is the transformation ratio ($n' = m_i/m_{i+1}$ where i is even):

The imposed condition necessary to be able to make the transformation is:

$$C'_s = C_{siw}/m_i^2 = C'_p[m_i/(m_{i+1}-m_i)] = (C_{pi+1u}/m_i^2)[m_i/m_{i+1}-m_i)]$$

The values of elements resulting from the transformation are then:

$$C'_{si} = C_{si,i+1} C p_{i+1u}[m^2_{i+1}/((m_{i+1}-m_i)m_i)]$$

$$C'_{pi} = C_{pi,i+1} = C_{p(i+1)u}/(m_i.m_{i+1})$$

The necessary condition to obtain only positive elements is that $n<1$, namely $m_i<m_{i+1}$ (if i is even and for a zigzag filter according to FIG. 1).

E/ Elimination of Transformers From Ends

By transformation using known narrow band equivalences (for example see references [7] and [23 to 26]), it is possible to replace transformers remaining at the ends of the filter by two impedances with opposite signs (C and L or C and −C' or L and −L') forming a Gamma (Γ) or a Tau (τ) depending on the transformation ratio. Steps are frequently taken such that one of the components located at the corresponding end (or a capacitance resulting from the decomposition of the original capacitances into three parts, or an original inductance for which the value was modified by displacement of transformers) is absorbed in this transformation or is replaced by another component with the same nature and with a different value. The result is that the number of components is not significantly increased (which is a means of absorbing negative values that can occur for example in the separation of capacitances).

In all cases, the transformation relations are written (there are two transformation relations at each end) together with the relation related to absorption or recombination of a component, if there is such a relation.

If $Z_0$ is the required termination impedance, and if $Z_s$ and $Z_t$ are the termination impedances of the zigzag prototype circuit after displacement of transformers at the ends, the termination impedances are $Z^* = Z_s/m_1^2$ and $Z^* = Z_t m_k^2$ respectively, if there are k inductances in the prototype. Either the transformation in FIG. 8a or the transformation in FIG. 8b (derived from each other) may be used, depending on whether $Z^*$ is greater than or less than $Z_0$.

In both cases, matching is done using an impedance $Z_1$ in series on a horizontal branch, and an impedance $Z_2$ in parallel on a vertical branch.

For the case in FIG. 8a, matching is done using impedances $Z_1$ and $Z_2$ with opposite signs:

$$Z_1 = \pm j\sqrt{Z_0(Z^* - Z_0)} \text{ and } Z_2 = \pm jZ^*\sqrt{\frac{Z_0}{Z^* - Z_0}}.$$

For example, for end A of the zigzag filter in FIG. 1, we have $Z^* = Z_s/m_1^2$, if $Z_s m_1^2 > Z_0$ and if the impedance $Z_1$ is chosen to be a capacitance, then $Z_2$ will be a negative capacitance that will be subtracted from $C_{p\ 1u}$ and $C_{p\ 1v}$ or an inductance in parallel with the transformed inductance $L_a$. This transformation is made for the central frequency of the filter ($\omega = \omega_c$).

Then:

$Z_1 = -j/C_{sa}\omega = -j\{Z_0(Z_s m_1^2 - Z_0)\}^{1/2}$ or $C_{sa} = 1/\{\omega^2 Z_0(Z_s m_1^2 - Z_0)\}^{1/2}$ $Z_2 = +jZ_s m_1^2 * \{Z_0/(Z_s m_1^2 - Z_0)\}^{1/2}$ or $C_{pa} = -\{(Z_s m_1^2 - Z_0)/Z_0\}^{1/2}/(\omega \cdot Z_s \cdot m_1^2)$ The case in FIG. 8b can easily be transposed from the previous case:

$$Z_1 = \pm j\sqrt{Z_0(Z^* - Z_0)} \text{ and } Z_2 = \pm jZ_0\sqrt{\frac{Z^*}{Z_0 - Z^*}}.$$

For example, for end B of the zigzag filter in FIG. 1, the result is $Z^* = Z_1 \cdot m_k^2$ if $Z_0 > Z^*$, and if it is chosen that the impedance $Z_2$ should be a capacitance, $Z_1$ will be an inductance that will be added to the transformed inductance $L_{ab}$ ($L_{sb}$), or a negative capacitance that can be recombined with the capacitance $C_{bw} + C_{s\ a\ w}$.

$$Z_1 = +j\sqrt{Z^*(Z_0 - Z^*)} \text{ or } L_{sba} = \frac{1}{\omega}\sqrt{Z^*(Z_0 - Z^*)}$$

$$Z_2 = -jZ_0\sqrt{\frac{Z^*}{Z_0 - Z^*}} \text{ or } C_{pb} = \frac{1}{Z_{0.\omega}}\sqrt{\frac{(Z_0 - Z^*)}{Z^*}}$$

Naturally, $m_k^2$ can also be determined such that $L_{sb} + L_{sba}$ is equal to a predetermined value (equation in $m_k^2$ which will for example replace the equation $L_{sb} = L_b\ m_k^2$).

In some cases, for example concerning relatively wide filters, it may be useful to replace the previous technique using a "wide band" matching method that uses more components but that provides a non-negligible filter complement (particularly if pass band networks are used for this purpose). These known techniques described in different books may also take account of partially reactive terminations (for example in UHF, resulting from accidental distributed capacitances).

F/ The equations thus obtained show the number of degrees of freedom in fixing the values of some elements of the filter.

Operations D are used to express an essential relation between the values of the capacitances of the decomposition of a pair of consecutive resonators, for example between $C_{p\ 1\ w}$ and $C_{s\ 2\ u}$. This is applicable for a model filter with N (order 2N) resonators giving a number N+1 of relations (2 for impedance levels at the ends and N−1 for relations between the N adjacent resonators). We also have the relations of the decomposition of capacitors described in A) above into three, giving N relations for N resonators. These 2 N+1 relations do not completely determine the 3 N capacitances with subscripts {u, v, w} and the N transformation ratios. Therefore, there are still 2 N−1 degrees of freedom to fix the values of filter manufacturing elements.

Much of the advantage of the process proposed within the framework of this invention is the potential use of these additional degrees of freedom to make it more economic to make LC filters, or to enable the use of distributed dipoles that can be manufactured economically and/or which have more attractive characteristics within a given frequency range, under favourable conditions.

Thus, this invention proposes a process for optimisation of the values of the elements of a narrow or intermediate pass band filter for which the LC prototype has been determined, characterised by the fact that it includes the following steps:

i) decompose parallel or series capacitances of two- or three-element resonators, into two or three elements, ii) insert pairs of transformers between the first separate element and the rest of the resonator, iii) displace transformers to modify resonator impedance levels, and iv) absorb residual transformers by transformation.

BRIEF DESCRIPTION OF THE FIGURES

Other characteristics, purposes and advantages of this invention will become evident after reading the detailed description given below, with reference to the attached drawings, given as non-limitative examples in which:

FIGS. 4a and 4b show the decomposition of three-element dipole capacitances in the series form and in the parallel form respectively, FIG. 5 diagrammatically shows the transformer insertion step, FIG. 6 diagrammatically shows the transformer displacement step, FIG. 7a and FIG. 7b diagrammatically show the step to eliminate internal transformers, for two capacitance configurations, FIG. 8 diagrammatically shows the step to eliminate transformers at the ends of the filter, for $Z^* > Z_0$ in FIG. 8a and for $Z^* < Z_0$ in FIG. 8b, FIG. 23 shows the structure of a final resonator, FIG. 24 shows an example of a complete solution after transformation, FIG. 25 shows the response of the transformed filter for lines of equal characteristic impedance, FIG. 36 shows the circuit for the transformed filter, FIG. 37 shows the response of an order 8 transformed filter with two L-SAW resonators and inductances (taking account and not taking account of losses), the response without losses is coincident with the response of the prototype)), FIGS. 38a, 38b and 38c show three frequently used topologies for resonator filters.

The following figures are applicable for manufacturing of the duplexer according to the invention (connection filter with two inputs to one output).

Figure 39:
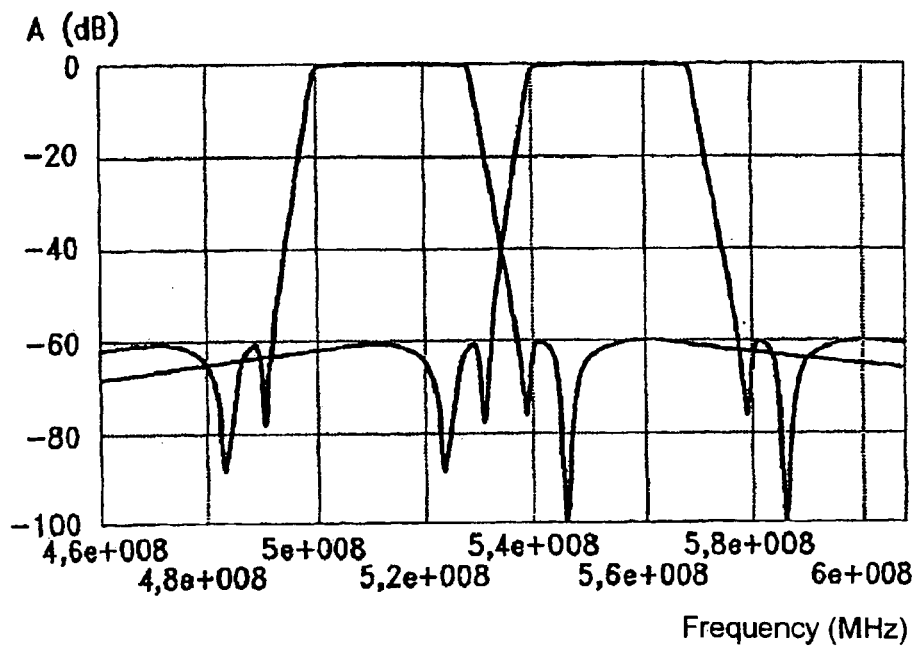
Figure 40:
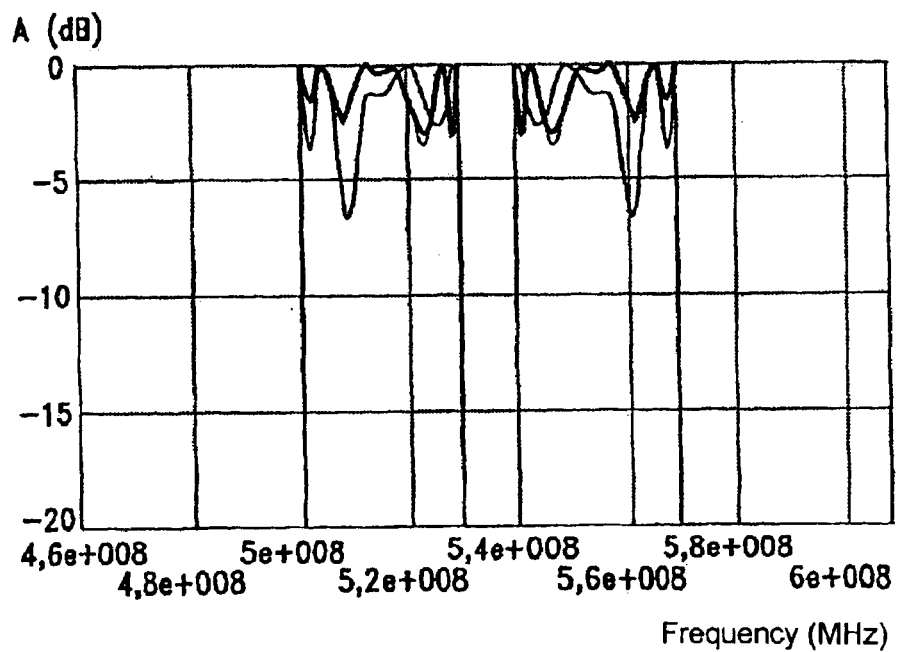
Figure 41:
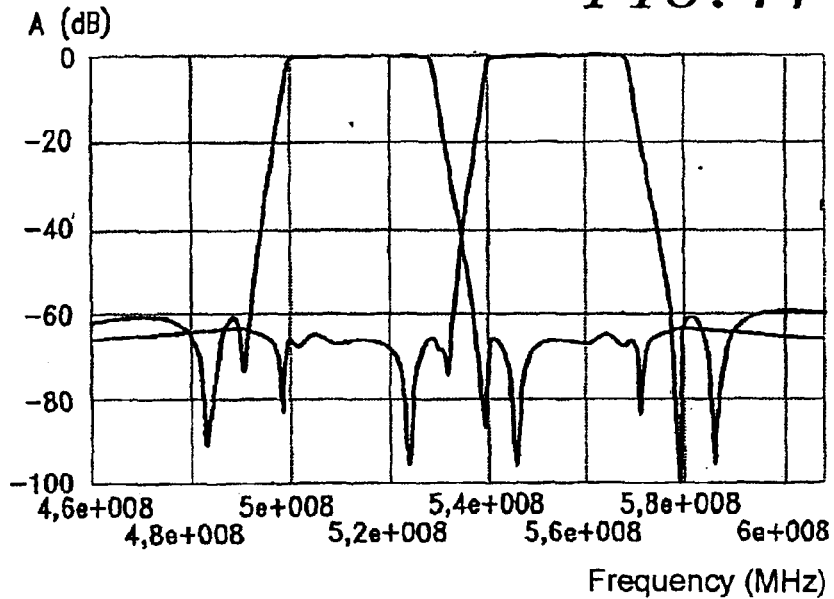
Figure 42:
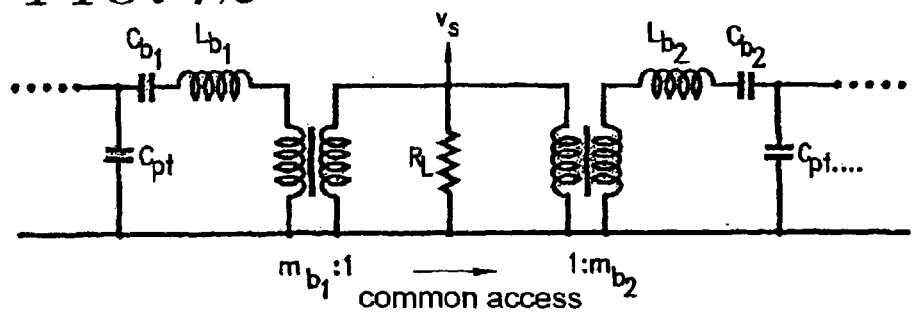
Figure 43:
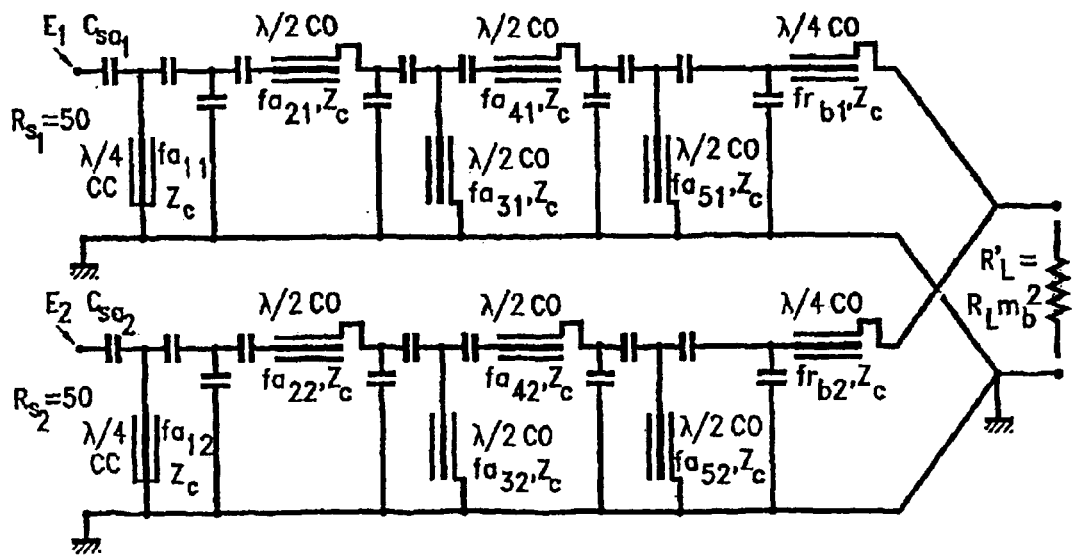
Figure 44:
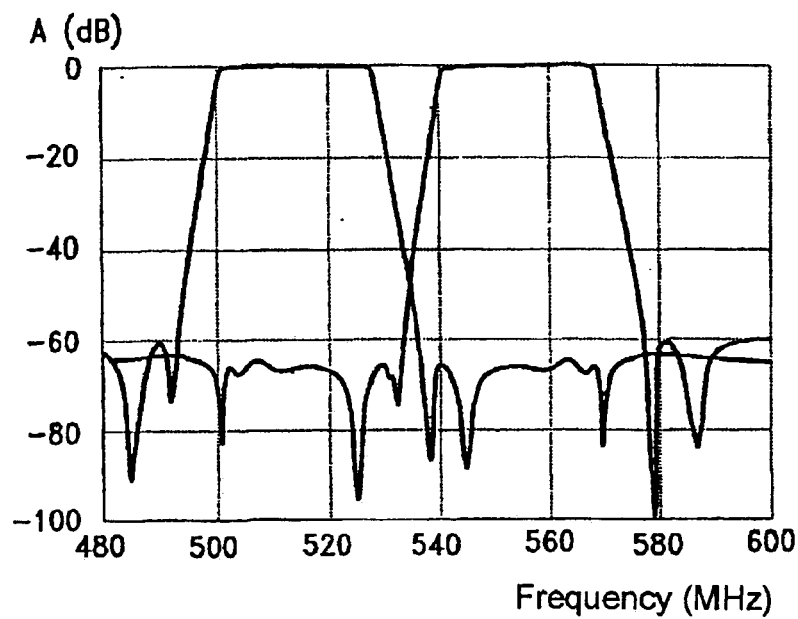
Figure 45:
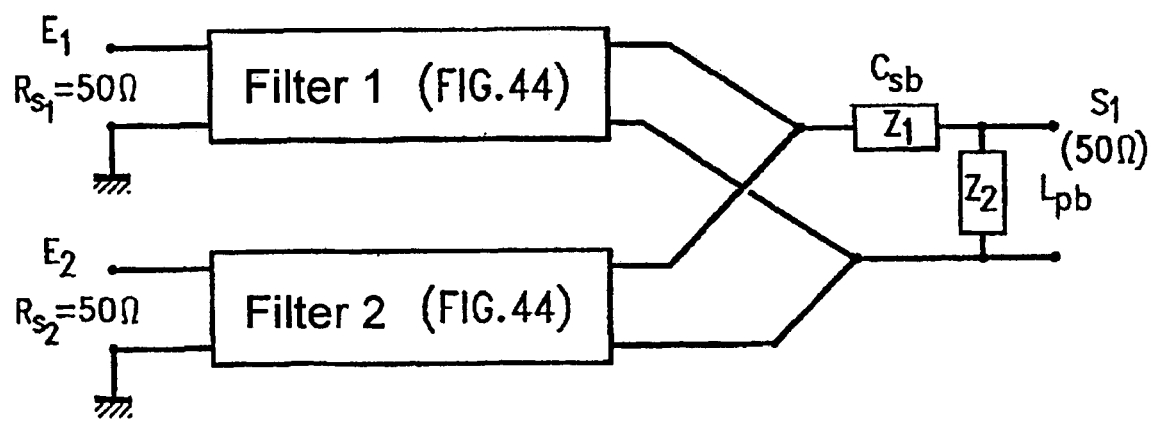
Figure 46:
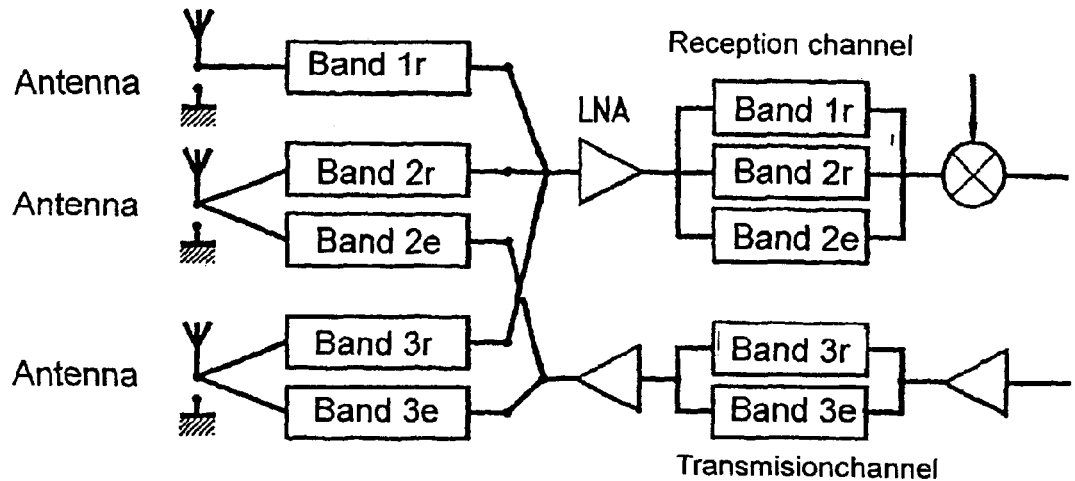
Figure 47:
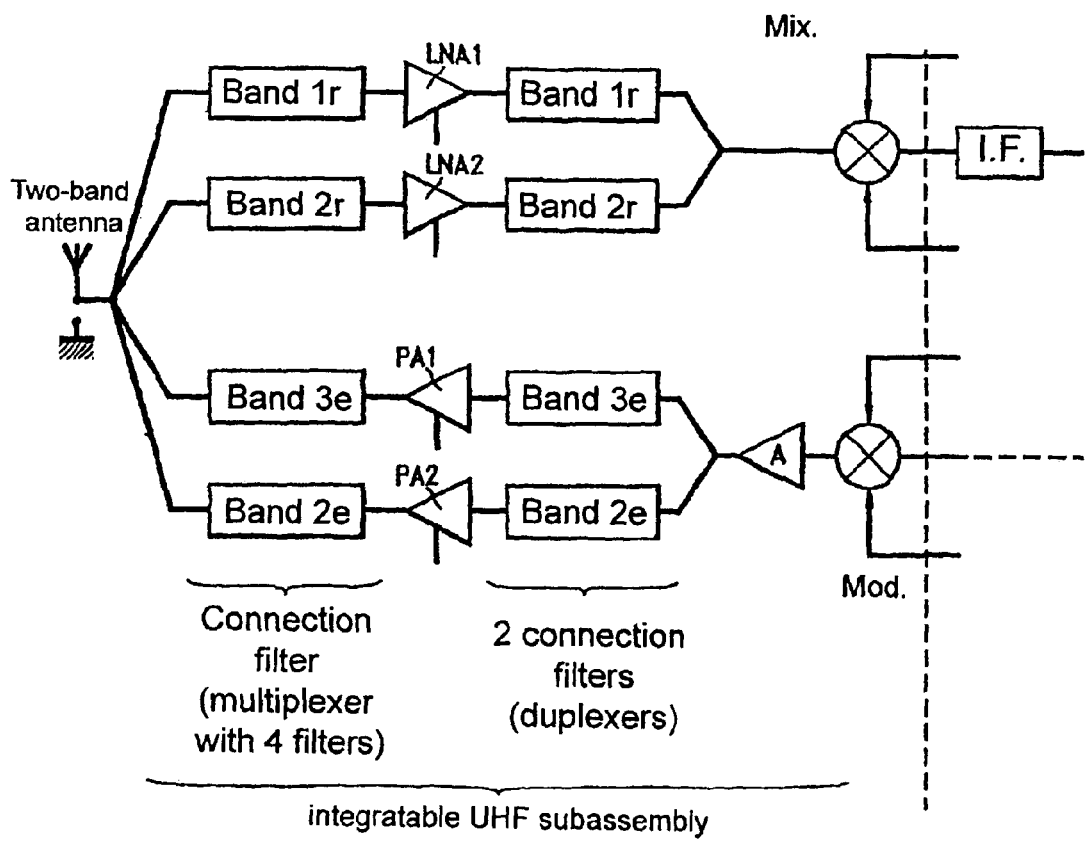
Figure 48:
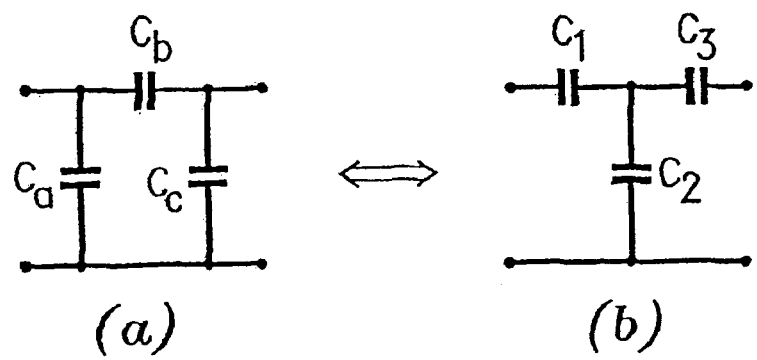
Figure 49:
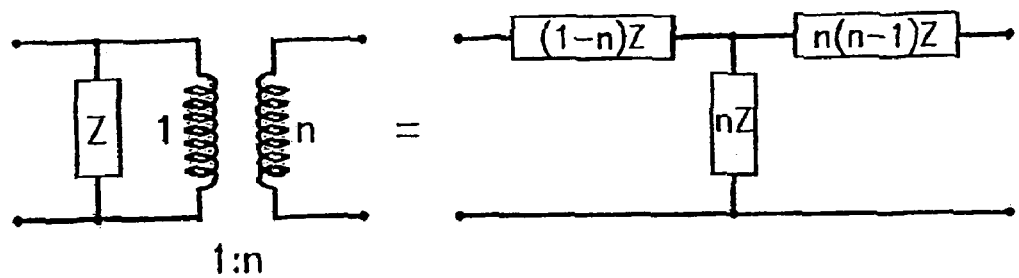
Figure 50:
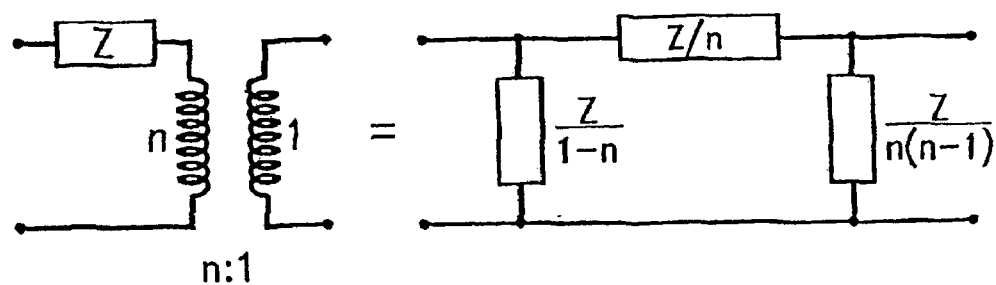

FIG. 39 shows the response of two prototypes taken in isolation,

FIG. 40 shows the variation of responses in pass band during optimisation (the two filters then have a common end), FIG. 41 shows responses finally obtained for the duplexer, FIG. 42 shows the impedance transformation at the end common to the two filters, FIG. 43 shows the transformed circuit of a duplexer, FIG. 44 shows the electrical response of a duplexer after transformation of the circuit shown in FIG. 43, FIG. 45 shows the transformed circuit of a duplexer, FIG. 46 shows a circuit comprising connection filters that can be made according to this invention (for a mobile radiotelephony application for equipment that will have to operate in multiple frequency bands), FIG. 47 shows another example embodiment conform with this invention showing which functions can be made in a mobile terminal or a multi-frequency and multistandard base station, FIG. 48 diagrammatically shows the transformation of T or Π sub-circuits into Π or T sub-circuits respectively, and FIGS. 49 and 50 show two transformation variants conform with this invention.

DETAILED DESCRIPTION OF THE INVENTION

1. Application to LC Filters with Inductances with Values Fixed in Advance

In this case, the transformation principle is as follows.

To illustrate the principle described above, we will start with an order 8 filter with a pass band between 890 and 905 MHz and infinite attenuation points fixed at 885 and 910 MHz, with a behaviour which would give a pass band insertion loss ripple equal to 0.3 dB for ideal infinite overvoltage elements.

Figure 9:
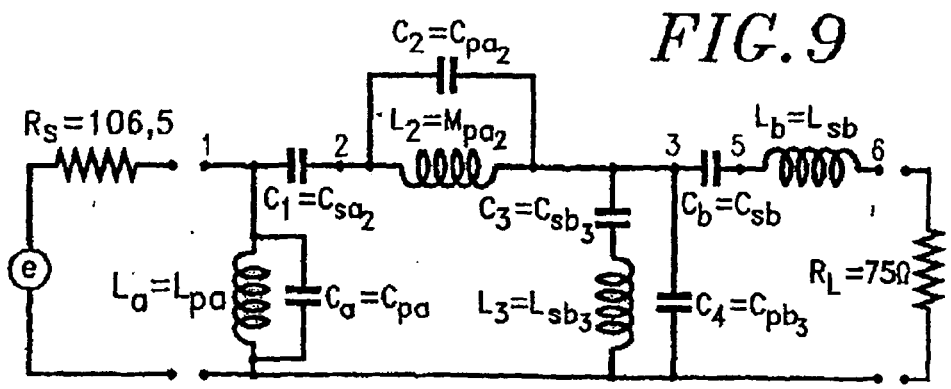
FIG. 9 shows the circuit for a prototype zigzag filter obtained by synthesis.

The corresponding zigzag filter circuit as obtained by a known synthesis method is shown in FIG. 9.

The value of the elements in the prototype circuit is given in Table 1 below (MKSA units, capacitances in Farads, inductances in Henry).

Figure 1:
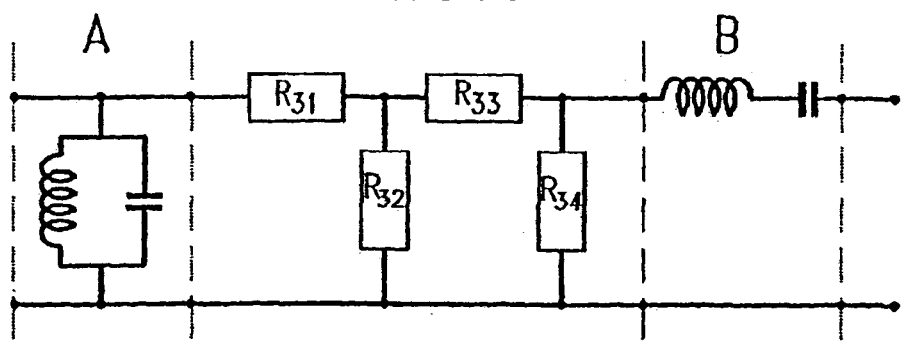
FIG. 1 shows an example of a conventional minimum inductance (zigzag) filter.
Figure 2:
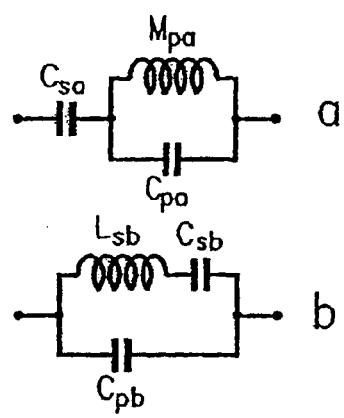
FIG. 2 shows two topologies of three-element dipoles belonging to this filter.
Figure 3A:
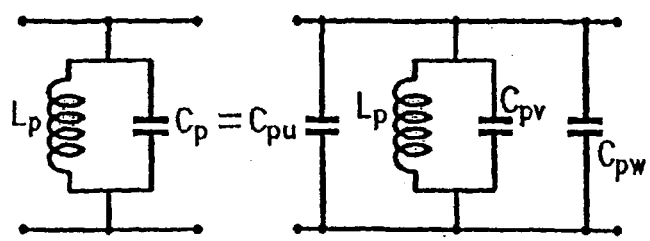
FIGS. 3a and 3b show the decomposition of capacitances of dipoles with two LC elements for a parallel configuration and for a series configuration respectively.
Figure 3B:
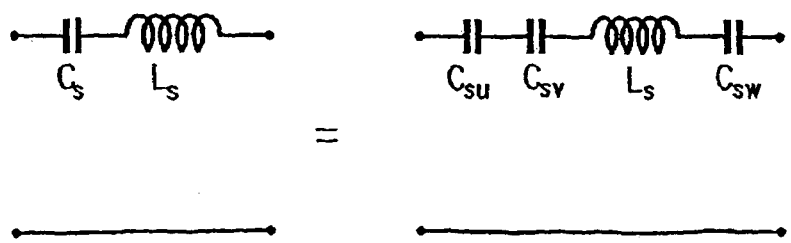

For three-element resonators, the subscripts a and b in the notations correspond to the forms a and b respectively as defined in FIG. 2.

TABLE 1

| | | ##zigzag filter G08 RS = 106.54 1 RL = 75.00 6 | | | |
|---|---|---|---|---|---|
| 1 | CAP | Cpa = Ca | 1 | 0 | 0.11436E−09 |
| 2 | IND | Lpa = La | 1 | 0 | 0.27327E−09 |
| 3 | CAP | Csa2 = C1 | 1 | 2 | 0.89352E−12 |
| 4 | IND | Mpa2 = L2 | 2 | 3 | 0.77700E−09 |
| 5 | CAP | Cpa2 = C2 | 2 | 3 | 0.39361E−10 |
| 6 | CAP | Csb3 = C3 | 3 | 4 | 0.99994E−13 |
| 7 | IND | Lsb3 = L3 | 4 | 0 | 0.32340E−06 |
| 8 | CAP | Cpb3 = C4 | 3 | 0 | 0.44050E−11 |
| 9 | CAP | Csb = Cb | 3 | 5 | 0.34418E−13 |
| 10 | IND | Lsb = Lb | 5 | 6 | 0.91955E−06 |

Imposing the values of inductances to be equal to the values $L_1^*$, $L_2^*$, $L_3^*$ and $L_4^*$ respectively, gives four relations ($L_1^*$ values are transformed values).

$$M_1 = (L_{p1}^*/L_{p1})^{1/2}$$

$$M_4 = (L_{s4}^*/L_{s4})^{1/2}$$

It is required to make the second resonator in form b defined above with reference to FIG. 2b.

$$L_{sb2}^* = m_2^2 \, M_{pa\,2}[1+C_{pa2}/C_{sa2v}]^2$$

$$m_2 = [L_{sb2}/(M_{pa2}(1+C_{pa2}/C_{sa\,2v}))]$$

$$L_a = M_{pa\,2}; \, C_2 = C_{pa\,2}; \, C_3 = C_{sa\,2}$$

It is required to make the third resonator without changing the form (form b defined above).

$$M_3 = (L_{sb\,3}^*/L_{sb\,3})^{1/2}$$

The form selected for the filter imposes that $m_2 < m_3$; the 2N−1 degrees of freedom (in this case 7 degrees of freedom) are used to fix the four values of inductances and the values of the three capacitances (for example $C_{sa\,2\,w}$ and $C_{pb\,3\,w}$ and one more). Obviously multiple choices are possible, for example including the choice made in the next example. It would also be possible for some capacitances (three maximum in this case if the inductances are fixed) to have defined values corresponding to usual standardized values.

We will now give a first numeric example illustrating the process according to the invention.

We will consider the order 8 zigzag prototype in FIG. 9. For the transformation, we chose a value of the inductance equal to 20 nH that gives approximately the best overvoltage that could be hoped for at the central frequency and a satisfactory self-resonant frequency. We chose to fix the ratios of the capacitances of the two three-element resonators equal to 20, and to keep their form equal to the form of the prototype circuit, and finally we chose the value of capacitance $C_{sv\,b}$ (namely $C_{sb\,v} = 0.5$ pF before transformation), which gives satisfactory values for elements of the filter. In this case, there cannot be more than one solution. The calculation shows that a solution actually exists (it satisfies inequality conditions for transformation ratios, and the values of all components are positive).

Figure 10:
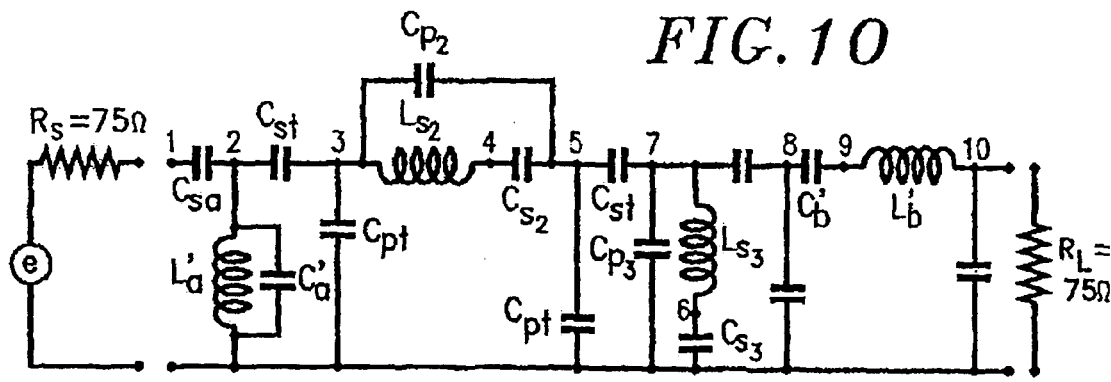
FIG. 10 shows the electrical circuit corresponding to the transformed filter.

The transformed filter circuit is shown in FIG. 10 and the values of the elements on Table 2 below. An analysis is carried out to make sure that the response obtained with this circuit really is actually identical to the response obtained for the prototype (except possibly at frequencies far from the pass band where the response is slightly improved by the addition of matching components—in this case—for low frequencies close to zero).

Figure 11:
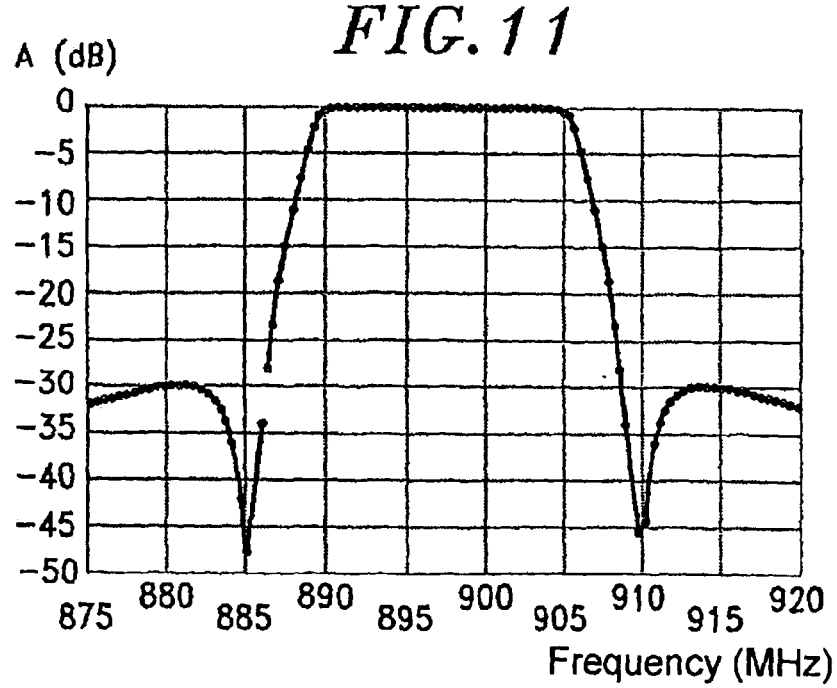
FIG. 11 shows the responses of the prototype filter compared with the responses of the transformed filter.

FIG. 11 shows responses of the prototype filter and the transformed filter using the process according to this invention.

TABLE 2

Value of elements of the transformed circuit in
FIG. 10
$ Transformed filter file 1.CKT ATNB Topology
RS = 75.00 1
RL = 75.00 10

| | | | | | |
|---|---|---|---|---|---|
| 1 | CAP | Cs | 1 | 2 | 0.23302E−12 |
| 2 | IND | La | 2 | 0 | 0.20000E−07 |
| 3 | CAP | Ca | 2 | 0 | 0.54639E−12 |
| 4 | CAP | Cst | 2 | 3 | 0.80812E−12 |
| 5 | CAP | Cpt | 3 | 0 | 0.27808E−10 |
| 6 | CAP | Cp2 | 3 | 5 | 0.32113E−10 |
| 7 | IND | Ls2 | 3 | 4 | 0.20000E−07 |
| 8 | CAP | Cs2 | 4 | 5 | 0.16056E−11 |
| 9 | CAP | Cpt | 5 | 0 | 0.39559E−10 |
| 10 | CAP | Cst | 5 | 7 | 0.13480E−08 |
| 11 | CAP | Cp3 | 7 | 0 | 0.32338E−10 |
| 12 | IND | Ls3 | 7 | 6 | 0.20000E−07 |

TABLE 2-continued

Value of elements of the transformed circuit in
FIG. 10
$ Transformed filter file 1.CKT ATNB Topology
RS = 75.00 1
RL = 75.00 10

| | | | | | |
|---|---|---|---|---|---|
| 13 | CAP | Cs3 | 6 | 0 | 0.16169E−11 |
| 14 | CAP | Cst | 7 | 8 | 0.11259E−11 |
| 15 | CAP | Cpt | 8 | 0 | 0.77261E−12 |
| 16 | CAP | Csb | 8 | 9 | 0.22989E−10 |
| 17 | IND | Lsb | 9 | 10 | 0.20000E−07 |
| 18 | CAP | Cpa | 10 | 0 | 0.15858E−10 |

The main advantage of the process according to the invention is that it can take account of all possibilities and can be generalized to a significant number of filter topologies.

It was mentioned above that it was applicable to the case of zigzag filters, polynomial LC pass band filters in either of the possible dual forms (obviously the systematic transformation principle remains the same, but it is much simpler to implement because there are only arms with two elements).

More generally, the analysis of the transformation process shows that it is applicable to ladder filters comprising not more than one inductance per arm (or that can be transformed to satisfy this condition) such that a pair of transformers can be inserted for each inductance and one of these transformers can be eliminated after displacement by a Norton transformation. This assumes that there are two capacitances (one in series in a horizontal arm and one in parallel in a vertical arm) derived from the separation of capacitances in the arms containing resonators with two or three elements, or that already existed in the circuit (series or shunt capacitance) and that are located in the direction of displacement of the transformer after the inductance to be transformed and before the next inductance (so that all inductances can be transformed independently).

This is done for filters that have a topology such that the following two conditions can be satisfied, with the possible exception of one or more dipoles located at the end of the filter:

a series capacitance can be extracted from the horizontal arms containing an inductance and a shunt capacitance can be extracted from the vertical arm along the direction of displacement of the transformer, and/or a shunt capacitance can be extracted from the vertical arms containing an inductance and a series capacitance can be extracted from the next horizontal arm (along the direction of displacement of the transformer).

The condition is also satisfied if one of the previous two conditions is replaced by the condition in which there is an existing capacitances Π or T after any dipole containing a single inductance.

Figure 12:
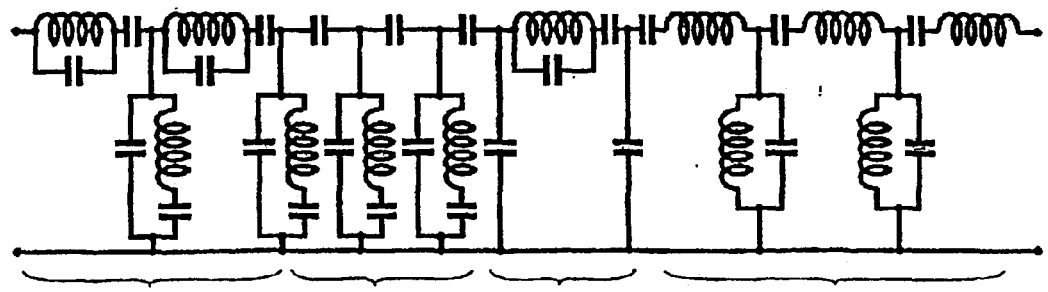
FIG. 12 shows the circuit of a filter to which the process according to this invention is applicable (note that it includes "sub"-circuits with different topologies)

This is illustrated in FIG. 12 that shows sub-circuits using various current topologies.

Obviously, the process that has just been described with respect to some specific embodiments can be generalised.

Moreover, transformations (Colin, Saal and Ulbrich, etc.) are known for taking filters containing dipoles with more than one inductance in some of the arms or bridges, and making them equivalent to cases with a ladder topology to which the process described can be applied.

We will describe some other examples in the following.

As we saw in the previous example, for a given filter topology containing three-element resonators, there is a possible choice between two different forms in the transformation, for each of these resonators. For example, for zigzag filters containing a two-element resonator at each end, and if N is the order of the filter and K is the number of three-element resonators of the filter (we have K=N/2−2), there will then be $2^k=2^{(N/2-2)}$ possible alternative configurations for the transformed filter. Moreover, these different configurations can easily be taken into account in a calculation program and in the following we will describe the advantage of taking them into consideration, with reference to the examples given.

It is also possible to take account in the calculation of different variants for narrow band matching at the ends of the filters, which in some cases is attractive, since the added matching components (inductance or capacitance) modify the behaviour of the filter input and output impedances outside the pass band in different ways, but that can be very favourable for some applications (for example for making duplexers, the choice between modifying the response at zero frequency and at infinite frequency may be important).

Note that narrow band matching leads to very satisfactory solutions for pass bands significantly wider than what are normally called narrow pass bands. In practice, as a result of this no limitation in performances was observed in any of the cases dealt with (namely for relative pass bands of up to about 30%). It was mentioned above that other matching techniques may be used for wider relative bands.

In the equation for which the principle was described above, inequalities appear that have to be respected, together with non-linear relations between parameters. Since positive real values are necessary for the elements, acceptable solutions for the different possible alternative configurations for the transformed filter can only exist within the range in which available parameters can vary (value of inductances, etc.). The possible range of "good" values of inductances (achievable with good characteristics) is sufficient in practice to always obtain solutions without it being necessary to include values of capacitances that are difficult to obtain (too small).

The degrees of freedom added into the proposed transformation process in practice can be used to make the filter with all inductances being equal, which is economically the most attractive case. The remaining degrees of freedom may be used in different ways. We have described above the advantage of choosing off-the-shelf values for capacitances. Another particularly interesting advantage is to fix the ratios of capacitances in three-element resonators, since this is a means of making filters using piezo-electric filters with bulk or surface waves. This advantage of the process will be described further below.

The ratio of capacitances in three-element resonators ($L_1$ $C_1$ $C_0$) also has attractive fundamental properties; this is a simple function of the relative separation of remarkable frequencies of these dipoles, and consequently it has a strong influence on the maximum pass band of a filter using these resonators. It is easy to show that, in the transformations made, this parameter has the important property that it can only decrease. Therefore, after transformation for each three-element resonator, its only possible values lie within the interval between zero and its value in the prototype circuit.

2. We will now describe other examples of high order filters, beginning with the transformation of order 12 zigzag elliptical prototype.

This example is given to illustrate possibilities of the process mentioned above and particularly to demonstrate the advantage of taking account of all possible configurations of transformed filters (using two alternative topologies of three-element resonators). It is observed that for a transformation in which a single value of inductances is to be obtained, the range in which solutions exist as a function of other parameters (for example capacitance ratios) is much wider if all possible configurations for filters are authorised.

Figure 13:
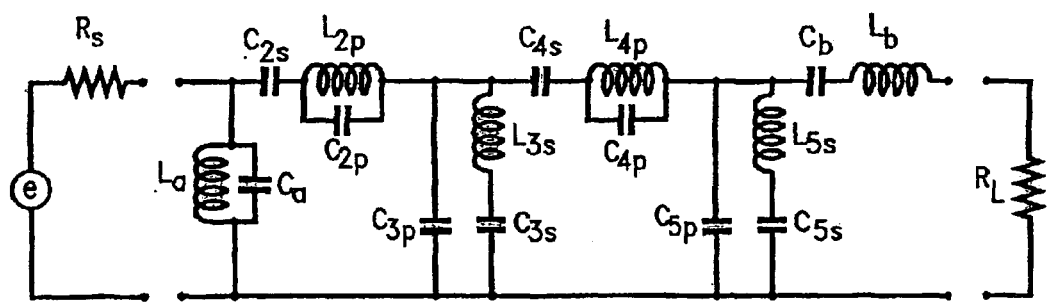
FIG. 13 shows the circuit for an order 12 prototype filter.
Figure 14:
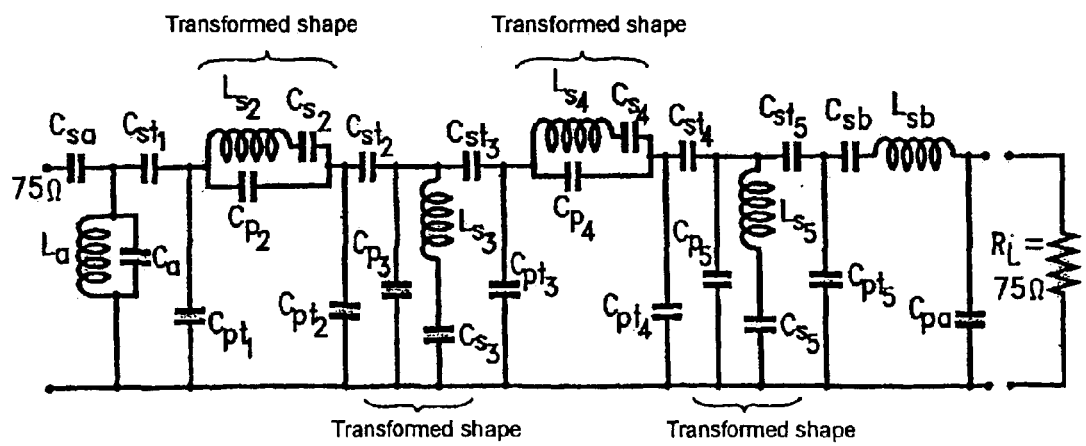
FIG. 14 shows the circuit for a transformed filter with ATNTNB topology (note, the topology is marked starting from end A of the filter and working towards end B, using the letters N and T to indicate that the shape of the three-element dipoles was conserved (N) or transformed (T))

This example relates to the transformation according to the proposed process for an order 12 zigzag filter calculated to have a pass band varying from 51.0 to 59.0 MHz with 0.3 dB ripple and attenuated band rejection of 70 dB. The circuit for the prototype filter considered is shown in FIG. 13.

The value of the elements of the prototype filter is shown in table 3 below.

TABLE 3

Zigzag filter order = 12
RS = 88.62 1
RL = 75.00 9

| | | | | | |
|---|---|---|---|---|---|
| 1 | CAP | Ca | 1 | 0 | 0.28120E−09 |
| 2 | IND | La | 1 | 0 | 0.29156E−07 |
| 3 | CAP | C2s | 1 | 2 | 0.11249E−10 |
| 4 | IND | L2p | 2 | 3 | 0.21206E−06 |
| 5 | CAP | C2p | 2 | 3 | 0.27711E−10 |
| 6 | CAP | C3s | 3 | 4 | 0.51800E−10 |
| 7 | IND | L3s | 4 | 0 | 0.23281E−06 |
| 8 | CAP | C3p | 3 | 0 | 0.11827E−09 |
| 9 | CAP | C4s | 3 | 5 | 0.13630E−10 |
| 10 | IND | L4p | 5 | 6 | 0.13534E−06 |
| 11 | CAP | C4p | 5 | 6 | 0.47714E−10 |
| 12 | CAP | C5s | 6 | 7 | 0.20679E−10 |
| 13 | IND | L5s | 7 | 0 | 0.53070E−06 |
| 14 | CAP | C5p | 6 | 0 | 0.77829E−10 |
| 15 | CAP | Cb | 6 | 8 | 0.45671E−11 |
| 16 | IND | Lb | 8 | 9 | 0.19189E−05 |

The objective is to use a single value for all inductances and it was decided to fix the value of the ratio of capacitances of three-element resonators to 1 (which gives equal values). In this case, only one parameter remains free. It was decided that this free parameter would be the capacitance $C_{sb\,v}=V_{s\,4\,v}$ which is determined by dividing the capacitances of the series LC resonator at end B of the filter. Therefore, there can only be a simple infinite number of solutions for a given topology. It is found that the allowable solutions do not contain all different possible configurations (in this case 16) at the same time, depending on the common value for all inductances and depending on the values of the other parameters. Thus, for example, in the chosen case (inductance=500 nH, capacitance ratios=1 and $C_{sb\,v}$ varying within a small range above the minimum possible value), the solutions found belong to only four topologies. Other configurations are possible for other values of parameters (capacitance ratio).

Tables 4, 5, 6 and 7 below show four solutions corresponding to four different configurations, as examples. The corresponding circuits for the transformed filters are given in FIGS. 14, 15, 16 and 17 respectively. It is found that the values of the elements are satisfactory in three cases, while in the fourth case (denoted ATNTTB), the value of one capacitance ($C_a$) is too low to accommodate the distributed capacitance of the inductance that it matches. If there were good reasons for using this configuration, the values of some parameters should be modified to obtain a more favourable circuit.

Note that in the following, the configuration is identified by the form of the three-element resonators, in comparison with their configuration in the prototype zigzag filter. A represents end A, B represents end B and the letter T indicates that the form of the three-element resonator is transformed from its form in the prototype, while N means that its form has not been transformed. By convention, to facilitate the division of capacitances, in the prototypes we will consider that the resonators in the horizontal arms are in form (a) in FIG. 2 and that the resonators in the vertical arms are in form (b) in the same figure. Thus, the ATNTNB configuration is composed of three-element resonators all with form (b) in FIG. 2 (composed of a series LC resonating arm in parallel with a capacitance (called the static capacitance)). For example, this topology is useful to comply with standard practice in representing piezoelectric resonators when it is required to create filters based on these elements (capacitance and inductance values "equivalent" to resonators given by resonator manufacturers correspond to this form).

TABLE 4

Filter in FIG. 4
Elements of the transformed filter with ATNTNB
topology (file 2.CKT)
RS = 75.00 1
RL = 75.00 15

| 1  | CAP | Cs  | 1  | 2  | 0.88144E-11 |
| 2  | IND | La  | 2  | 0  | 0.50000E-06 |
| 3  | CAP | Ca  | 2  | 0  | 0.10364E-11 |
| 4  | CAP | Cst | 2  | 3  | 0.85705E-11 |
| 5  | CAP | Cpt | 3  | 0  | 0.37657E-10 |
| 6  | CAP | Cp2 | 3  | 5  | 0.23505E-10 |
| 7  | IND | Ls2 | 3  | 4  | 0.50000E-06 |
| 8  | CAP | Cs2 | 4  | 5  | 0.23505E-10 |
| 9  | CAP | Cpt | 5  | 0  | 0.50139E-10 |
| 10 | CAP | Cst | 5  | 7  | 0.55173E-10 |
| 11 | CAP | Cp3 | 7  | 0  | 0.24119E-10 |
| 12 | IND | Ls3 | 7  | 6  | 0.50000E-06 |
| 13 | CAP | Cs3 | 6  | 0  | 0.24119E-10 |
| 14 | CAP | Cst | 7  | 8  | 0.13601E-10 |
| 15 | CAP | Cpt | 8  | 0  | 0.71387E-11 |
| 16 | CAP | Cp4 | 8  | 10 | 0.25830E-10 |
| 17 | IND | Ls4 | 8  | 9  | 0.50000E-06 |
| 18 | CAP | Cs4 | 9  | 10 | 0.25830E-10 |
| 19 | CAP | Cpt | 10 | 0  | 0.52705E-10 |
| 20 | CAP | Cst | 10 | 12 | 0.52838E-08 |
| 21 | CAP | Cp5 | 12 | 0  | 0.21948E-10 |
| 22 | IND | Ls5 | 12 | 11 | 0.50000E-06 |
| 23 | CAP | Cs5 | 11 | 0  | 0.21948E-10 |
| 24 | CAP | Cst | 12 | 13 | 0.17875E-10 |
| 25 | CAP | Cpt | 13 | 0  | 0.16115E-10 |
| 26 | CAP | Csb | 13 | 14 | 0.61406E-10 |
| 27 | IND | Lsb | 14 | 15 | 0.50000E-06 |
| 28 | CAP | Cpa | 15 | 0  | 0.65170E-10 |

TABLE 5

Figure 15:
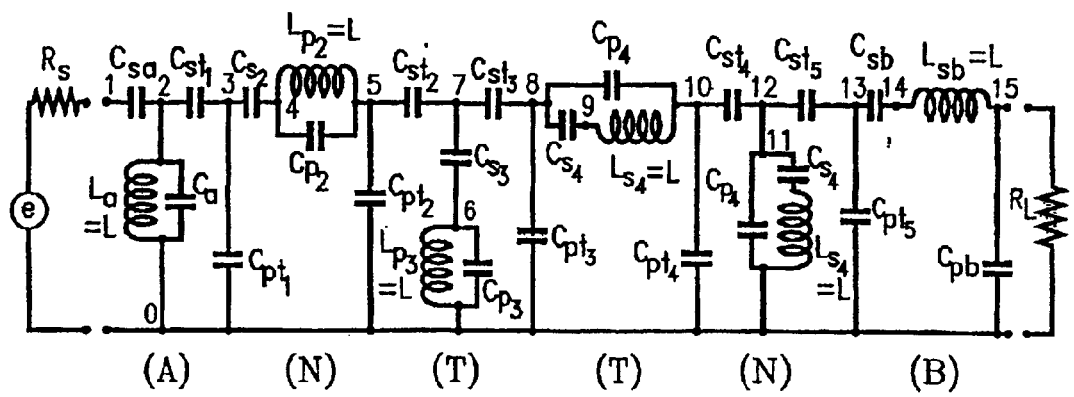
FIG. 15 shows the circuit for a transformed filter with ANTTNB topology.

Filter in FIG. 15
Elements of the transformed filter with ANTTNB
topology file 7.Ckt
RS = 75.00 1
RL = 75.00 15

| 1  | CAP | Cs  | 1  | 2  | 0.88144E-11 |
| 2  | IND | La  | 2  | 0  | 0.50000E-06 |
| 3  | CAP | Ca  | 2  | 0  | 0.29189E-11 |
| 4  | CAP | Cst | 2  | 3  | 0.81040E-11 |
| 5  | CAP | Cpt | 3  | 0  | 0.13752E-10 |
| 6  | CAP | Cs2 | 3  | 4  | 0.11725E-10 |
| 7  | IND | Lp2 | 4  | 5  | 0.50000E-06 |
| 8  | CAP | Cp2 | 4  | 5  | 0.11752E-10 |
| 9  | CAP | Cpt | 5  | 0  | 0.60453E-11 |
| 10 | CAP | Cst | 5  | 7  | 0.66522E-11 |
| 11 | CAP | Cs3 | 7  | 6  | 0.12060E-10 |
| 12 | IND | Lp3 | 6  | 0  | 0.50000E-06 |
| 13 | CAP | Cp3 | 6  | 0  | 0.12060E-10 |
| 14 | CAP | Cst | 7  | 8  | 0.67999E-11 |
| 15 | CAP | Cpt | 8  | 0  | 0.13938E-10 |

TABLE 5-continued

Filter in FIG. 15
Elements of the transformed filter with ANTTNB
topology file 7.Ckt
RS = 75.00 1
RL = 75.00 15

| 16 | CAP | Cp4 | 8  | 10 | 0.25830E-10 |
| 17 | IND | Ls4 | 8  | 9  | 0.50000E-06 |
| 18 | CAP | Cs4 | 9  | 10 | 0.25830E-10 |
| 19 | CAP | Cpt | 10 | 0  | 0.52702E-10 |
| 20 | CAP | Cst | 10 | 12 | 0.53837E-08 |
| 21 | CAP | Cp5 | 12 | 0  | 0.21948E-10 |
| 22 | IND | Ls5 | 12 | 11 | 0.50000E-06 |
| 23 | CAP | Cs5 | 11 | 0  | 0.21948E-10 |
| 24 | CAP | Cst | 12 | 13 | 0.15793E-10 |
| 25 | CAP | Cpt | 13 | 0  | 0.14238E-10 |
| 26 | CAP | Csb | 13 | 14 | 0.80596E-10 |
| 27 | IND | Lsb | 14 | 15 | 0.50000E-06 |
| 28 | CAP | Cpa | 15 | 0  | 0.65170E-10 |

TABLE 6

Figure 16:
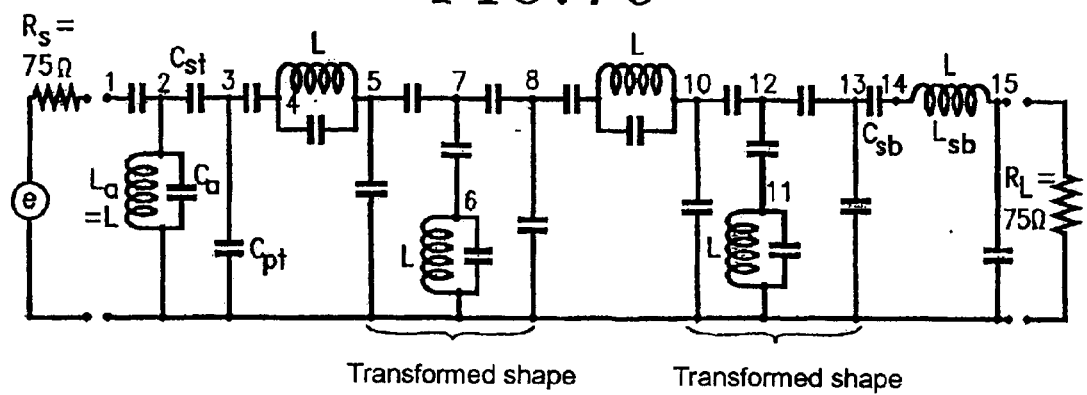
FIG. 16 shows the circuit for a transformed filter with ANTNTB topology.

Filter in FIG. 16
Elements of the transformed filter with ANTNTB
topology file 11.CKT
RS = 75.00 1
RL = 75.00 15

| 1  | CAP | Cs  | 1  | 2  | 0.88144E-11 |
| 2  | IND | La  | 2  | 0  | 0.50000E-06 |
| 3  | CAP | Ca  | 2  | 0  | 0.53213E-11 |
| 4  | CAP | Cst | 2  | 3  | 0.42858E-11 |
| 5  | CAP | Cpt | 3  | 0  | 0.72725E-11 |
| 6  | CAP | Cs2 | 3  | 4  | 0.11752E-10 |
| 7  | IND | Lp2 | 4  | 5  | 0.50000E-06 |
| 8  | CAP | Cp2 | 4  | 5  | 0.11752E-10 |
| 9  | CAP | Cpt | 5  | 0  | 0.12531E-10 |
| 10 | CAP | Cst | 5  | 7  | 0.13789E-10 |
| 11 | CAP | Cs3 | 7  | 6  | 0.12060E-10 |
| 12 | IND | Lp3 | 6  | 0  | 0.50000E-06 |
| 13 | CAP | Cp3 | 6  | 0  | 0.12060E-10 |
| 14 | CAP | Cst | 7  | 8  | 0.34054E-11 |
| 15 | CAP | Cpt | 8  | 0  | 0.17874E-11 |
| 16 | CAP | Cs4 | 8  | 9  | 0.12915E-10 |
| 17 | IND | Lp4 | 9  | 10 | 0.50000E-06 |
| 18 | CAP | Cp4 | 9  | 10 | 0.12951E-10 |
| 19 | CAP | Cpt | 10 | 0  | 0.94377E-11 |
| 20 | CAP | Cst | 10 | 12 | 0.94615E-09 |
| 21 | CAP | Cs5 | 12 | 11 | 0.10974E-10 |
| 22 | IND | Lp5 | 11 | 0  | 0.50000E-06 |
| 23 | CAP | Cp5 | 11 | 0  | 0.10974E-10 |
| 24 | CAP | Cst | 12 | 13 | 0.78967E-11 |
| 25 | CAP | Cpt | 13 | 0  | 0.22135E-10 |
| 26 | CAP | Csb | 13 | 14 | 0.80596E-10 |
| 27 | IND | Lsb | 14 | 15 | 0.50000E-06 |
| 28 | CAP | Cpa | 15 | 0  | 0.65170E-10 |

TABLE 7

Figure 17:
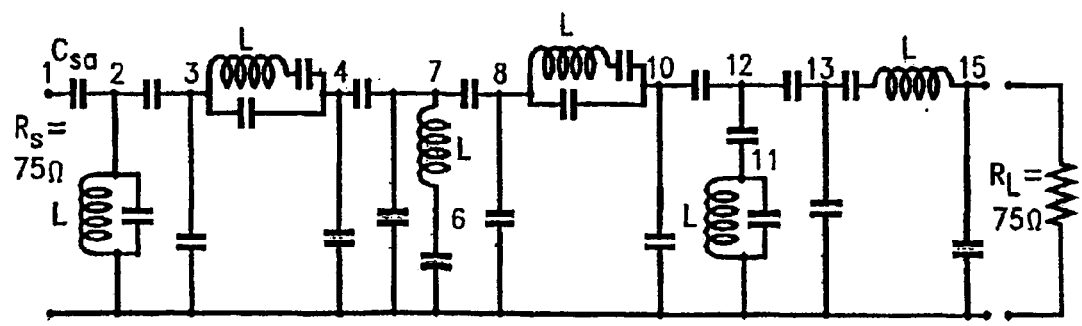
FIG. 17 shows the circuit for a transformed filter with ATNTTB topology.

Filter in FIG. 17
Elements of the transformed filter with ATNTTB
topology file 14.ckt
RS = 75.00 1
RL = 75.00 15

| 1 | CAP | Cs  | 1 | 2 | 0.88144E-11 |              |
| 2 | IND | La  | 2 | 0 | 0.50000E-06 |              |
| 3 | CAP | Ca  | 2 | 0 | 0.17609E-11 | ** see comment |
| 4 | CAP | Cst | 2 | 3 | 0.96266E-11 |              |
| 5 | CAP | Cpt | 3 | 0 | 0.42297E-10 |              |
| 6 | CAP | Cp2 | 3 | 5 | 0.23505E-10 |              |
| 7 | IND | Ls2 | 3 | 4 | 0.50000E-06 |              |
| 8 | CAP | Cp2 | 4 | 5 | 0.23505E-10 |              |
| 9 | CAP | Cpt | 5 | 0 | 0.40114E-10 |              |

TABLE 7-continued

Filter in FIG. 17
Elements of the transformed filter with ATNTTB
topology file 14.ckt
RS = 75.00 1
RL = 75.00 15

| 10 | CAP | Cst | 5  | 7  | 0.44141E−10 |
|----|-----|-----|----|----|-------------|
| 11 | CAP | Cs3 | 7  | 0  | 0.24119E−10 |
| 12 | IND | Ls3 | 7  | 6  | 0.50000E−06 |
| 13 | CAP | Cs3 | 6  | 0  | 0.24119E−10 |
| 14 | CAP | Cst | 7  | 8  | 0.28860E−10 |
| 15 | CAP | Cpt | 8  | 0  | 0.15148E−10 |
| 16 | CAP | Cp2 | 8  | 10 | 0.25830E−10 |
| 17 | IND | Ls2 | 8  | 9  | 0.50000E−06 |
| 18 | CAP | Cs2 | 9  | 10 | 0.25830E−10 |
| 19 | CAP | Cpt | 10 | 0  | 0.19662E−10 |
| 20 | CAP | Cst | 10 | 12 | 0.19277E−10 |
| 21 | CAP | Cs3 | 12 | 11 | 0.10974E−10 |
| 22 | IND | Lp3 | 11 | 0  | 0.50000E−06 |
| 23 | CAP | Cp3 | 11 | 0  | 0.10974E−10 |
| 24 | CAP | Cst | 12 | 13 | 0.73687E−11 |
| 25 | CAP | Cpt | 13 | 0  | 0.20655E−10 |
| 26 | CAP | Csb | 13 | 14 | 0.99785E−10 |
| 27 | IND | Lsb | 14 | 15 | 0.50000E−06 |
| 28 | CAP | Cpa | 15 | 0  | 0.65170E−10 |

Figure 18A:
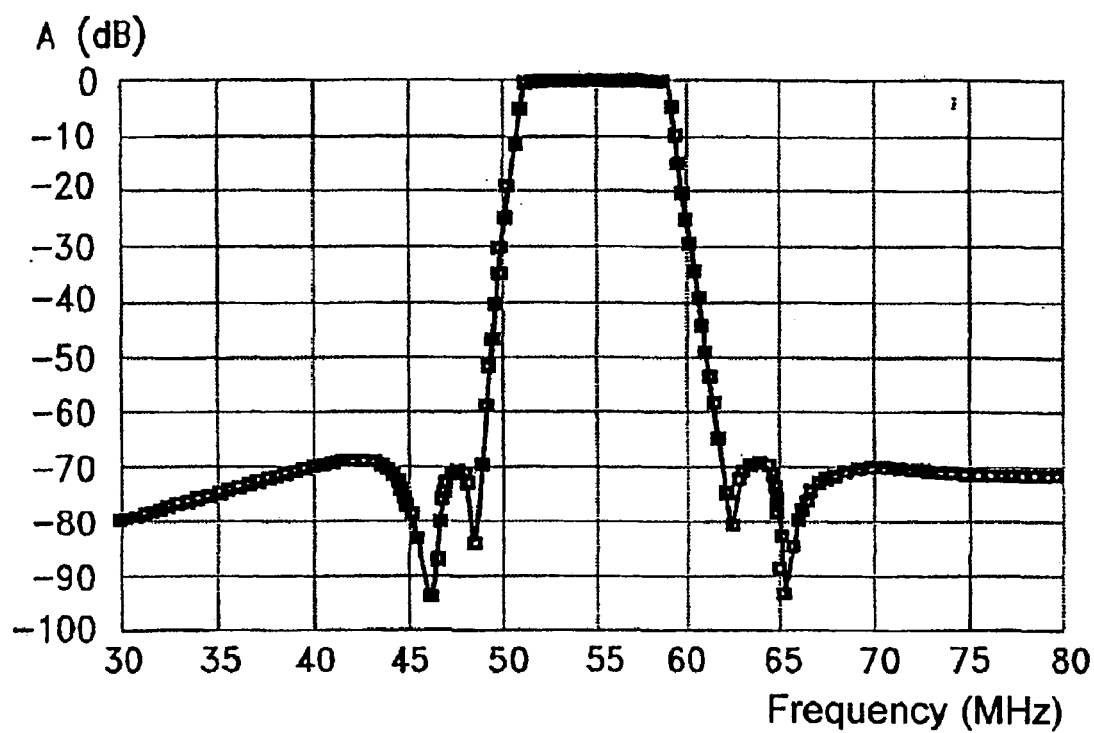
FIG. 18a shows the response of the prototype filter and the above-mentioned lossless transformed filters.
Figure 18B:
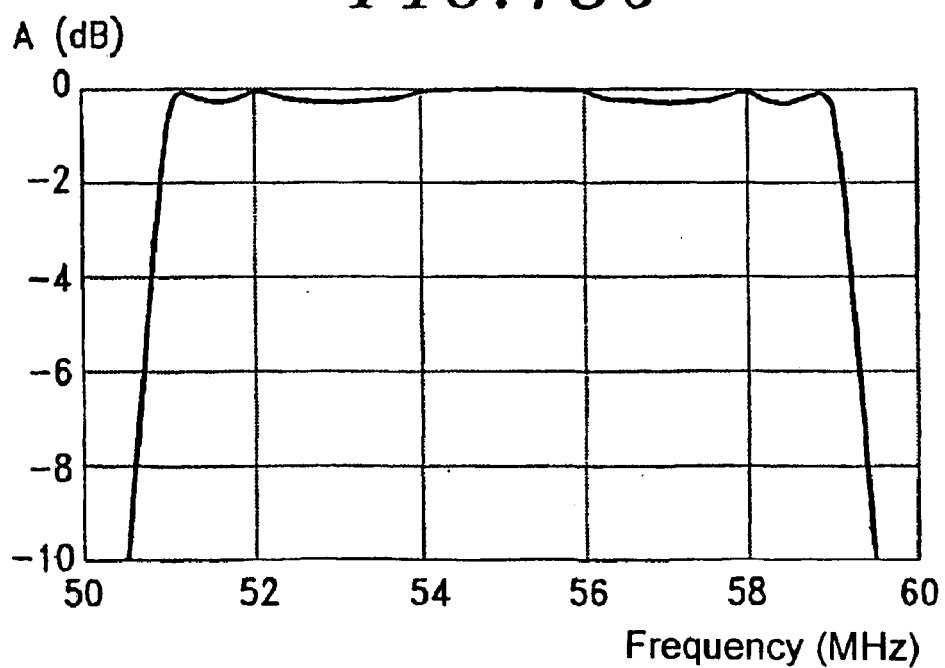
FIG. 18b shows details of the pass band response of the prototype filter and the above-mentioned transformed filters (it will be observed that the curves are exactly superposed)

Responses calculated for the prototype filter and the different transformed filters are identical near the pass band as can be seen by examining FIGS. 18 and 18b, which illustrate the response of the prototype filter and transformed filters (lossless) and details of the response of the prototype filter and the transformed filters in the pass band (the curves are precisely superposed) (FIGS. 18a and 18b below). Components added for narrow band matching slightly improve the response at very low frequencies in the above case.

3. We will now describe a variant of the process by which a number of standard capacitances can be used.

During the previous presentation of the principle of the process according to the invention, it was mentioned that after fixing the value of the n inductances, there were 2n−1 degrees of freedom. These degrees of freedom can be used to fix the value of some capacitors. This would make it possible to choose off-the-shelf standard models for particular capacitances (frequently low values for which the choice is more restricted and the price is higher for a given precision), at the required precision (typically from 1 to several % depending on the order of the filter), and manufacturers naturally have all required values.

Several techniques are possible for solving this question that must combine the global solution of the previous equations with a problem similar to a problem with integer numbers. The inventors chose a process that takes place in two steps. In the first step, in choosing some auxiliary parameters (the ratios of the capacitances of three-element resonators and one of the capacitances derived from the decomposition of the one in the two-element resonator at end B), the range in which a solution exists, and particularly the range corresponding to capacitance values that are neither too small or too large, is determined for the chosen value(s) of the inductances. The second step is to limit variations of parameters to within this range, and then to start from one end of the filter (end B), to solve the equations given above by choosing at least one of the impedance translation capacitances located between the resonators according to an algorithm using the value calculated at the centre of the range, from a table of standard values (E24, etc.). The result is thus at least as many standard capacitances as the number of additional degrees of freedom available.

4. We will now describe application of the process in the case of filters with TEM dielectric resonators.

Remember that dipoles with two discrete LC elements in series or in parallel or with three discrete elements (L, $C_1$, $C_2$) of zigzag filters may be made with a very good approximation using TEM dielectric resonators and capacitances (usually either zero or only one). The coaxial resonator may be terminated in open circuit or in short circuit and it can be used either close to one of its "series" resonances (resonance Z=0) or one of its "parallel" resonances (anti-resonance Y=0). The addition of a shunt capacitance or a series capacitance will result in electrical behaviour very similar to the behaviour of a dipole resonator with three discrete elements, within a given frequency interval.

Dielectric resonators are characterised by their length or by one of their resonant frequencies (theoretical) at no load (inversely proportional to the length), these magnitudes being adjustable by mechanical means (or by the addition of adjustable discrete components) and by their characteristic impedance $Z_{car}$ that is determined by the geometric characteristics of the resonator and the dielectric permittivity of the material used.

Technologically, the characteristic impedance is usually between 6 Ohms and 16 Ohms depending on the relative permittivity of the material and the straight section of the bar, but other slightly higher or slightly lower values can be made in special cases.

Therefore, the degrees of freedom will be used, under the constraint of a characteristic impedance, to identify impedances of the resonator alone or the resonator and its coupling elements (series and/or shunt capacitances) so as to obtain a good approximation of the impedance of two or three element resonators. For example, in order to achieve this, we will identify:

the characteristic frequencies at which Z=0 or Z=∞
the derivatives $\partial Z/\partial \omega$ and/or $\partial(1/Z)/\partial \omega$ at these same points respectively; or
Z and its derivative $\partial Z/\partial \omega$ at the centre of the pass band and the anti-resonant frequency at which Z=∞.

A practical example showing application of the method in this case is described below.

We will use an LC prototype with the same topology as that in the first example given above for transformation of LC filters (FIG. 4). In this case the filter is narrower, and was synthesised to have infinite attenuation points at specified frequencies close to the pass band.

Figure 19:
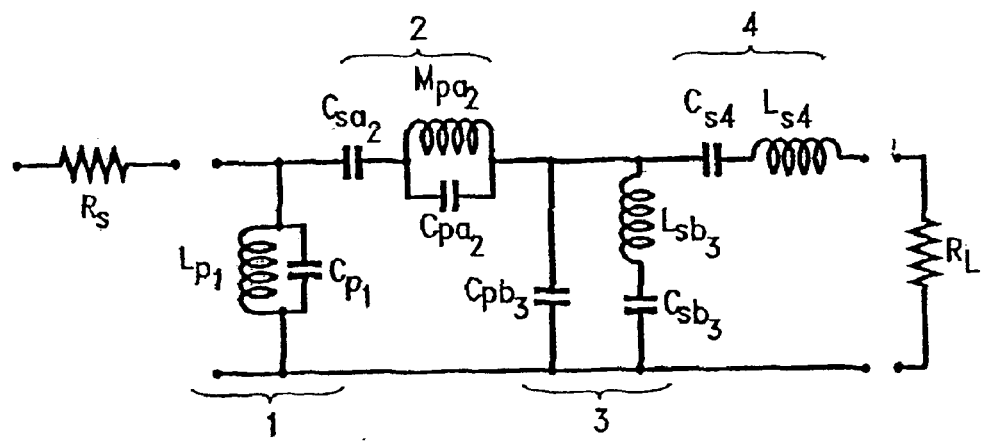
FIG. 19 shows a prototype circuit used for a transformation.

The circuit for the prototype filter is illustrated in FIG. 19, and its characteristics and the values of elements will be given with an example of a transformed circuit.

We assume that the transformation principle indicated for LC filters is known. Starting from this step, we will identify the four resonators (two with two elements and two with three elements) with coaxial TEM resonator structures. The identification process is known and it is usually not unique, it depends on the choice made for the resonator type (λ/2, λ/4, etc.) and also on the frequency area in which it is desirable to maximise the precision of using a dipole containing a distributed element to approximately represent the impedance (admittance) of the resonator dipole with discrete elements.

The following illustrates examples of some of the possible variants in the cases encountered.

LC resonators are treated as coaxial resonators with λ/4 or λ/2 lines.

It will be noted that this invention may use at least one circuit in which some of the resonators are made by using the dielectric resonator in series, with one of the accesses being on the central core of the resonator and the other access of the quadripole being on the external metallisation of the resonator, rather then being in shunt (in dipole, with the other end of the resonator either being grounded or in open circuit).

Figure 20:
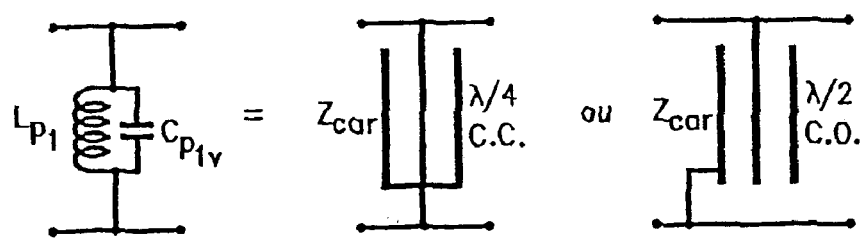
FIG. 20 shows the structure of a first resonator for this circuit.

The first 2-element resonator illustrated in FIG. 19 may be transformed as illustrated in FIG. 20.

Thus, the parallel resonator $L_{p1}$–$C_{p1}$ in FIG. 19 may be transformed either into a parallel resonator in $\lambda/4$ in short circuit on a vertical branch, or into a parallel resonator in $\lambda/2$ in open circuit on a vertical branch.

The resonant frequency of the residual shunt LC circuit $\{L_{p1} C_{p1v}\}$ is sufficiently above the resonance of $\{L_{p1} C_{p1}\}$. Strictly speaking, it would be necessary to identify the middle $\omega_0$ of the pass band of admittance values and its derivative, firstly for the $L_{p1} C_{p1v}$ form, and secondly for production with a coaxial resonator. For simplification purposes, the anti-resonant frequency $f_1$ ($Z=\infty$ or $Y=0$) and the slope $\partial(1/Z)/\partial\omega$ at this point, will be identified. These approximate values can then be specified better, if necessary, by varying the anti-resonant frequency of the coaxial resonator.

$$j(C_{p1v}/L_{p1})^{1/2}m_1^{-2}(f/f_1-f_1/f) \cong 2jC_{p1v}/L_{p1})^{1/2}m_1^{-2}(f-f_1)/f_1$$

For a $\lambda/4$ resonator in anti-resonant short circuit at $f_1$:

$$(j Z_{car} \tan(\pi f/2f_1))^{-1} \cong j \pi(f-f_1)/(2f_1 Z_{car})$$

therefore:

$$C_{p1v}=m_1^4 L_{p1}(\pi/(2A_1 Z_{car}))^2$$

(Where $A_1=2$ for $\lambda/4$ and $A_1=1$ for short circuit $\lambda/2$ $$C_{p1w}=C_{p1}-(R\omega_0)^{-1}(m_1^2-1)^{1/2}-C_{p1v}>0$$

gives an upper limit to the value of $m_1$ unless $Z_{car}$ is higher.

As a variant, an approximate resolution by identification of values and derivatives in $f_0$ at the centre of the pass band, gives $C_{p1v}$ and the frequency of $f_1+\epsilon$ of the coaxial resonator.

Figure 21:
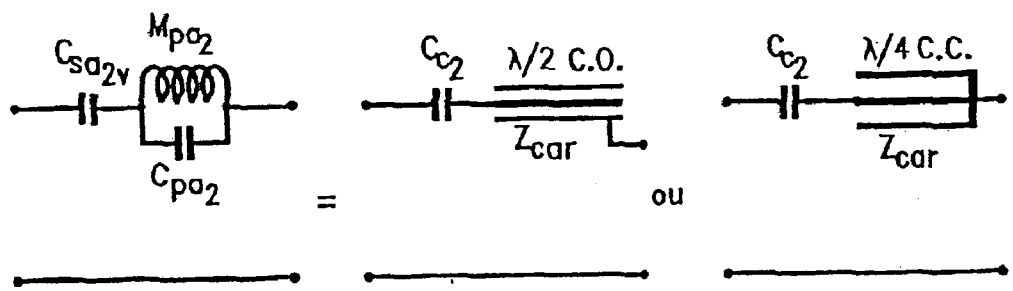
FIG. 21 shows the transformation structure for a second resonator.

The second resonator illustrated in FIG. 19 (with three elements located in an horizontal arm) may be transformed as illustrated in FIG. 21.

Thus the resonator in FIG. 19 comprising a capacitance $C_s$ $2 v$ in series with a circuit comprising an inductance $M_{p\,a\,2}$ in parallel and a capacitance $C_{p\,a\,2}$ may be transformed into either a series resonator on a horizontal arm in $\lambda/4$ in short circuit associated with a series capacitance $C_{c2}$, or a series resonator on a horizontal branch in $\lambda/2$ in open circuit associated with a capacitance $C_{c2}$.

The infinite attenuation (anti-resonant) frequency $\omega_{a2}$ must be conserved, the resonant frequency $\omega_{b2}$ is a priori in the pass band and the impedance slope must be conserved at this point. This is done by identifying $\partial(Z)/\partial\omega$ in $\omega_{b2}$ starting from the responses of equivalent circuits with discrete elements and resonator.

The impedance of the $\lambda/2$ line dipole and capacitance is:

$$Z=-j/C_{c2}jZ_{car} \cot(\pi\omega/\omega_{a2}).$$

The identification at $\omega_{b2}$ ($Z=0$) gives:

$$C_{c2}=-\tan(\pi\omega_{b2}/\omega_{a2})/(Z_{car}\,\omega_{b2})=-\pi\tan(q)/(Z_{car}\,\omega_{a2}\,q)$$

where $q=\pi\omega_{b2}/\omega_{a2}$

For a $\lambda/4$ resonator in anti-resonant short circuit at $\omega_{a2}$, the result is $C_{c2}=1/(Z_{car}\,\omega_{b2}\tan(q/2))$.

The slope at $\omega_{b2}$ may be identified as follows.

For the shape with discrete elements:

$$\partial(Z)/\partial\omega=2j L_{sb\,2\,equiv}=2j\,m_2^2 M_{pa2}(1+C_{pa2}/C_{sa2v})$$

at the series resonant frequency $\omega_{b2}$ ($f_{2b}$), where $Z=0$. $L_{sb\,2\,equiv}$ is the inductance of the three-element resonator in form b in FIG. 2.

The value of $\partial(Z)/\partial\omega$ at $\omega_{b2}$ to make the coaxial resonator is:

$$\frac{\partial(z)}{\partial\omega}=-jz_{car}\left\{\frac{\cot(\pi\omega_{b2}/\omega_{a2})}{\omega_{b2}}-\frac{\pi\csc(\pi\omega_{b2}/\omega_{a2})^2}{\omega_{a2}}\right\}=-jz_{car}\left\{\frac{\pi\cot(q)}{q\omega_{a2}}-\frac{q\csc(q)^2}{\omega_{a2}}\right\}$$

The relation between q and the capacitances ratio is:

$$\frac{C_{sa2v}}{C_{pa2}}=\frac{(\pi^2-q^2)}{q^2}$$

The result is then:

$$\frac{\partial Z}{\partial\omega}=2jm_2^2 M_{pa2}(1+C_{pa2}/C_{sa2v})^2=2jm_2^2 M_{pa2}\frac{\pi^4}{(\pi^2-q^2)^2}$$

and the value of $m_2$ is obtained by identifying the two values of $\partial(Z)/\partial\omega$ at $\omega_{b2}$ for the $\lambda/2$ line circuit and the discrete circuit.

$$m_2^2=\frac{(\pi^2-q^2)^2 Z_{car}[q\csc(q)^2-\cot(q)]}{2M_{pa2}\pi^3 q\omega_{a2}}$$

which can be developed close to $q=\pi$ to give $$m_2^2=\frac{2Z_{car}}{M_{pa2}\pi\omega_{a2}}+\frac{(1+4\pi^2/3)Z_{car}(q-\pi)^2}{2\cdot M_{pa2}\pi^3\omega_{a2}}+o[(q-\pi)^3]$$

It can be seen that $m_2$ could be obtained as a function of the capacitances ratio, and using this magnitude as a free parameter gives a simple numeric solution without any approximation; this is the choice that was actually used in the following examples.

With a $\lambda/4$ resonator in short circuit, the result would be:

$$m_2^2=\frac{(\pi^2-q^2)^2 Z_{car}[q+\sin(q)]\sec^2(q/2)}{4\cdot M_{pa2}\pi^3 q\omega_{a2}}$$

and approximately (development around $\pi/2$):

$$m_2^2=\frac{4Z_{car}}{M_{pa2}\pi\omega_{a2}}+\frac{(4/\pi+4\pi/3)Z_{car}(q-\pi)^2}{4\cdot M_{pa2}\pi^2\omega_{a2}}+o[(q-\pi)^3]$$

Starting from the relation expressing the decomposition of the capacitance $C_{sa2}$ into three parts and considering the Norton transformation already made between resonators 1 and 2, the result is:

$$C_{sa2w}^{-1} = C_{sa2}^{-1} - C_{sa2v}^{-1} - C_{p1w}^{-1}(m_1/m_{2\_1}) \text{ since } C_{sa2u} = C_{p1w}(m_1/m_{2\_1})^{-1}$$

Figure 22:
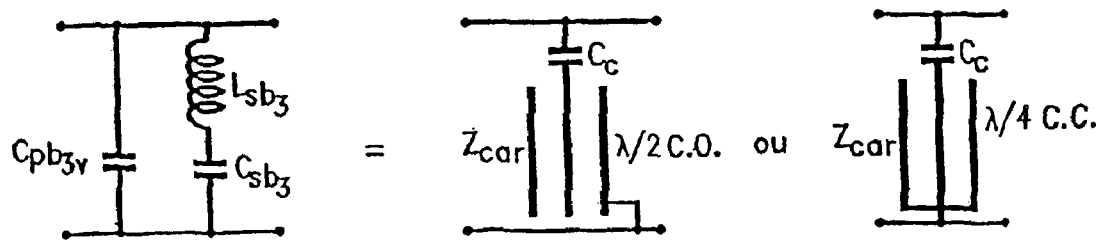
FIG. 22 shows the structure of a third resonator.

The third resonator illustrated in FIG. 19 (three elements in a vertical arm) may be transformed as illustrated in FIG. 22.

Thus, the resonator in FIG. 19 comprising a capacitance $C_{pb\,3\,v}$ in parallel with a branch formed from an inductance Ls in series with a capacitance $C_s$ may be transformed either into a parallel resonator on a vertical branch at $\lambda/4$ in short circuit in series with a capacitance $C_{c\,3}$, or into a parallel resonator on a vertical branch at $\lambda/2$ in open circuit in series with a capacitance $C_{c\,3}$.

For the third resonator, the infinite attenuation point corresponds to Z=0 at $\omega_{b3}$ that has to be conserved, whereas in principle $\omega_{a3}$ is in pass band and $\partial(1/Z)/\partial\omega$ will be identified at $\omega_{a3}$.

The condition for an infinite attenuation point at $f_{b3}$ gives:

$$C_{c3} = -\tan(\pi\omega_{b3}/\omega_{a3})/(2\,Z_{car}\,\omega_{b3})$$

The derivative should be identified at $\omega_{a3}$:
For the circuit with discrete components:

$$\partial(1/Z)/\partial\omega = 2jm_3^{-2}C_{pa3} = 2jm_3^{-2}C_{pb3v}(1+C_{pb3v}/C_{sb3})$$

For the circuit with half wave line in open circuit:

$$\partial(1/Z)/\partial\omega = j\pi/(Z_{car}\omega_{a3})$$

Let $\omega_{a3}=(1+t)\omega_{b3}$ since $f_{a3}$ is free whereas $f_{b3}$ is fixed in advance; $f_{a3}$ and $C_{pb3v}$ are related; (it will be observed that t is a simple function of the ratio of the capacitances $(1+t)^2=(1+C_{sb3}/C_{pb3v})$)

$$\omega_{b3}^2 = \omega_{a3}^2/(1+C_{sb3}/C_{pb3v}) = (1+t)^2\omega_{b3}^2/(1+C_{sb3}/C_{pb3v}), \text{ therefore}$$

$$C_{pb3v} = C_{sb3}/(t(2+t)) \text{ and}$$

$$m_3^2 = (2\,Z_{car}\,\omega_{b3}\,C_{sb3}/\pi)(1+t)^3/(t^2(2+t)^2)$$

The conditions that limit the choice of t are:

$$m_3 > m_2 \text{ therefore } t < t_{max} = (Z_{car3}\,\omega_{b3}\,C_{sb3}/(2\pi))^{1/2}/m_2\,C_{pb3w} > 0 \text{ or } C_{pb3v} < C_{pb3} \text{ or } t > t_{min} = C_{sb3}/(2\,C_{pb3})$$

(denoting $Z_{car3}$ the characteristic impedance of the coaxial resonator used for the third resonator). If $t_{min} > t_{max}$, resonators with different characteristic impedances have to be used.

It is observed that $m_2$ varies with $(Z_{car2})^{1/2}$, hence:

$$C_{sb3}/(2\,C_{pb3}) < t_{min} < t_{max} = [(Z_{car3}/(8\,Z_{car2}))C_{sb3}\,\omega_{b3}\,M_{pa2}\,\omega_{a3}]^{1/2}$$

The last resonator illustrated in FIG. 19 (horizontal arm series LC resonator) may be transformed as illustrated in FIG. 23.

Thus, the resonator in FIG. 19 comprising a capacitance $C_{s4}$ in series with an inductance $L_{s4}$ may be transformed either in a series resonator on a horizontal branch in $\lambda/4$ in short circuit with an input on the central core and output on the external metallisation of the resonator, or into a series resonator on a horizontal branch in $\lambda/2$ in open circuit, or a series resonator on a horizontal branch in $\lambda/4$ in short circuit in series with an inductance $L_{s\,4\,w}$.

For example, the last resonator $\{L_{s4}\,m_4^{-2},\,C_{s4v}\,m_4^{-2}\}$ may be made by a residual inductance associated with a resonator centred approximately on the pass band (FIG. 24d); $L_{s4} = L_{s4v}30\,L_{s4w}$; $L_{s4v}$ corresponds to the equivalent inductance of the dielectric resonator.

Then: $L_{s4v}\,C_{s4v} = L_{s4}\,C_{s4} = 1/\omega_4^2$

By identifying $$2jm_4^2\sqrt{\frac{L_{sv4}}{C_{sv4}}} = jZ_{car}/A_4$$

Hence $$m_4^2 = C_{s4v}Z_{car}\omega_4\pi/2A_4$$

And/or $C_{s4v} = (2\,A_4\,m_4^2)/(\Pi\,Z_{car}\,\omega_4)$
where $A_4=1$ for a half-wave resonator in open circuit and $A_4=2$ for a quarter-wave resonator.

Other techniques may also be considered, such as the technique of including the series narrow band matching inductance (positive or negative) in end B in the transformed inductance, or including the series narrow band matching inductance (positive or negative) in the capacitance $C_{s4b}$ (then $C_{s4w}=0$). In all cases, a more complex calculation can be used to precisely identify the centre of the pass band on a computer.

The solution obtained by combining the various expressions is expressed as follows as a function of the q and t parameters:

$$C_{p1v} = m_1^4 L_{p1}(\pi/(2\,A_1\,Z_{car}))^2$$

where $A_1=2$ for a quarter wave and 1 for a half wave $$C_{p1w} = C_{p1} - (R\omega_0)^{-1}(m_1^2-1)^{1/2} - C_{p1v}$$

This limits the possible values of $m_1$, except to increase $Z_{car1}$, q close to $\pi$ determines the following for a half wave:

$$C_{sa2v} - C_{pa2}[-1+(q/\pi)^2]$$

$$C_{sa2w}^{-1} = C_{sa2}^{-1} - C_{sa2v} - C_{p1w}^{-1}(m_1/m_2-1)$$

where $C_{sb3}/(2\,C_{pb3}) < t_{min} < t_{max} = [(Z_{car3}/(8\,Z_{car2}))C_{sb3}\,\omega_{b3}\,M_{pa2}\,\omega_{a3}]^{1/2}$ $$M_3^2 = (2\,Z_{car}\,\omega_{b3}\,C_{sb3}/\pi)(1+t)^3/(t^2(2+t)^2)$$

$$C_{pb3v} = C_{sb3}/(t(2+t))$$

$$C_{pb3w} = C_{pb3} - C_{sa2w}(m_3/m_2-1) - C_{pb3v}$$

$m_4$ is determined by comparing:

$$C_{s4u} = C_{pb3w}/(m_3/m_4-1) \text{ and}$$

$$C_{s4u}^{-1} = C_{s4}^{-1} - \pi Z_{car4}\,\omega_4/(2\,A_4\,m_4^2) - (R\omega_0)(1-m_4^2\,N^2)^{1/2}/m_4$$

which gives an equation in $1/m_4$ written as follows:

$$(m_3/m_4-1)C_{pb3w} = C_{s4}^{-1} - (\pi Z_{car4}\,\omega_4/A_4)/m_4^2 - (R\omega_0)(1/m_4^2-n^2)^{1/2} \text{ or}$$

$$(\pi Z_{car4}\,\omega_4/A_4)/m_4^2 + (R\omega_0)(1/m_4^2-n^2)^{1/2} + m_3\,C_{pb3w}^{-1}/m_4 = C_{pb3w}^{-1} + C_{s4}$$

hence $$C_{s4v} = (2\,A_4\,m_4^2)/(\pi\,\omega_4\,Z_{car4}) \text{ then}$$

$$L_{s4v} = 1/(C_{s4v}\,\omega_4^2)$$

$$L_{s4w} = L_{s4} - L_{s4v} \text{ and}$$

$$C_{s12} = C_{sa2u}/(m_1\,m_2)\,C_{p12} = C_{p1w}/(m_1\,m_2)$$

$C_{p23}=(1/m_2-1/m_3)C_{sa2w}$  $C_{s23}=C_{sa2w}/(m_2\ m_3)$ $C_{s34}=C_{pb3w}/(m_3\ m_4(m_3/m_4-1))$  $C_{p34}=C_{pb3w}/(m_3\ m_4)$ $C_{p4}=root(1/m_4{}^2-n^2)/(R\ \omega_0\ n)$ The data given below could provide a numeric solution for this case.

The prototype is a filter with the same topology as that shown in FIG. 19, but this is a synthesised filter to give specified infinite attenuation frequencies (888 MHz and 899 MHz) very close to the pass band that varies from 890 to 897 MHz. The ripple in the pass band is 0.2 dB. Attenuated band rejections (not equal in this case) are of the order of slightly less than 30 dB. The following table contains values of elements in the equivalent prototype circuit.

TABLE 8

Rs = 75.00
R1 = 75 * n²; n² = 0.645;

| 1 | Cap | CP1 = Ca | 1 | 0 | 4.3800E−10 |
| 2 | Ind | Lp1 = La | 1 | 0 | 7.2200E−11 |
| 3 | Cap | Csa2 | 1 | 2 | 1.6750E−11 |
| 4 | Cap | Cpa2 | 2 | 3 | 1.7030E−10 |
| 5 | Ind | Lpa2 | 2 | 3 | 1.8400E−10 |
| 6 | Cap | Csb3 | 3 | 4 | 8.0600E−14 |
| 7 | Ind | Lsb3 | 4 | 0 | 3.9860E−07 |
| 8 | Cap | Cpb3 | 3 | 0 | 8.1350E−12 |
| 9 | Cap | Cs4 = Csb | 3 | 5 | 3.1000E−12 |
| 10 | Ind | Ls4 = Lsb | 5 | 6 | 1.0284E−06 |

We chose capacitances matching (positive and negative) at each end and as mentioned above, the decomposition of the inductance of the series resonator at end B (+1 parameter) into two ($L_{sbu}+L_{sbv}$). 4 parameters are fixed by fixing the characteristic impedance and the equivalence, and there are still 3+1 parameters available (the additional parameter is derived from decomposition of the inductance $L_{sb}$). It was decided that the negative matching capacitance at end A will cancel the transformed capacitance Cp1u, that the quarter wave line at end B will resonate at the central frequency and that the negative matching capacitances at end B will cancel the transformed capacitance $C_{s4w}$. There is still one free parameter that may be equal to the value of an inductance or of a capacitor. The value chosen is $C_{s4v}$.

FIG. 24 shows an example solution thus obtained.

Table 9 below illustrates the values of elements in the TEM lines circuit for a particular solution.

TABLE 9

Terminations Rs = 75.00 1
Rl = 75.00 15

| 1 | Cap | 1 | 2 | c1 = Cs1 = | 0.407d−12 |
| 2 | LGN | 2 | 0 | Line 1 lambda/4 cc, zc = 11.5, fa1 = 922.195d6 |
| 3 | Cap | 2 | 3 | c2 = cs12 = | 0.602d−12 |
| 4 | Cap | 3 | 0 | c3 = cp12 = | 0.740d−12 |
| 5 | Cap | 3 | 4 | c4 = cc2 = | 0.649d−12 |
| 6 | LGN | 4 | 5 | Line 2 lambda/2 co, zc = 11.5 Ohm, fa2 = 899.000d6 |
| 7 | Cap | 5 | 0 | c5 = cp23 = | 0.00583d−12 |
| 8 | Cap | 5 | 6 | c6 = cs23 = | 0.512d−12 |
| 9 | Cap | 5 | 7 | c7 = cc3 = | 0.523d−12 |
| 10 | LGN | 7 | 0 | Line 3 lambda/2 co, zc = 11.5, fa3 = 897.590d6 |
| 11 | Cap | 7 | 8 | c8 = cs34 = | 0.625d−12 |
| 12 | Cap | 8 | 0 | c9 = cp34 = | 22.1d−12 |
| 13 | LGN | 8 | 9 | Line 4 lambda/4 co, zc = 11.5, fr = 891.370d6 |
| 14 | Ind | 9 | 10 | 11 = Lbw | 3.263 nH |
| 15 | Cap | 10 | 11 | c11 = cp4 | 49.77d−12 |

An analysis was carried out to verify that the transformation gives a good result. FIG. 25 shows the response calculated with rounded values of capacitances for lines with equal characteristic impedance.

5. We will now describe a second example application for order 12 elliptical filters.

Figure 26:
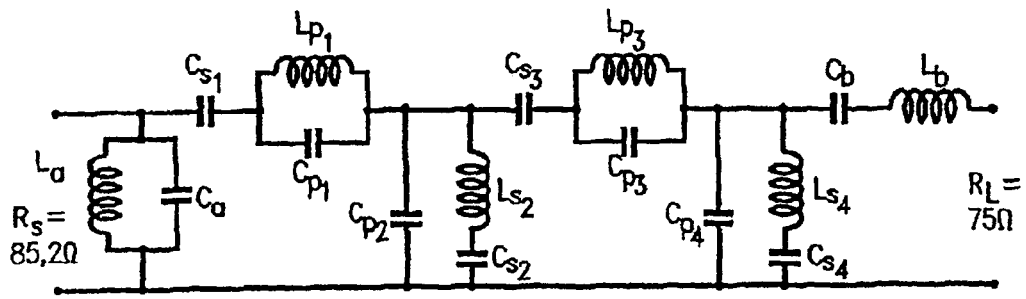
FIG. 26 shows the circuit for an order 12 prototype zigzag filter.
Figure 27:
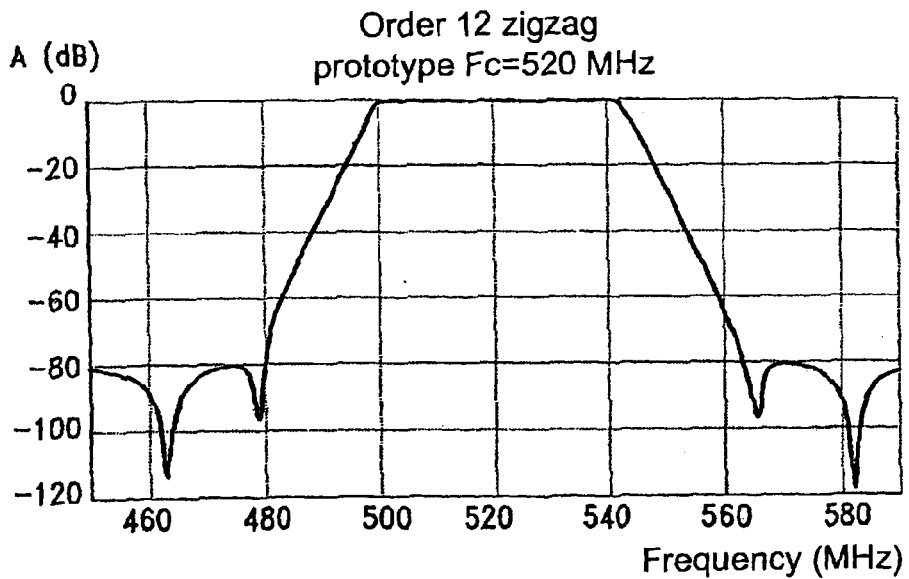
FIG. 27 shows the response of such a prototype zigzag filter.

This example applies to transformation of an order 12 zigzag LC elliptical prototype with a central frequency of 520 MHz with a pass band of 40 MHz with a ripple of 0.3 dB and an attenuated band rejection of 70 dB (see the circuit shown in FIG. 26 and the response given in FIG. 27). At this frequency, the high inductances of the prototype circuit are difficult to make (self resonance too low) and secondly dielectric resonators enable an appreciable performance gain, particularly in terms of the loss of insertion due to their high overvoltage. The principle described above for order 8 can easily be extended to higher orders by iteration on pairs of three-element resonators.

In the transformation, the parameters we chose were the n−2=4 capacitance ratios of three-element resonators (in the final transformed state) and one capacitance $C_{s4v}=C_{sbv}$. The three-element resonators are always transformed to obtain an open circuit half wave line in series with a capacitance. As before, we also chose quarter waves in short circuit and in open circuit for ends A and B respectively. In this case we will only use one additional matching component at each end (the other end being absorbed in a component of the transformed circuit), which implies additional relations and reduces the number of degrees of freedom.

For narrow band matching at the ends of the filter, the formulas described above are applied with the possibility of choosing the additional matching component (inductance or capacitance) at each end. The first case may be useful particularly for making multiplexers.

As for the case of filters based on the LC technology, the program determines the range of existence of solutions (by the variation of $C_{sbv}$ within its possible variation range and by variation of the four capacitance ratios between their initial values and about ½₀ of the initial values) (avoiding values too close to zero (which is the minimum allowed) that result in capacitance values that are too extreme). By definition, a solution exists for given values of parameters when all inequalities mentioned above are respected and when all calculated values of the filter elements are positive.

In the example chosen, 17 steps were used for each of the capacitance ratios, and 10 steps were used for $C_{sbv}$. The calculation shows about 100 000 solutions out of about 835 000 tested configurations.

The next step was to calculate about a hundred solutions with parameters distributed within the existence range, for each matching case at ends A and B and in the case of two typical values of the characteristic impedance (11.5 ohms and 7.0 ohms). Solutions were checked by analysis.

The following is an example determination of the solutions space (for matching by inductance at both ends).

Table 10 below contains the extreme values of parameters leading to solutions:

---

TRANSFORMATION OF THE order 12 ZIGZAG
ELLIPTICAL PASS BAND (bp6_520)
CALCULATIONS FOR Zc = 11.50000 Ohms
PRELIMINARY STEP, No. calculations = 835 210
No. solutions = 111206
Existence of solutions for parameters in the following ranges: (Csbv and resonator capacitance ratios working from A towards B)

$C_{sbvmin}$ = 0.49666D−12    $C_{sbvmax}$ = 0.24828D−11
$RAPC2_{min}(1)$ = 0.24063D+00    $RAPC2_{max}(1)$ = 0.36629D+01

-continued

TRANSFORMATION OF THE order 12 ZIGZAG
ELLIPTICAL PASS BAND (bp6_520)
CALCULATIONS FOR Zc = 11.50000 Ohms
PRELIMINARY STEP, No. calculations = 835 210
No. solutions = 111206
Existence of solutions for parameters in the following ranges: (Csbv
and resonator capacitance ratios working from A towards B)

| | |
|---|---|
| RAPC3$_{min}$(1) = 0.83876D+00 | RAPC3$_{max}$(1) = 0.26688D+01 |
| RAPC2$_{min}$(2) = 0.34033D+00 | RAPC2$_{max}$(2) = 0.51805D+01 |
| RAPC3$_{min}$(2) = 0.16288D+01 | RAPC3$_{max}$(2) = 0.41712D+01 |

In fact, in this case, the existence range is more complicated (fragmented) than is apparent looking at these simplified data. In the case of matching at the ends by two capacitances or by an inductance and a capacitance, it is observed that the existence range remains fairly similar to the existence range indicated above. One of the advantages of this analysis of the range in which solutions exist is that it shows that it is also possible to obtain a circuit using five judiciously predetermined values of capacitances in the final circuit (for example standard series values) and to provide a systematic method for obtaining solutions of this type.

Solutions can then very quickly be calculated for a restricted range of variation of parameters. Numeric solutions obtained at various points within the range in which solutions exist for two matching cases at the ends are given below.

Numeric examples of solutions: transformation of an order 12 filter to input lines with Zc=11.5 Ohms.

The characteristics of the target filter are as follows:

Central frequency 520 MHz,

Pass band 40 MHZ,

Better than 15 dB attenuation at F<490 MHz and F>550 MHz+−,

Ripple in pass band 0.3 dB,

Rejection in attenuated band 80 dB (equi-ripple).

The circuit for the prototype filter with elliptical response that satisfies the required envelope curve is shown in FIG. 26 (order 12 zigzag prototype filter).

Table 11 below gives the values of elements of the zigzag prototype filter circuit illustrated in FIG. 26 denormalised) (MKSA units).

TABLE 11

RS = 85.20 1
RL = 75.00 15

| | | | | | |
|---|---|---|---|---|---|
| 1 | CAP | Ca | 1 | 0 | 0.59486E−10 |
| 2 | IND | La | 1 | 0 | 0.15580E−08 |
| 3 | CAP | Cs1 | 1 | 2 | 0.94744E−12 |
| 4 | IND | Lp1 | 2 | 3 | 0.19285E−07 |
| 5 | CAP | Cp1 | 2 | 3 | 0.38757E−11 |
| 6 | CAP | Cs2 | 3 | 4 | 0.43877E−11 |
| 7 | IND | Ls2 | 4 | 0 | 0.26838E−07 |
| 8 | CAP | Cp2 | 3 | 0 | 0.17063E−10 |
| 9 | CAP | Cs3 | 3 | 5 | 0.11324E−11 |
| 10 | IND | Lp3 | 5 | 6 | 0.12138E−07 |
| 11 | CAP | Cp3 | 5 | 6 | 0.65513E−11 |
| 12 | CAP | Cs4 | 6 | 7 | 0.17677E−11 |
| 13 | IND | Ls4 | 7 | 0 | 0.62614E−07 |
| 14 | CAP | Cp4 | 6 | 0 | 0.10744E−10 |
| 15 | CAP | Cb | 6 | 8 | 0.24827E−12 |
| 16 | IND | Lb | 8 | 9 | 0.38478E−06 |

The calculated response of the zigzag prototype filter is given in FIG. 27.

We will now give a first example transformation: matching by two inductances.

The transformation is done as described above. The parameters used are the ratios of the resonator capacitances and when the range of existence of solutions has been determined, a solution is chosen that gives acceptable values of elements located within this existence range for a low value of the Csbv parameter. The advantage of including inductances at the ends of the filter is considerable. Firstly, they help to significantly reduce undesirable responses in attenuated band due to the multi-mode nature of the resonators. Secondly, their losses do not influence the response of the filter if care is taken to take them into account in source and load resistances.

Figure 28:
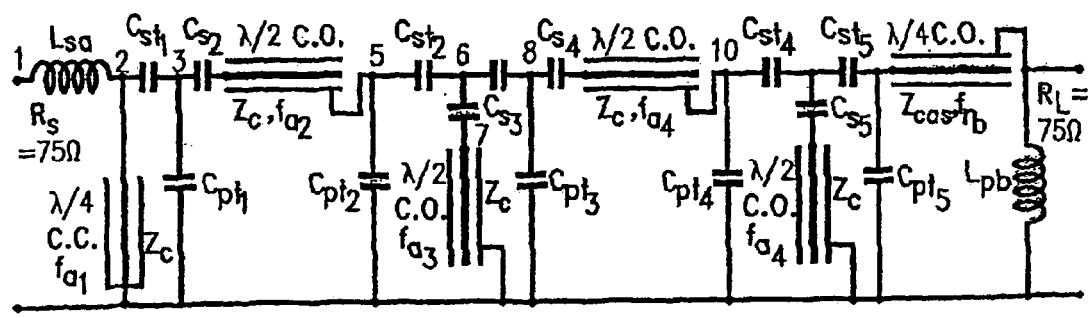
FIG. 28 shows the circuit for a transformed filter with matching by two impedances.

The LC equivalent transformed circuit is shown in FIG. 28, and table 12 below gives values of elements (LC equivalent elements):

TABLE 12

(File LL58.CKT ellipt. Zigzag bp6_520)
RS = 75.00 1
RL = 75.00 15

| | | | | | |
|---|---|---|---|---|---|
| 1 | IND | Lsa | 1 | 2 | 0.34662E−07 |
| 2 | IND | La | 2 | 0 | 0.44940E−08 |
| 3 | CAP | Ca | 2 | 0 | 0.20961E−10 |
| 4 | CAP | Cst1 | 2 | 3 | 0.19033E−11 |
| 5 | CAP | Cpt1 | 3 | 0 | 0.81304E−11 |
| 6 | CAP | Cs2 | 3 | 4 | 0.15559E−09 |
| 7 | IND | Lp2 | 4 | 5 | 0.20015E−08 |
| 8 | CAP | Cp2 | 4 | 5 | 0.37343E−10 |
| 9 | CAP | Cpt2 | 5 | 0 | 0.87980E−10 |
| 10 | CAP | Cst2 | 5 | 6 | 0.20161E−09 |
| 11 | CAP | Cs3 | 6 | 7 | 0.37702E−10 |
| 12 | IND | Lp3 | 7 | 0 | 0.16975E−08 |
| 13 | CAP | Cp3 | 7 | 0 | 0.31670E−10 |
| 14 | CAP | Cst3 | 6 | 8 | 0.11219E−10 |
| 15 | CAP | Cpt3 | 8 | 0 | 0.13692E−11 |
| 16 | CAP | Cs2 | 8 | 9 | 0.17119E−10 |
| 17 | IND | Lp2 | 9 | 10 | 0.20645E−08 |
| 18 | CAP | Cp2 | 9 | 10 | 0.38547E−10 |
| 19 | CAP | Cpt4 | 10 | 0 | 0.21913E−10 |
| 20 | CAP | Cst4 | 10 | 11 | 0.59035E−10 |
| 21 | CAP | Cs3 | 11 | 12 | 0.17435E−10 |
| 22 | IND | Lp3 | 12 | 0 | 0.20129E−08 |
| 23 | CAP | Cp3 | 12 | 0 | 0.37554E−10 |
| 24 | CAP | Cst5 | 11 | 13 | 0.72521E−11 |
| 25 | CAP | Cpt5 | 13 | 0 | 0.26855E−10 |
| 26 | CAP | Csb | 13 | 14 | 0.34582E−10 |
| 27 | IND | Lsb | 14 | 15 | 0.28211E−08 |
| 28 | ind | Lpb | 15 | 0 | 0.27824E−08 |

Table 13 below gives the values of parameters used for a transformed lines circuit (the ratios of the capacitances of three-element resonators and transformation ratios, the free parameter $C_{sbv}$ is chosen to be equal to $5 \times 10^{-12}$ F)

TABLE 13

RAPC2(1) = 0.24000D+00   RAPC3(1) = 0.84000D+00
RAPC2(2) = 0.22500D+01   RAPC3(2) = 0.21540D+01
(capacitance ratio of 3-element dipoles (transformation parameters)
FILTER CIRCUIT WITH DIELECTRIC RESONATORS step csbv = 1
CSBV = 0.50000D−12
Transformation ratio Na = 0.106658D+01 M1 = Ma = 0.16984D+01
SOURCE = 75 000 Ohms Ls-H matching = 0.346624D−07
Vertical arm Lp-Cp Lpeq = 0.449397D−08 cpeq = 0.209611D−10
OR 1/4 line O. SC Zc = 0.115000D+02 Faa = 0.518559D+09
Impedance translation: Cs-H(1, 2) = 0.190326D−11
Cp-V(1, 2) = 0.813040D−11
Transformation ratio used M2 = 0.32216D+00
Horizontal parallel resonator Fr = 0.256112778D+09
Fa = 0.582152101D+09
Csr2 = 0.155595D−09 Lpr2 = 0.200153D−08 Cpr2 = 0.373427D−10
OR 1/2 LINE O. OC at Fa, Zc = 0.115000D+02
Cseries = Cspr2 = 0.155595D−09

TABLE 13-continued

Figure 29:
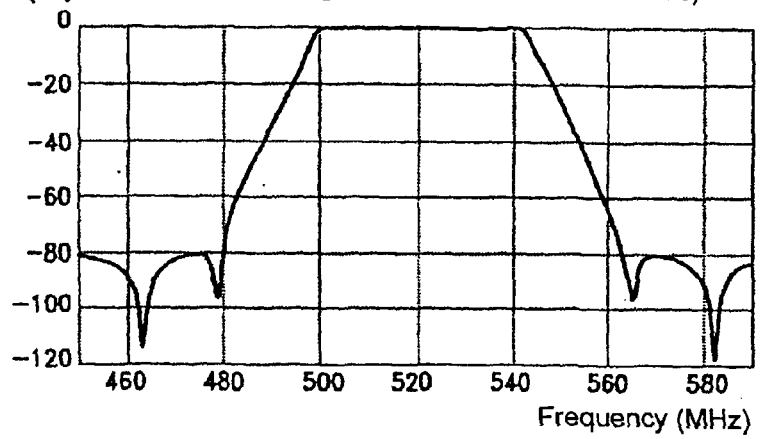
FIG. 29 shows the response of the transformed filter for the TEM resonators, Zc=11.5 Ohm (matching for inductances at both sides)

Impedance translation: Cp-V(2, 3) = 0.879795D−10
Cs-H(2, 3) = 0.201608D−09
Transformation ratio used M3 = 0.46275D+00
Vertical series resonator fr = 0.463796316d+09
fa = 0.686430486d+09
Csr3 = 0.204903D−10 Lsr3 = 0.574695D−08
Cpr3 = 0.172119D−10
or Vertical parallel resonator fr = 0.463796316D+09
fa = 0.686430486D+09
Lpr3 = 0.169747D−08 Cpr3 = 0.316698D−10 Csr3 = 0.377022D−10
OR 1/2 LINE O. O.C. at Fa, Zc = 0.115000D+02
Cseries = Cspr3 = 0.377022D−10
Impedance translation: Cs_H(3, 4) = 0.112193D−10
Cp_V(3, 4) = 0.136919D−11
Transformation ratio used M4 = 0.41242D+00
Horizontal parallel resonator Fr = 0.469611479+09
Fa = 0.564402756D+09
Csr4 = 0.171187D−10 Lpr4 = 0.206447D−08 Cpr4 = 0.385171D−10
OR 1/2 LINE O. O.C. at Fa, Zc 0.115000D+02 Cseries =
Cspr4 = 0.171187D−10
Impedance translation: Cp_V(4, 5) = 0.219132D−10
Cs_H(4, 5) = 0.590349D−10
Transformation ratio used M5 = 0.565550D+00
Vertical series resonator fr = 0.478381789D+09
fa = 0.578872121D+09
Csr5 = 0.2552780D−11 Lsr5 = 0.200234D−07 Cpr5 = 0.119069D−10
Or vertical parallel resonator fr = 0.478381789D+09
fa = 0.578872121D+09
Lpr5 = 0.201287D−08 Cpr5 = 0.375543D−10 Csr5 = 0.174347D−10
OR 1/2 LINE O. O.C. at Fa, Zc = 0.115000D+02
Cseries = Cspr5 = 0.174347D−10
Impedance translation: Cs_H(5, 6) = 0.725212D−11
Cp_V(5, 6) = 0.268545D−10
Transformation ratio used M6 = Mb = 0.12024D+00 No. = 0.10000D+01
LC series arm Leq = 0.282114−08 Ceq = 0.345820D−10
Fr = 0.509545251D+09
OR 1/4 LINE O. O.C. Zc = 0.115000D+02 Fr = 0.509545251D+09 in series Capa-H Csbrest = 0.100000D+31 Self // lpbdapt = 0.27842D−08
Termination = 75 000 Ohms END OF TRANSFORMED CIRCUIT,
step of csbv no = 1
Result of calculations written to file = LL58.CKT A simulation is made to check that the response obtained with the transformed circuit is actually the same as the response of the prototype circuit. The response of the transformed filter with matching by two inductances is shown in FIG. 29 (it will be noted that the addition of inductive matching components and/or the use of distributed resonators slightly improves the response outside the band (the effect increases as the distance from the pass band increases).

We will now give a second example of transformation of the same prototype filter but with matching of two capacitances at both ends A and B.

The procedure is the same and values of parameters were chosen fairly arbitrarily. The form of the transformed circuit (LC equivalent) is the same as the form of the circuit given for the previous example, except for the use of two capacitances at both ends, and in this case the values of the elements are given in table 14 below:

TABLE 14

| | | RS = 75.00 1 | | | |
| | | RL = 75.00 15 | | | |
|---|---|---|---|---|---|
| 1 | CAP | Csa | 1 | 2 | 0.28978E−11 |
| 2 | IND | La | 2 | 0 | 0.40955E−08 |
| 3 | CAP | Ca | 2 | 0 | 0.19103E−10 |
| 4 | CAP | Cst1 | 2 | 3 | 0.19959E−11 |
| 5 | CAP | Cpt1 | 3 | 0 | 0.80490E−11 |
| 6 | CAP | Cs1 | 3 | 4 | 0.15559E−09 |
| 7 | IND | Lp1 | 4 | 5 | 0.20015E−08 |

TABLE 14-continued

| | | RS = 75.00 1 | | | |
| | | RL = 75.00 15 | | | |
|---|---|---|---|---|---|
| 8 | CAP | Cp1 | 4 | 5 | 0.37343E−10 |
| 9 | CAP | Cpt2 | 5 | 0 | 0.85527E−10 |
| 10 | CAP | Cst2 | 5 | 6 | 0.19530E−09 |
| 11 | CAP | Cs2 | 6 | 7 | 0.37702E−10 |
| 12 | IND | Lp2 | 7 | 0 | 0.16975E−08 |
| 13 | CAP | Cp2 | 7 | 0 | 0.31670E−10 |
| 14 | CAP | Cst3 | 6 | 8 | 0.28836E−10 |
| 15 | CAP | Cpt3 | 8 | 0 | 0.35192E−11 |
| 16 | CAP | Cs3 | 8 | 9 | 0.17119E−10 |
| 17 | IND | Lp3 | 9 | 10 | 0.20645E−08 |
| 18 | CAP | Cp3 | 9 | 10 | 0.38517E−10 |
| 19 | CAP | Cpt4 | 10 | 0 | 0.61695E−11 |
| 20 | CAP | Cst4 | 10 | 11 | 0.10255E−10 |
| 21 | CAP | Cs4 | 11 | 12 | 0.14707E−10 |
| 22 | IND | Lp4 | 12 | 0 | 0.20732E−08 |
| 23 | CAP | Cp4 | 12 | 0 | 0.38681E−10 |
| 24 | CAP | Cst5 | 11 | 13 | 0.12380E−10 |
| 25 | CAP | Cpt5 | 13 | 0 | 0.55386E−10 |
| 26 | CAP | Csb | 13 | 14 | 0.68678E−10 |
| 27 | IND | Lsb | 14 | 15 | 0.56027E−08 |
| 28 | CAP | Cpb | 15 | 0 | 0.33597E−10 |

Table 15 below contains the value of elements in the transformed lines circuit and the values of parameters used in the global transformation:

TABLE 15

Iteration no = 37
RAPC2(1) = 0.24000D+00         RAPC3(1) = 0.84000D+00
RAPC4(2) = 0.22500D+01         RAPC5(2) = 0.26300D+01
(capacitance ratios for the three-element dipoles chosen for the transformation)
FILTER CIRCUIT WITH DIELECTRIC RESONATORS
step csbv no = 2
CSBV = 0.10000D−11
Transformation ratio Na = 0.106658D+01 M1 = Ma = 0.16213D+01
SOURCE = 75 000 Ohms Cs-H matching = 0.289776D−11
Vertical arm Lp-Cp Lpeq = 0.409550D−08 Cpeq = 0.191025D−10
OR 1/4 line 0. SC Zc = 0.115000D+02 Faa = 0.569012D+09
Impedance translation: Cs-H(1, 2) = 0.199589D−11
Cp-V(1, 2) = 0.804901D−11
Transformation ratio used M2 = 0.32216D+00
Horizontal parallel resonator Fr = 0.256112778D+09
Fa = 0.582152101D+09
Csr2 = 0.155595D−09 Lpr2 = 0.200153D−08 Cpr2 = 0.373427D−10
OR LINE 1/2 O. OC at Fa, Zc = 0.115000D+02 Cseries =
Cspr2 = 0.155595D−09
Impedance translation: Cp-V(2, 3) = 0.852272D−10
Cs-H(2, 3) = 0.195301D−09
Transformation ratio used M3 = 0.46275D+00
Vertical series resonator fr = 0.463796316D+09 fa = 0.686430486D+09
Csr3 = 0.204903D−10 Lsr3 = 0.574695D−08 Cpr3 = 0.172119D−10
Or vertical parallel resonator fr = 0.463796316D+09
fa = 0.686430486D+09
Lpr3 = 0.169747D−08 Cpr3 = 0.316698D−10 Csr3 = 0.377022D−10
OR 1/2 LINE O. O.C. at Fa, Zc = 0.115000D+02 Cseries =
Cspr3 = 0.377022D−10
Impedance translation: Cs_H(3, 4) = 0.288363D−10
Cp_V(3, 4) = 0.351915D−11
Transformation ratio used M4 = 0.41242D+00
Horizontal parallel resonator Fr = 0.469611479+09
fa = 0.564402756D+09
Csr4 = 0.171187D−10 Lpr4 = 0.206447D−08 Cpr4 = 0.385171D−10
OR 1/2 LINE O. O.C. at Fa, Zc = 0.115000D+02 Cseries =
Cspr4 = 0.171187D−10
Impedance translation: Cp_V(4, 5) = 0.616955D−11
Cs_H(4, 5) = 0.102549D−10
Transformation ratio used M5 = 0.66053D+00
Vertical series resonator fr = 0.478381789D+09 fa = 0.562017808D+09
Csr5 = 0.405163D−11 Lsr5 = 0.273188D−07 Cpr5 = 0.106558D−10
Or vertical parallel resonator fr = 0.478381789D+09
fa = 0.562017808D+09
Lpr5 = 0.207323D−08 Cpr5 = 0.386805D−10 Csr5 = 0.147074D−10

TABLE 15-continued

```
OR 1/2 LINE O. O.C. at Fa, Zc = 0.115000D+02 Cseries =
Cspr5 = 0.147074D-10
Impedance translation: Cs__H(5, 6) = 0.123796D-11
Cp__V(5, 6) = 0.553864 D-10
Transformation ratio used M6 = Mb = 0.12067D+00 No. = 0.10000D+01
LC series arm Leq = 0.560267D-08 Ceq = 0.686783D-10
Fr = 0.256574124D+09
OR 1/4 LINE O. O.C. Zc = 0.115000D+02 Fr = 0.256574124D+09
Matching capacitance // Cpbdapt = 0.335971D-10
Termination = 75 000 Ohms
END OF TRANSFORMED CIRCUIT, step of csbv no = 2
Result of calculations written to file = CC43.CKT
```

Figure 30A:
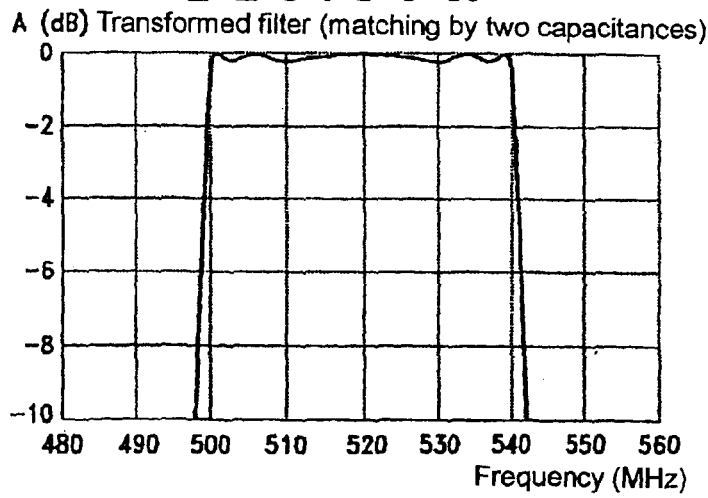
FIGS. 30a and 30b show the responses of the transformed filter respectively with matching by capacitances, in pass band in FIG. 30a and for the entire response in FIG. 30b.
Figure 30B:
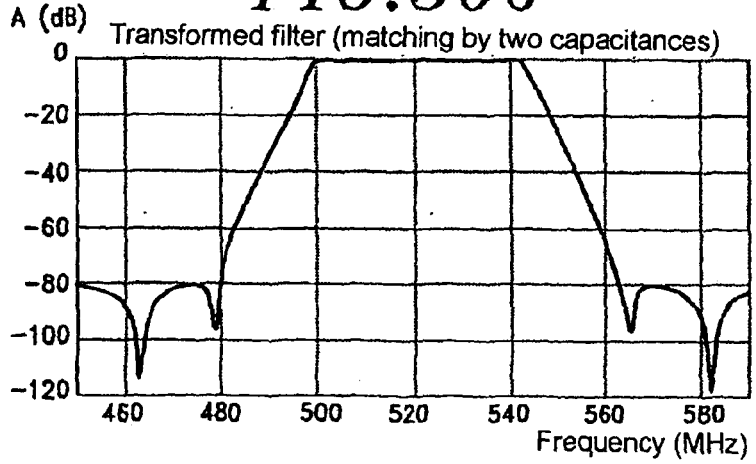

The simulation to check the response of the transformed filter with matching by capacitances was made, and this response is shown in FIGS. 30a and 30b for the pass band and the entire response respectively. There is an extremely small modification to the response outside the band due to the use of TEM resonators and/or matching (improvement at the high frequencies end).

Another application of this invention is for the design of matchable filters.

Available degrees of freedom (either all degrees of freedom, or degrees of freedom remaining after a transformation has been made to obtain given inductances or particular resonators) may (also) be used to reduce the number of variable capacitances in matchable filters, for example for which it is desired to keep the pass band approximately constant over the entire matching range. Thus, the result is that coupling quadripoles between resonators can be kept constant, or their variation may be limited.

6. We will now describe application of the process according to this invention to crystal resonator filters.

Crystal piezoelectric resonators have unequalled overvoltage characteristics (up to several million and typically several hundred thousand for quartz) and stability characteristics as a function of the temperature and time, so that high performance filters with narrow or very narrow relative bands can be made. They use electromechanical waves that propagate within the volume or on the surface of monocrystalline solids (quartz, lithium tantalate, lithium niobate, langasite (lanthanum silico-gallate), gallium phosphate, etc.) or piezoelectric ceramics (lead titano-zirconate, etc.). They are distributed multi-mode components (like dielectric resonators) with an electrical behaviour that is described approximately by an equivalent three-element resonator type circuit [15 to 19], near one of their electromechanical resonances (there is also an infinite number of resonances). Approximate transmission line models of crystal resonators are also known. But these models are too complicated to be used for the synthesis of filters (several lines). Equivalent circuits with discrete elements comprising several series resonant arms are also more frequently used, particularly to analyse the effects of other modes after a synthesis.

Diagrammatically, existing technologies can be used to make bulk wave resonators within the 10 kHz–10 GHz frequency range and surface wave resonators within the 10 MHz–10 GHz range (resonant frequencies are highly complex functions of parameters characterising the material and geometric parameters characterising resonators). The dependence of these resonators is frequently dominated by the dependence of one of the parameters (the thickness for many bulk wave resonators, and the pitch of interdigitised combs for surface wave resonators).

As mentioned above, these resonators are characterised by a ratio of capacitances fixed approximately by the material, the wave type and the crystalline orientation (for example of the order of 0.52% for the slow shear bulk wave of cut quartz AT), and furthermore values of inductances that can be achieved for a given frequency under "good conditions" (in terms of performance, undesirable responses and cost), are located within a usually very narrow range of values (for example towards the centre of the 5.7 mH to 10.9 mH range for AT quartz at 20 MHz). Since the filters are very narrow, the "most easily achievable" values of equivalent inductances of the different resonators are very close (close frequencies), and we can often force them to be equal without much difficulty.

Bulk wave resonators operating at frequencies of several GigaHertz can be obtained using thin layers of piezoelectric materials (ZnO, AlN, TaLiO$_3$, etc.). It has been shown that thin crystalline layers of AlN epitaxied on gallium arsenide can be made so that filtering and amplification functions can be achieved. This technology has been known for a long time, but is difficult to control and can be used to make very miniaturised filters that can be co-integrated with microelectronics. Existing applications are aimed at the 500 MHz–3000 MHz frequency range. It has been determined that the upper frequency limit is from 10 to 30 GHz depending on the materials.

The principles of the different types of surface wave resonators and their properties are briefly mentioned below. Filters using these devices are now becoming very important due to the advantage of reducing the volume and cost of components in equipment, and particularly in subscriber terminals. For example, they are extremely small (a few mm$^3$) at the frequencies used in earth and satellite personal radio communications, and it would be possible to envisage making filter banks or integrated multiplexers on the same substrate, so as to make multi-standard and multi-frequency terminals.

A crystal filter can be made using the process according to the invention based on the following principle.

Diagrammatically, the principle is to use degrees of freedom introduced in the general transformation method to identify resonators with a given inductance and a given capacitances ratio. One of the resonant or anti-resonant frequencies is free. The other is imposed by the position of infinite points.

Going into more detail, a number of refinements can be implemented, like the following. If the precise dependence of the ratio of the capacitance and inductance on the different parameters characterising the resonator (that can be calculated by digital models [19]) is known, it is possible to determine the most favourable range (narrower than the previous range) of values of inductances achievable for each resonant frequency from the point of view of their performances and cost (moreover, the inventors have demonstrated that there are values of parameters for crystal resonators for filters that optimise the electrical characteristics, and also almost optimise the cost of these resonators at the same time [18]). Within this narrower range of inductance values, the precise value of the capacitances of the equivalent circuit and their ratio is obtained (this ratio is then almost independent of all parameters characterising the resonators (insensitivity) and it remains close to the usual value characterising the material, the given crystalline orientation and the wave type used), while the sensitivity of the inductance to parameters other than the thickness is practically zero (reduction of manufacturing dispersions). Furthermore, it is generally possible to force their design such that the only difference in the manufacture of different resonators (different frequencies) is in a parameter that is easy to control (for example the thickness of the crystalline blade or the thickness of metallisation). Thus, the end result is that it is possible to economically make filters with higher performance responses (resulting from the choice of prototypes with minimum inductance with rational responses) than are possible with polynomial responses usually used for crystal filters.

We will now give an example embodiment of a bulk wave resonator filter using the process according to the invention.

We will now consider an intermediate frequency filter with a 1.5 MHz pass band, centred at 70 MHz and with a high shape factor (3 dB/60 dB transition in less than 500 kHz) and 400 ohm termination impedances (equal). We chose a degree 12 elliptical response which, with four finite infinite attenuation frequencies generated by crystal resonators and close to the pass band (at 0.68162046D+08 Hz, 0.68641759D+08 Hz, 0.71879273D+08 Hz; 0.71376924D+08 Hz), provides the required stiffness of the transition band.

The material chosen is lithium tantalate with a cut very close to X that gives resonators with a much greater theoretical capacitance ratio than quartz ($C_p/C_s \# 8k^2/n^2\pi^2 + \epsilon(k^4)$) where k #44% compared with #8% for quartz. With this material, inductances of the order of 40.0 $\mu$H can be obtained for resonant frequencies close to 68.5 MHz and a dynamic capacitance Cs of the order of 0.135 pF. In practice, the experimental static capacitance is of the order of 1.5 pF. It includes a global parasite capacitance of the order of 0.65 pF, itself comprising capacitances representing the package and a very low capacitance between accesses. The circuit of the filter takes account of these parasite capacitances. In order to simplify the presentation, we preferred to take them into account globally and consider the total "static" capacitance (which corresponds to the case in which the package is left disconnected). The overvoltage of these resonators is of the order of 2500. Furthermore, we would like to use two inductances of the order of 400 nH at the ends of the filter, to create helical resonators in small cavities with a minimum overvoltage of 350–400. However, the overvoltage of these elements is not very critical in this case, and it can be decided to use inductances on a very small torus of carbonyl iron powder.

Figure 31:
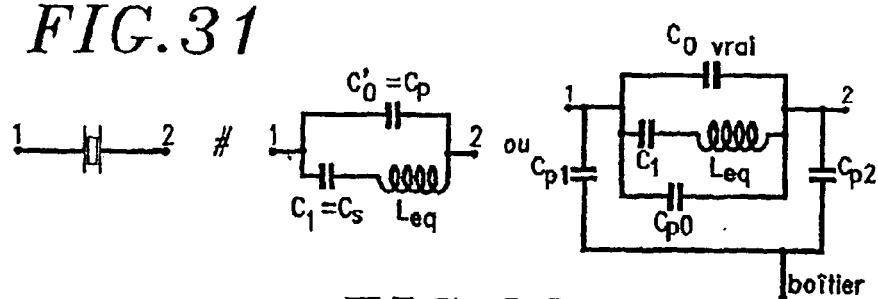
FIG. 31 shows a circuit equivalent to a resonator with lithium tantalate.

FIG. 31 shows the equivalent circuit for a lithium tantalate resonator with fr #68.5 MHz.

As can be seen in FIG. 31, the resonator can be considered like a capacitance $C_0'$ placed in parallel with a branch comprising a capacitance $C_s$ and an inductance $L_s$ in series.

The resonator can also be considered like a circuit comprising the components that have just been described, and also two additional capacitances $C_{p1}$ and $C_{p2}$ that connect the circuit input and output respectively to a capacitance $C_{p0}$ between the input and output.

When the metal package of the resonator is left disconnected, the two circuits are equivalent with $C'_0 = C_0 + C_{p0} + (C_{p1} \cdot C_{p2})/(C_{p1} + C_{p2})$ where $C_{p0}$, $C_{p1}$, $C_{p2}$ represent the parasite capacitances between the input and output and between these accesses and the package.

Figure 32:
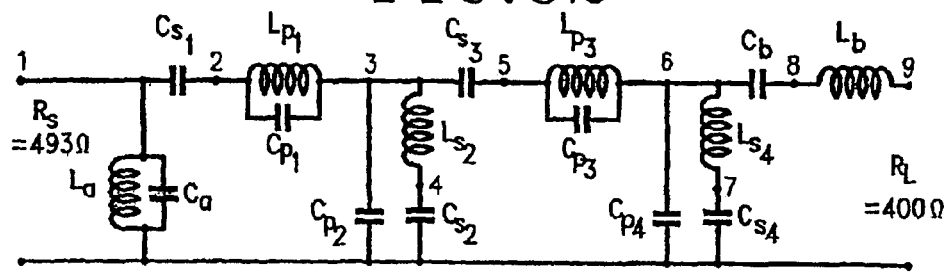
FIG. 32 shows the circuit for an initial zigzag filter.

FIG. 32 shows the circuit for the initial degree 12 zigzag elliptical prototype. The transformation is made by imposing a capacitances ratio of 11.2=$C'_0$(total)/$C_s$ and an inductance of 40 $\mu$H. The only free variable is $C_{sbv}$, that will be chosen to have a low frequency resonance. In this case, the transformation process has the advantage that it enables production of filters taking account of parasite capacitances of crystals in the case in which the package is "grounded" (with some additional calculations). This possibility is useful if it is required to obtain relative bandwidths close to half the theoretical value of the capacitances ratio. The transformation process also has the advantage that it is the only process for making filters with a global response using crystals without using balanced transformers.

The values of elements of the equivalent order 12 zigzag filter circuit illustrated in FIG. 32 are given in table 16 below.

TABLE 16

| | | | | | |
|---|---|---|---|---|---|
| | | | RS = 493.66 1 | | |
| | | | RL = 400.00 9 | | |
| 1 | CAP | Ca | 1 | 0 | 0.27519E−09 |
| 2 | IND | La | 1 | 0 | 0.18703E−07 |
| 3 | CAP | Cs1 | 1 | 2 | 0.13778E−11 |
| 4 | IND | Ls1 | 2 | 3 | 0.18211E−06 |
| 5 | CAP | Cs1 | 2 | 3 | 0.26921E−10 |
| 6 | CAP | Cs2 | 3 | 4 | 0.10866E−11 |
| 7 | IND | Ls2 | 4 | 0 | 0.50177E−05 |
| 8 | CAP | Cp2 | 3 | 0 | 0.19739E−10 |
| 9 | CAP | Cs3 | 3 | 5 | 0.17563E−11 |
| 10 | IND | Lp3 | 5 | 6 | 0.10651E−06 |
| 11 | CAP | Cp3 | 5 | 6 | 0.46679E−10 |
| 12 | CAP | Cs4 | 6 | 7 | 0.43679E−12 |
| 13 | IND | Ls4 | 7 | 0 | 0.12308E−04 |
| 14 | CAP | Cp4 | 6 | 0 | 0.12527E−10 |
| 15 | CAP | Cb | 6 | 8 | 0.95337E−13 |
| 16 | IND | Lb | 8 | 9 | 0.54583E−04 |

Figure 33:
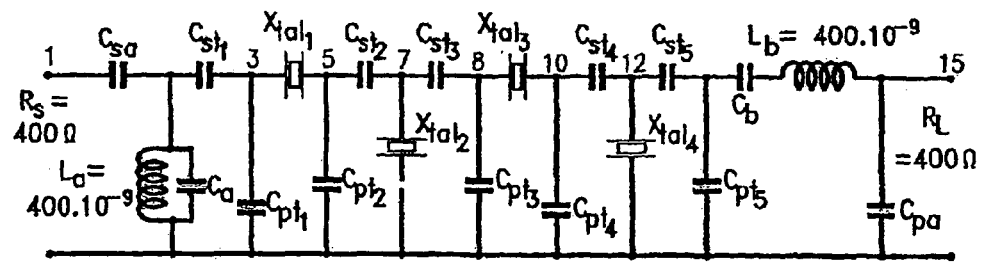
FIG. 33 shows the circuit for the transformed filter.

The circuit for the transformed filter to include lithium tantalate crystal resonators is shown in FIG. 33. For the central frequency, the characteristics of TaLiO3 resonators with cut X are as given above. The same value was chosen for the two inductances at the ends, namely L=400 $\mu$H.

Table 17 below shows the values of elements in the equivalent circuit after transformation (Topology for ATNTNB crystals).

TABLE 17

| | | | | | | |
|---|---|---|---|---|---|---|
| | | | | RS = 400.00 1 | | |
| | | | | RL = 400.00 15 | | |
| 1 | CAP | Cs | 1 | 2 | 0.11280E−11 | |
| 2 | IND | La | 2 | 0 | 0.40000E−06 | 0.350E+03\|Fr(LC) = 84.379 MHz |
| 3 | CAP | Ca | 2 | 0 | 0.88941E−11 | |
| 4 | CAP | Cst | 2 | 3 | 0.39169E−11 | |
| 5 | CAP | Cpt | 3 | 0 | 0.10994E−10 | |
| 6 | CAP | Cp1 | 3 | 5 | 0.14953E−11 | |
| 7 | IND | Ls1 | 3 | 4 | 0.40000E−04 | 0.250E+04\|Fr(crystal) = 68.870500 MHz |
| 8 | CAP | Cs1 | 4 | 5 | 0.13351E−12 | |
| 9 | CAP | Cpt | 5 | 0 | 0.14607E−11 | |
| 10 | CAP | Cst | 5 | 7 | 0.11030E−11 | |
| 11 | CAP | Cp2 | 7 | 0 | 0.15266E−11 | |

TABLE 17-continued

RS = 400.00 1
RL = 400.00 15

| | | | | | | |
|---|---|---|---|---|---|---|
| 12 | IND | Ls2 | 7 | 6 | 0.40000E−04 | 0250E+04\|Fr(crystal) = 68.161982 MHz |
| 13 | CAP | Cs2 | 6 | 0 | 0.13630E−12 | |
| 14 | CAP | Cs2 | 7 | 8 | 0.73416E−12 | |
| 15 | CAP | Cpt | 8 | 0 | 0.57081E−12 | |
| 16 | CAP | Cp3 | 8 | 10 | 0.15164E−11 | |
| 17 | IND | Ls3 | 8 | 9 | 0.40000E−04 | 0250E+04\|Fr(crystal) = 68.388142 MHz |
| 18 | CAP | Cs3 | 9 | 10 | 0.13540E−12 | |
| 19 | CAP | Cpt | 10 | 0 | 0.18325E−11 | |
| 20 | CAP | Cst | 10 | 12 | 0.13582E−10 | |
| 21 | CAP | Cp4 | 12 | 0 | 0.15053E−11 | |
| 22 | IND | Ls4 | 12 | 11 | 0.40000E−04 | 0250E+04\|Fr(crystal) = 68.161982 MHz |
| 23 | CAP | Cs4 | 11 | 0 | 0.13440E−12 | |
| 24 | CAP | Cst | 12 | 13 | 0.77126E−12 | |
| 25 | CAP | Cpt | 13 | 0 | 0.15471E−10 | |
| 26 | CAP | Csb | 13 | 14 | 0.34115E−08 | |
| 27 | IND | Lsb | 14 | 15 | 0.40000E−06 | 0350E+03\|Fr(LC) = 43.084 MHz |
| 28 | CAP | Cpb | 15 | 0 | 0.66159E−10 | |

Figure 34:
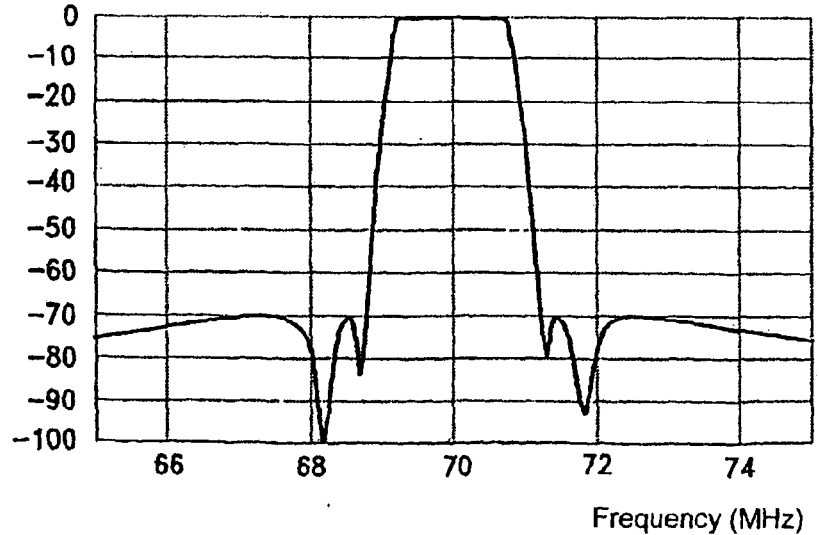
FIG. 34 shows the response of a crystal filter obtained by transformation (lossless)
Figure 35A:
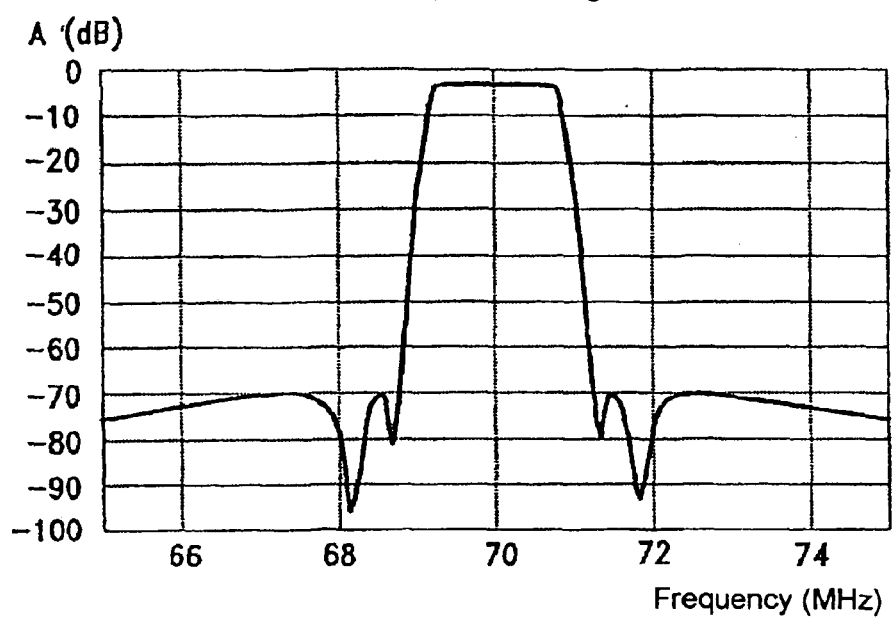
FIG. 35a shows the response of a transformed filter taking account of losses.
Figure 35B:
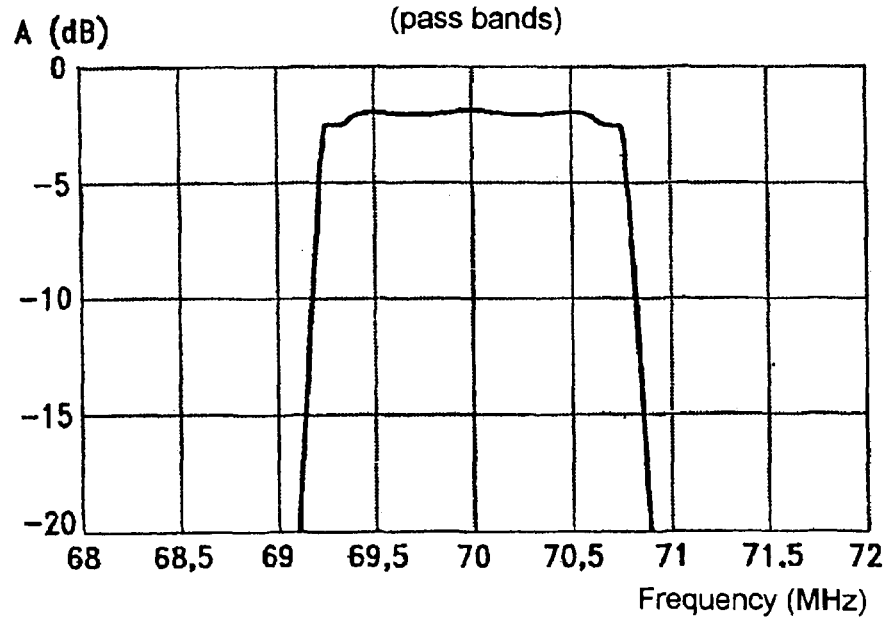
FIG. 35b shows the response of the transformed filter taking account of losses in pass bands.

FIG. 34 shows the response of the transformed crystals filter calculated without losses. FIGS. 35a and 35b show the response of the transformed filter considering losses. The overvoltages considered are as indicated in the above table (after the values of inductances). It is observed that the process provides a filter with an excellent shape factor with few resonators, that in practice only differ by a different final frequency adjustment (step which is in any case essential and automated).

We will now describe an example application of the invention for surface wave filters.

Developments show a simple example of how the transformation process proposed according to the invention can be applied to obtain high frequency filters involving surface wave resonators under conditions facilitating achieving and/or increasing performances. Some useful variants are then discussed, which are equally applicable to the case of bulk wave filters, and particularly to cases of resonators using thin piezoelectric layers.

The operating principle of surface wave resonators has been known for more than 25 years. But the most important developments are recent and are still ongoing in some cases. This is mainly due to the fact that their most important uses are related to the development of mobile radio communications. In this domain, ongoing efforts towards miniaturisation of user terminals facilitate their use, including in multiband.

In their "dipole" variant considered here, they are composed of a central interdigitised transducer located between two networks comprising a large number of fingers that reflect the acoustic energy emitted by the transducer in the two opposite propagation directions, and thus confine it in the central region of the resonator. Another approximately equivalent structure often used is composed of a narrow transducer with a very large number of fingers. This structure uses reflections internal to the transducer that are very significant on highly piezoelectric materials.

In the direction transverse to the propagation, confinement is also (usually) obtained due to discontinuities in the velocity caused by the presence of "rails" bringing in the current surrounding the transducers (and possibly the reflecting networks) and a free space on the outside. The principle and the method of calculating these devices are described in recent literature (for example see references [16 and 22]). Various surface wave types are currently used in the devices. The most frequently used are Rayleigh waves (pure or generalised), transverse or quasi-transverse waves (SSBW, STW) and longitudinal surface pseudo-waves (L-SAW). The latter two wave types are schematically almost bulk waves that are more or less guided (held) close to the surface by modifications to the surface (corrugation or metallisation) that modify their velocity locally. Their decay within the thickness of the wafer may be slower than the decay (exponential) of Rayleigh waves (which is an advantage when making filters resisting a given power since for equal power it reduces the acoustic energy density).

In general, and very schematically, transverse wave resonators produce better overvoltages than resonators using Rayleigh waves. The result is close to the intrinsic value for the materials (central frequency). Remember that the overvoltage varies with 1/Fc, such that for example, $Q_{intrinsic} \cdot Fc =$ constant #$1.5 \times 10^{13}$ for quartz and probably #$2 \times 10^{13}$ for lithium tantalate. Usually, overvoltages for Rayleigh wave devices are also better than for devices using longitudinal pseudo-surface waves (these waves are intrinsically slightly dissipative).

The equivalent circuit usually considered for these devices is the same as the circuit indicated for bulk wave resonators (see FIG. 31).

The following is an example application of the process according to the invention to an order 8 filter:

It is required to use two identical resonators involving the slightly dissipative quasi-longitudinal surface mode (L-SAW) of lithium tantalate with cut Y+42° and two inductances with the same value.

The central frequency of this filter is fixed at 900 MHz, and it must be terminated on 50 Ohms and have a pass band of 20 MHz (ripple 0.3 dB), an attenuation of 20 dB at + and −5 MHz from the corners of the pass band and 30 dB starting from ±7.5 MHz from the pass band. The prototype circuit chosen to satisfy this envelope curve consists of an order 8 zigzag elliptical filter (same type of circuit as in FIG. 19), and the values of the elements of the initial circuit are indicated in table 18 below. It can be seen that the different inductances in this filter are very different and that making the circuit directly results in very serious difficulties, since firstly the orders of magnitude of the two end inductances are very different from the values that are possible with acceptable characteristics, and secondly equivalent circuits for the two three-element resonators are very different from each other and none of them corresponds well to the values that can be obtained for surface wave resonators using a known material and wave type under good response and overvoltage conditions.

TABLE 18

Values of elements of the prototype filter circuit
zigzag Filter order = 8 No. bp900x_4
Fc 900 MHz Bw = 20 MHz, Rip. = 3 dB Rej. = 35 Db
RS = 65.12 1
RL = 50.00 6

| 1 | CAP | Ca | 1 | 0 | 0.14050E−09 |
|---|---|---|---|---|---|
| 2 | IND | La | 1 | 0 | 0.22100E−09 |
| 3 | CAP | Cs1 | 1 | 2 | 0.12145E−11 |
| 4 | IND | L2 | 2 | 3 | 0.89762E−09 |
| 5 | CAP | C2 | 2 | 3 | 0.33419E−10 |
| 6 | CAP | C3 | 3 | 4 | 0.28741E−12 |
| 7 | IND | L3 | 4 | 0 | 0.11346E−06 |
| 8 | CAP | C4 | 3 | 0 | 0.79086E−11 |
| 9 | CAP | Cb | 3 | 5 | 0.68362E−13 |
| 10 | IND | Lb | 5 | 6 | 0.46082E−06 |

This circuit is transformed according to the principles mentioned above, such that the two three-element resonators are made in the form of two identical longitudinal surface quasi-wave resonators that are slightly dissipative and that the two-element resonators at the ends are made using inductances. This arrangement has the advantage that the attenuation poles and most of the attenuation zeros are made using surface wave resonators (high overvoltage) and also that inductance and capacitance resonators are used, thus contributing to eliminating undesirable off-band responses of surface wave resonators.

Close to the chosen central frequency, it is known how to make these resonators in the form of a long transducer with a large number of fingers (slightly more than a hundred) on the lithium tantalate with a Y+48° or Y+52° cut. The values of other manufacturing parameters (aperture, metallisation value, etc.) can be chosen to give a good response, a good overvoltage (700–800) and to be extremely compact. Under these conditions, these resonators are characterised at the central frequency by an equivalent inductance equal to 104.5 nH, a global static capacitance close to about 3.6 nF, a coupling coefficient of about 10.57% and a capacitance ratio $C_0/C_1 = 11.696$.

It was also chosen to use two equal inductances with a low value (20 nH) that can easily be made inside the ceramic package used for the filter (for example in the form of spirals obtained by silk screen printing on an inside face of this miniature package), and such that they have a fairly high overvoltage.

The circuit obtained after the transformation proposed above is illustrated in FIG. 36.

The parameters used during the transformation and the values of the elements obtained after the transformation are given in table 19 below.

TABLE 19

***GLOBAL TRANSFORMATION PARAMETERS
Calculation for C0/C1 = 0, 11695D+02 Csbv varies from 0.200D−11 to 0.220D−10, 5 steps
Calculation step No. 2 parameter Csbv = 7.000 D−12
  Topology: ANNB  eliminated (inequalities)
  Topology: ATNB (L-SAW)  selected in advance (inequalities)
  Topology: ANTB  eliminated (inequalities)
  Topology: ATTB  not selected in advance (Piezo. Res.)
For topology No. 2 ATNB Transformation ratio Na = 0.11413D+01; M1 = 0.95131D+01
Transformation ratio M 2 = 084992D+00
Transformation ratio M 3 = 0.95972D+00
Transformation ratio M 4 = 0., 0833D+00 Nb = 0.10000D+01
***VALUES OF COMPONENTS OF THE TRANSFORMED FILTER Calculation No = 2
End termination a = 50.000
Cs-H matching = 0.327172D−12 Cp-V matching eliminated = 0.324397D−12
LC arm // Vertical Lat = 0.2000D−07 Cat = 0.973991D−12 fa = 0.114032258D+10
Impedance translation: Cs-H 1- 2 = 0.279058D−12 Cp-V 1- 2 = 0.284440D−11
L-SAW resonator horizontal arm fr = 0.881987102D+09 fa = 0.918921629D+09
Lsr 2 = 0.104500D−06 Csr 2 = 0.311601D−12 Cpr 2 = 0.364418D−11
Impedance translation: Cp-V 2__3 = 0.523883D−11 Cs-H 2__3 = 0.405534D−10
L-SAW resonator vertical arm fr = 0.881359165D+09 fa = 0.91826739D+09
Lsr 3 = 0.104500D−06 Csr 3 = 0.312046D−12 Cpr 3 = 0.364937D−11
Impedance translation: Cs__H 3- 4 = 0.380127D−12 Cp__V 3- 4 = 0.137103D−11
LC arm series horizontal Lbt = 0.200D−07 Cbt = 0.16129D−09 fr = 0.886143154D+08
Cs-H matching eliminated = 0.173589D−10 Cp-V matching Cpbada = 0.166055D−10
End termination b = 50.000 Ohms
End of results of calculation step No. = 2 File = 2.CKT
*** Files for analysis with losses 2.CKT topology ATNB

RS = 50.00 1
RL = 50.00 10

| 1 | CAP | Cas | 1 | 2 | 0.32717E−12 | |
|---|---|---|---|---|---|---|
| 2 | IND | La | 2 | 0 | 0.20000E−07 | 0.300E+03 |
| 3 | CAP | Ca | 2 | 0 | 0.97399E−12 | |
| 4 | CAP | Cst | 2 | 3 | 0.27906E−12 | |

TABLE 19-continued

| | | | | | | |
|---|---|---|---|---|---|---|
| 5 | CAP | Cpt | 3 | 0 | 0.28444E−11 | |
| 6 | CAP | Cp2 | 3 | 5 | 0.36442E−11 | |
| 7 | IND | Ls2 | 3 | 4 | 0.10450E−06 | 0.700E+03 |
| 8 | CAP | Cs2 | 4 | 5 | 0.31160E−12 | |
| 9 | CAP | Cpt | 5 | 0 | 0.52388E−11 | |
| 10 | CAP | Cst | 5 | 7 | 0.40553E−10 | |
| 11 | CAP | Cp3 | 7 | 0 | 0.36494E−11 | |
| 12 | IND | Ls3 | 7 | 6 | 0.10450E−06 | 0.700E+03 |
| 13 | CAP | Cs3 | 6 | 0 | 0.31205E−12 | |
| 14 | CAP | Cst | 7 | 8 | 0.38013E−12 | |
| 15 | CAP | Cpt | 8 | 0 | 0.13710E−11 | |
| 16 | CAP | Csb | 8 | 9 | 0.16129E−09 | |
| 17 | IND | Lsb | 9 | 10 | 0.20000E−07 | 0.300E+03 |
| 18 | CAP | Cpa | 10 | 0 | 0.16605E−10 | |

FIG. 37 shows the calculated responses ignoring losses in resonators and inductances, for prototype and transformed order 8 filters with two M-SAW resonators (the responses are then combined), and taking them into account for the transformed filter. It will be noted that the insertion loss remains reasonable under these conditions for a narrow filter. As in the previous case, parasite capacitances are taken into account globally. It will be observed that in the case of a grounded metallic package, for the resonator in a horizontal arm, it would be possible to subtract these two parasite capacitances from the vertical impedance translation capacitances surrounding the resonator, while in the case of the resonator located in a vertical arm, one of them is cancelled and the other has to be subtracted after a T→Π transformation of one of the two capacitances Ts connected to the resonator.

We will now mention variant embodiments.

The proposed embodiment is not frequently used at the moment, and several of its advantages are mentioned above. Another advantage is due to the technology used to make the resonators. It will be noted that the values of most capacitances introduced in the transformation are small, and that they can be made directly on the substrate used for making the L-SAW resonators, which further lowers the production cost (lithium tantalate has fairly high dielectric constants ($\epsilon_r$ of the order of 40) and are stable as a function of temperature and excessively low dielectric losses, which gives very high quality capacitances.

Note also that it could have been decided to make a filter with two TEM dielectric resonators to replace the LC circuits. This solution would keep many of the advantages of the previous solution for reducing the influence of undesirable off-band responses of L-SAW resonators and would lead to lower insertion losses, particularly if half-wave resonators are used. This could be a major advantage when very high performances are required. The proposed process makes it possible to use two resonators with an identical characteristic impedance to reduce the production cost.

Also, as mentioned with respect to the field of application of the invention, the same transformation process is applicable to other known filter topologies, fairly frequently used to obtain filters with surface wave resonators.

Three of these are shown in FIGS. 38a, b and c.

FIG. 38a shows a configuration comprising resonators only, on the horizontal branches and on the vertical branches.

FIG. 38b shows a configuration comprising resonators on the horizontal branches and capacitances on the vertical branches.

FIG. 38c shows a configuration comprising resonators on the vertical branches and capacitances on the horizontal branches.

The first figure (FIG. 38a) that only uses three-element resonators is very interesting when the objective is to use high performance responses making good use of the general nature of the transfer function, and therefore the possibilities offered by the large number of resonators involved. Equivalent circuits for resonators in the various arms are then fairly different (a little bit like the case in the example mentioned above). The use of these circuits up to now with piezoelectric surface or bulk wave resonators is very different from these possibilities, since it makes it necessary to use two resonator types (one for each arm type), a priori and without transformation. This limits the number of infinite attenuation frequencies to two. The proposed transformation process is a means of assimilating the problem to a small number of resonator types (also one or two in practice) that can be made with good performances on known materials but that keep the entire potential of responses possible with this topology (and particularly the large number of different possible infinite attenuation frequencies). This must give far better performances and it must also enable the correction of imperfections with some types of surface wave resonators, that are difficult to avoid at the moment. In particular, it is possible to make judicious use of attenuation poles to eliminate undesirable responses (off-band "parasite" modes) of some resonators (for example L-SAW on lithium niobate).

The other two topologies (FIGS. 38b and 38c) are often used due to the existence of approximate synthesis methods (approximation of a polynomial response in pass band) in order to use identical or almost identical resonators. Under these conditions, they lead to asymmetric responses with a single infinite attenuation frequency (multiple), which rarely corresponds to a required response and does not really lead to the best possible use of resonators. The use of the transformation process according to the invention has the advantage that it enables the production of several infinite attenuation frequencies (at finite frequency, but all located within the same attenuated band) with identical resonators.

7. We will now describe how the process according to the invention is applied to the case of connection filters.

pying frequency bands from 500 to 530 MHz and 540 to 570 MHz respectively. The choice of an "equal ripple" response in the pass band (0.2 dB maximum) and channel separation better than 60 dB, is chosen. The first step is to calculate order 12 elliptical prototypes that have specifications compatible with these characteristics. The responses of filters taken in isolation are shown in FIG. 39, and the values of the "prototype" filter elements are given in table 20 below.

TABLE 20

| | | Zigzag filter order = 6 bp6_515 Fc = 515 MHz BP 30 MHz END A RS = 66.61 1 | | | | | | Zigzag filter order = 6 bp6_555 Fc = 555 MHz BP 30 MHz END A RS = 66.74 1 | | | |
|---|---|---|---|---|---|---|---|---|---|---|---|
| 1 | CAP | Ca | 1 | 0 | 100.5700p | 1 | CAP | Ca | 1 | 0 | 100.4700p |
| 2 | IND | La | 1 | 0 | 936.9500p | 2 | IND | La | 1 | 0 | 808.2000p |
| 3 | CAP | C1 | 1 | 2 | 1.7711p | 3 | CAP | C1 | 1 | 2 | 1.6341p |
| 4 | IND | L2 | 2 | 3 | 5.6261n | 4 | IND | L2 | 2 | 3 | 4.8925n |
| 5 | CAP | C2 | 2 | 3 | 15.0440p | 5 | CAP | C2 | 2 | 3 | 15.0250p |
| 6 | CAP | C3 | 3 | 4 | 2.0528p | 6 | CAP | C3 | 3 | 4 | 1.7651p |
| 7 | IND | L3 | 4 | 0 | 52.5880n | 7 | IND | L3 | 4 | 0 | 52.1940n |
| 8 | CAP | C4 | 3 | 0 | 5.6440p | 8 | CAP | C4 | 3 | 0 | 14.5630p |
| 9 | CAP | C1 | 3 | 5 | 2.3529p | 9 | CAP | C1 | 3 | 5 | 2.1744p |
| 10 | IND | L2 | 5 | 6 | 3.2378n | 10 | IND | L2 | 5 | 6 | 2.806n |
| 11 | CAP | C2 | 6 | 6 | 26.9510p | 11 | CAP | C2 | 6 | 6 | 26.9260p |
| 12 | CAP | C3 | 6 | 7 | 813.3700f | 12 | CAP | C3 | 6 | 7 | 699.6100f |
| 13 | IND | L3 | 7 | 0 | 128.7300n | 13 | IND | L3 | 7 | 0 | 128.0100n |
| 14 | CAP | C4 | 6 | 0 | 10.4430p | 14 | CAP | C4 | 6 | 0 | 9.7121p |
| 15 | CAP | Cb | 6 | 8 | 287.3700f | 15 | CAP | Cb | 6 | 8 | 247.0400f |
| 16 | IND | Lb | 8 | 9 | 39.7900n | 16 | IND | Lb | 8 | 9 | 339.7900n |
| | | End B RL = 50.00 9 | | | | | | End B RL = 50.00 9 | | | | n to p connection filters are composed of filters connecting n accesses (inputs) to p accesses (outputs) and allowing only a finite number of frequency bands (usually one only) to pass from an input to an output. Fairly frequently, there is only one input access (one to p channels) or only one output access (n channels to one), the connection filter being used to send several signals in different frequency bands to a transmission medium, or to extract several signals from different frequency bands. These filters are usually calculated using numerical optimisation techniques starting from synthesised filters, to obtain the required response and a topology favourable for putting one or several accesses in common, when they are taken alone. Optimisation is usually based on minimising an expression representing the difference from the desired responses, according to a specific criterion (least squares, least $k^{th}$). It may also be based on a Remetz type method in the case of an approximation in the Chebyshev sense. In all cases, it modifies the values of components, usually without changing the topology of the different filters, so as to obtain all required connection responses, for example globally characterised by its distribution matrix (Sij). In some cases, it may be useful to introduce one or more supplementary dipoles at the common point(s).

We will now give a simple example related to the case of a duplexer (two channels to one or one channel to 2), and will then go on to describe how the process according to the invention is applicable to the case of connection filters, in the next section.

Therefore, we will consider a connection filter with two channels designed to separate (or multiplex) signals occu- The second step is to connect these filters so that they have a common end B. The characteristics of the responding input (or output) impedance facilitate this connection and there is no need to use a compensation dipole. An optimisation program is used to vary the values of the components of the two filters without modifying the topology, such that the response of each of the filters with a common access is as close as possible, within the pass-band, to the previous response of filters considered in isolation and such that the rejection condition is satisfied. This is done using an optimisation technique based on minimising an error term comprising quadratic errors of transmissions in about 300 frequencies located in the pass bands and attenuated bands of the two filters (least squares approximation of a response that is itself a Chebyshev approximation of an envelope curve. Other techniques are also known and have been evaluated (direct approximation of a Chebyshev envelope curve, least $p^{th}$s, etc.). The inventors considered that the method used in this presentation has the best performances in this case. FIG. 40 shows the variation of responses in the pass-band during the optimisation (all ten optimisation steps starting from the $10^{th}$) (curves with the greatest variation) up to the $400^{th}$)). The reference responses in this figure are shown in dashed lines. FIG. 41 shows the responses finally obtained for the duplexer.

The initial and final values of the elements of the electrical circuit for the filters are shown in table 21 below, in which it can be seen that most of the modifications are minimal except for elements close to the common end.

TABLE 21

Values of elements of the circuit after optimisation:

| | | | | | Zigzag filter order = 6 bp6_5152.opt<br>Fc = 515 MHz BP 30 MHz<br>END A RS = 66.61 1 | | | | | Zigzag filter order = 6 bp6_5552.opt<br>Fc = 555 MHz BP 30 MHz<br>END A' RS = 66.74 17 |
|---|---|---|---|---|---|---|---|---|---|---|
| 1 | CAP | Ca | 1 | 0 | 98.7285p | 1 | CAP | Ca | 17 | 0 | 98.1422p |
| 2 | IND | La | 1 | 0 | 953.4866p | 2 | IND | La | 17 | 0 | 826.5830p |
| 3 | CAP | C1 | 1 | 2 | 1.8070p | 3 | CAP | C1 | 17 | 16 | 1.6505p |
| 4 | IND | L2 | 2 | 3 | 5.3888n | 4 | IND | L2 | 16 | 14 | 4.6817n |
| 5 | CAP | C2 | 2 | 3 | 15.7318p | 5 | CAP | C2 | 16 | 14 | 15.7292p |
| 6 | CAP | C3 | 3 | 4 | 2.1062p | 6 | CAP | C3 | 14 | 15 | 1.85662p |
| 7 | IND | L3 | 4 | 0 | 51.2955n | 7 | IND | L3 | 15 | 0 | 49.7250n |
| 8 | CAP | C4 | 3 | 0 | 16.0177p | 8 | CAP | C4 | 14 | 0 | 15.0920p |
| 9 | CAP | C1 | 3 | 5 | 2.3769p | 9 | CAP | C1 | 14 | 13 | 2.2258p |
| 10 | IND | L2 | 5 | 6 | 3.2483n | 10 | IND | L2 | 13 | 11 | 2.7587n |
| 11 | CAP | C2 | 6 | 6 | 26.8356p | 11 | CAP | C2 | 13 | 11 | 27.3887p |
| 12 | CAP | C3 | 6 | 7 | 854.4680f | 12 | CAP | C3 | 11 | 12 | 754.2172f |
| 13 | IND | L3 | 7 | 0 | 122.5328n | 13 | IND | L3 | 12 | 0 | 118.7264n |
| 14 | CAP | C4 | 6 | 0 | 11.2187p | 14 | CAP | C4 | 11 | 0 | 10.4311p |
| 15 | CAP | Cb | 6 | 8 | 287.3700.f | 15 | CAP | Cb | 11 | 10 | 239.7907f |
| 16 | IND | Lb | 8 | 9 | 349.9832n | 16 | IND | Lb | 10 | 9 | 343.5196n |
| | End B (common) RL = 50.00 | | | | | | End B (common) RL = 50.00 | | | | |

Application of the process according to the invention to the case of connection filters satisfies the criteria given below.

The steps mentioned above for "simple" filters are applicable to connection filters composed of filters with minimum inductance topologies, or using other topologies satisfying criteria defined previously. Also in this case, different coil filter technologies can be used, with dielectric resonators and piezoelectric resonators, possibly combining them in the same connection filter. However, some additional considerations need to be taken into account. In particular, the fact that the two filters have a common end should be taken into account, and if applicable the solution to be selected for impedance transformations at the common end should be chosen carefully. If narrow band matching is chosen, the choice of the type of matching reactances may be important, but in some cases we may want to choose wide band matching since connection filters with a large number of channels fairly frequently operate on a wide spectrum.

This will be better understood after reading the following example that describes an application of the process to the case of the duplexer considered above. Variants will also be proposed.

In this example, we want to make the connection filter at a one channel to two channel connection using a circuit transformation so that it uses TEM dielectric resonators with the same characteristic impedance (the highest performance solution within this frequency range). This deliberately simplified example is presented here to describe the principle according to the process. In practice, we could firstly add additional refinements (using free parameters) to obtain more practical values for some components as was also mentioned above, and it may also be attractive to use another method of obtaining equal termination resistances at the common access after the circuit transformation (for example by additional separation of component—inductance $L_b$ in cases similar to this).

During the calculation mentioned above, an electrical circuit for the duplexer was produced by optimisation, and the duplexer electrical circuit and the values of elements were given in table 21. In this case, considering the comments made above, a particular transformation was made taking account of the fact that the common end B of filters is terminated on 50 ohms (FIG. 42).

FIG. 42 shows that if transformation ratios $m_{b1}$ and $m_{b2}$ are chosen to be equal in the steps (for the two filters) of the systematic circuit transformation process to input lines with the same characteristic impedance, particularly for resonators at end B, it will be possible to eliminate the transformers. This elimination modifies the termination resistance and as in the case of "simple" filters, it will then be necessary to match to obtain the required load resistance (source resistance). Therefore, the procedure for these two filters is essentially as described above, but for ends B of the two filters, the capacitances of the series resonators of the arms joining the common point to the two filters, are separated into only two parts. This separation is made such that the transformation ratios (modifying the impedance levels of resonators $L_{sb1}$–$C_{sbv1}$ and $L_{sb2}$–$C_{sbv2}$ to make them achievable by a dielectric resonator, for example an open circuit quarter wave) are equal.

Thus, in the case of the example considered, the result obtained (having chosen values of parameters that are still free within the range in which a solution exists) is transformed circuits like those illustrated in FIG. 43 in which the two transformation ratios at the common end are equal (in this case $m_{b1}=m_{b2}=0.120$). (FIG. 43 shows a circuit after elimination of the transformers). The responses of the duplexer thus transformed are shown in FIG. 44.

The final step is a narrow band matching that modifies the level of the termination resistance at the common point, which gives the final circuit illustrated in FIG. 45.

Tables 22 and 23 below show the values of elements related to FIGS. 43 and 45.

TABLE 22

Values of elements of the transformed circuit as
far as the common point (end B)

| Filter Fc = 515 MHz BP 30 MHz transformed END A1 R = 50.00 Ohms | | | | | | Filter Fc = 555 MHz BP 30 MHz transformed END A2 R = 50.00 Ohms | | | | | |
|---|---|---|---|---|---|---|---|---|---|---|---|
| 1 | CAP | Csa1 | 1 | 2 | 2.8500p | | 1 | CAP | Csa2 | 1 | 2 | 2.5294p | |
| 2 | IND | Lat1 | 2 | 0 | 4.0861n | Res.1_1 | 2 | IND | Lat2 | 2 | 0 | 3.8272n | |
| 3 | CAP | Cat1 | 2 | 0 | 19.0590p | Res.1_1 | 3 | CAP | Cat2 | 2 | 0 | 17.8510p | Res.1_2 |
| 4 | CAP | Cst1 | 2 | 3 | 2.2234p | | 4 | CAP | Cst2 | 2 | 3 | 1.6834p | Res.1_2 |
| 5 | CAP | Cpt1 | 3 | 0 | 5.4950p | | 5 | CAP | Cpt2 | 3 | 0 | 4.1192p | |
| 6 | CAP | Cs21 | 3 | 4 | 19.8830p | | 6 | CAP | Cs22 | 3 | 4 | 18.5360p | |
| 7 | IND | Pl21 | 4 | 5 | 2.1314n | Res.2_1 | 7 | IND | P122 | 4 | 5 | 1.9870n | Res.2_2 |
| 8 | CAP | Cp21 | 4 | 5 | 39.7660p | Res.2_1 | 8 | CAP | Cp22 | 4 | 5 | 37.0710p | Res.2_2 |
| 9 | CAP | Cpt1 | 5 | 0 | 9.9945p | | 9 | CAP | Cpt2 | 5 | 0 | 10.9440p | |
| 10 | CAP | Cst1 | 5 | 6 | 15.8440p | | 10 | CAP | Cst2 | 5 | 6 | 20.6720p | |
| 11 | CAP | Cs31 | 6 | 7 | 10.0400p | | 11 | CAP | Cs32 | 6 | 7 | 9.2798p | |
| 12 | IND | Lp31 | 7 | 0 | 2.1525n | Res.3_1 | 12 | IND | Lp32 | 7 | 0 | 1.9896n | Res.3_2 |
| 13 | IND | Cp31 | 7 | 0 | 40.1590p | Res.3_1 | 13 | IND | Cp32 | 7 | 0 | 37.1190p | Res.3_2 |
| 14 | CAP | Cst1 | 6 | 8 | 5.3762p | | 14 | CAP | Cst2 | 6 | 8 | 3.5628p | |
| 15 | CAP | Cpt1 | 8 | 0 | 1.3894p | | 15 | CAP | Cpt2 | 8 | 0 | 606.8400f | |
| 16 | CAP | Cs41 | 8 | 9 | 44.8070p | | 16 | CAP | Cs42 | 8 | 9 | 41.7170p | |
| 17 | IND | Lp41 | 9 | 10 | 2.1614n | Res.4_1 | 17 | IND | Lp42 | 9 | 10 | 2.0124n | Res.4_2 |
| 18 | CAP | Cp41 | 9 | 10 | 40.3260p | Res.4_1 | 18 | CAP | Cp42 | 9 | 10 | 37.5460p | Res.4_2 |
| 19 | CAP | Cpt1 | 10 | 0 | 2.2418p | | 19 | CAP | Cpt2 | 10 | 0 | 2.9408p | |
| 20 | CAP | Cst1 | 10 | 11 | 6.9032p | | 20 | CAP | Cst2 | 10 | 11 | 12.7430p | |
| 21 | CAP | Cs51 | 11 | 12 | 5.9064p | | 21 | CAP | Cs52 | 11 | 12 | 5.4619p | |
| 22 | IND | Lp51 | 12 | 0 | 2.2160n | | 22 | IND | Lp52 | 12 | 0 | 2.0493n | Res.5_2 |
| 23 | CAP | Cp51 | 12 | 0 | 41.3450p | Res.5_1 | 23 | CAP | Cp52 | 12 | 0 | 38.2330p | Res.5_2 |
| 24 | CAP | Cst1 | 11 | 13 | 3.1591p | Res.5_1 | 24 | CAP | Cst2 | 11 | 13 | 2.5739p | |
| 25 | CAP | Cpt1 | 13 | 0 | 25.1370p | | 25 | CAP | Cpt2 | 13 | 0 | 19.8270p | |
| 26 | CAP | Csb1 | 13 | 14 | 62.2100p | Res.6_1 | 26 | CAP | Csb2 | 13 | 14 | 61.7810p | Res.6_2 |
| 27 | IND | Lsb1 | 14 | 15 | 5.0750n | Res.6_1 | 27 | IND | Lsb2 | 14 | 15 | 5.0400n | Res.6_2 |
| End B Common R = 50.00*mb$^2$ Characteristic impedance of resonators 11.5 | | | | | | | End B Common R = 50.00*mb$^2$ Characteristic impedance of resonators 11.5 | | | | | | |

** (Resonators 2, 3, 4, 5 are $\lambda/2$ O.C. resonators. Resonator 1 is a $\lambda/4$ S.C. and resonator 6 is a $\lambda/4$ O.C.).

TABLE 23

Matching elements [calculation for
Faverage = $(515*555)^{1/2}$ MHz
and mb$^2$ = 0.120]

Alternative circuit 1

Lsb$_{adapt}$ = 1.779 H
Cpb$_{adapt}$ = 49.08 pF

Alternative circuit 2

Csb$_{adapt}$ = 49.806 pF
Lpb$_{adapt}$ = 1.8055 nH

We will now describe some variants of the process for making connection filters.

The first variant consists of replacing narrow band matching by a wider band matching technique, when necessary, using known techniques that involve the use of quadripoles that are more complex than the two-element quadripoles used above (it is fairly frequent for connection filters to operate over a very wide frequency band). Another advantage of wide band matching is that the reactive part of the input impedance can be taken into account at the common point and thus additional filtering can be added outside pass bands of filters forming the connection. This can be done using high pass, low pass or pass band structures.

A second useful variant in the case of complex connection filters consists of carrying out the different operations in a different order. This variant is based partly on the fact that the phase to optimise connection filter responses means that it is possible to significantly modify the termination resistances, without making any important change to the responses. It is also based on the fact that there are several solution infinities (as a result of free parameters) for filters obtained by transformation, in which all dielectric resonators replacing LC circuits in three-element resonators have the same equivalent circuit (if it was chosen that resonators in horizontal arms will operate with parallel resonance and resonators in vertical arms will operate with serial resonance, their equivalent circuit is fixed by the value of the characteristic impedance and conservation of attenuation poles).

Therefore this variant (for the case of dielectric resonators, but a transposition can be made for cases in which it is required to use a small number of inductances or piezoelectric resonators), consists of directly transforming circuits for filters taken alone by adding matching elements (without making any attempt to minimise the number of components by recombination), and then optimising the response of the connection by leaving the resonators mentioned above fixed and fixing limits to the values of inductances of end resonators (so that the dielectric resonators can develop a suitable characteristic impedance). In this case, it is possible to not introduce many additional elements and to have no selective elements between the access and the common point of the different filters, which is essential when the connection comprises a high pass filter, pass bands filters and low pass filters.

Naturally, it is possible to create solutions that use the simple example given and the variants indicated above, or even other known processes.

Application of the process according to the invention for connection filters is particularly useful in the current context.

It is observed that with the process according to the invention, it is possible to make connection filters using dielectric resonators with the same characteristic impedance and with the most general responses possible using the different zigzag filter topologies.

More generally, considering the current interest in finding economic, compact (miniaturisation) and high performance solutions to the question of antenna filtering in radio communication terminals that are becoming multi-standard and multi-band [for example GSM 900 MHz+GSM 1800 MHz+ IMT2000 2 GHz+IMT2000 2.5 GHz+Satellite], this process is becoming particularly useful for making more general connection filters enabling the connection of few and possibly multi-band antennas respectively to reception and transmission stages (see example in FIG. 46).

FIG. 46 diagrammatically shows three antennas. The first antenna is connected using a "band 1r" connection filter at the input to a converter/LNA amplifier which is connected to a receiving stage through a network comprising three filters in parallel, called the "band 1r", "band 2r" and "band 3r" filters. The second antenna is connected firstly to the LNA input through a "band 2r" connection filter, and secondly to the output of a converter/PA amplifier through a "band 2e" connection filter. The input of the element PA is connected to a transmitter stage through a network comprising two "band 2e" and "band 3e" connection filters in parallel. The third antenna is connected firstly to the LNA input through a "band 3r" connection filter, and secondly to the PA output through a "band 3e" connection filter.

This process can also be used to make connection filters using bulk or surface wave piezoelectric resonators and/or dielectric resonators. It appears that maximum use of the first of these technologies (piezoelectric resonators) is the most promising way of achieving performance and size gains due to the "natural" size of these resonators and also due to possibilities of integrating complex functions on the same substrate (several filters forming all or part of a connection filter).

The process can also be used to make filters with several separate or contiguous pass bands (filter connections through both ends), for example by using a single type of surface wave resonators (per pass band) that can lead to compact, inexpensive, integratable solutions for inter-stage filtering in multi-band terminals. The special case of contiguous or overlapping pass bands can use surface wave technologies or thin piezoelectric layer technologies and be one of the means for making compact and low cost filters capable of carrying greater power while retaining high performances. This means may be combined with previously known solutions (use of highly parallel structures) to further increase the allowable power in these filters.

FIG. 47 shows another example indicating functions that could be implemented using these concepts in a mobile terminal or in a multi-frequency and multi-standard base station.

In this example, simple structures were chosen for connection filters that would be compatible with monolithic integration of the entire radio frequency (UHF) part of a mobile terminal or a base station on a semiconductor, if filters involving thin piezoelectric layers are used.

FIG. 47 diagrammatically shows a dual band antenna connected to a receiver stage by means of a circuit comprising two branches in parallel, one comprising a "band 1r" connection filter, a converter/amplifier LNA1 and a connection filter forming a "band 1r" duplexer in series, the other comprising a "band 2r" connection filter, a converter/amplifier LNA2 and a connection filter forming a "band 2r" duplexer in series. Furthermore, the antenna is connected to a transmitter stage through a circuit comprising two branches in parallel, one comprising a connection filter with a "band 1e" duplexer, a converter/amplifier PA1 and a connection filter forming a "band 1e" multiplexer in series, the other comprising a "band 2e" connection filter with a converter/amplifier PA2 and a connection filter forming a "band 2e" duplexer in series. The various means thus described form an integratable UHF subassembly.

In particular, the process according to this invention can be used on bulk or surface wave crystal resonator filters thin piezoelectric layer resonator filters, or piezoelectric resonator filters using non-crystalline materials such that the ratios of C parallel/C series elements of the equivalent resonators circuit remain within a given range and are set equal to a given value, and that the inductances of these resonators are equal to a given value adapted to economic, easy and high performance production of these resonators.

This invention may also be used for the design of matchable filters for which it is desired to limit the variation of the coupling capacitances between resonators while keeping a pass band with an approximately constant value (in MHz and not as a relative value in %).

It will be observed that the topology of transformed filters conform with this invention is characterised particularly by the systematic presence of capacitance T or Π between resonators.

It should also be noted that after the transformation conform with this invention described above, the topology of the circuit obtained can be described by additional simple transformations, which can have a real advantage in some cases of inductance and capacitance filters. For example, a capacitances Π that appears between resonant circuits can be transformed into a capacitances T, and a capacitances T that appears between resonant circuits can be transformed into a capacitances Π. The advantage of this transformation is that it modifies the values of capacitances in the right direction.

FIG. 48 diagrammatically shows this transformation of T or Π sub-circuits into Π or T sub-circuits, respectively.

FIG. 48a shows the capacitance of a first vertical branch denoted Ca, the capacitance of a horizontal branch denoted Cb and the capacitance of a second vertical branch of a Π denoted Cc. In FIG. 48b, the two capacitances of the horizontal branch are denoted C1 and C2, and the capacitance of the vertical branch of a T is denoted C3.

The transformation is obtained as follows:

$C_1 = (C_a C_b + C_b C_c + C_a C_c)/C_a$ $C_2 = (C_a C_b + C_b C_c + C_a C_c)/C_b$ $C_3 = (C_a C_b + C_b C_c + C_a C_c)/C_c$ and $C_a = C_1 C_2/(C_1+C_2+C_3)$ $C_b = C_1 C_3/(C_1+C_2+C_3)$ $C_c = C_2 C_3/(C_1+C_2+C_3)$ The transformation process described above according to this invention is most useful in the case in which the dipoles forming the arms of the prototype ladder filter are resonators that comprise not more than one inductance (the value of this inductance can be transformed to obtain a required value). Thus preferably, this invention is applicable to prototype filters for which the arms only comprise one element (one capacitance except at the ends) or only comprise a resonator with two or three elements and a single inductance. Obviously, it is also possible to make prior transformations to reach these cases. It is also possible to obtain prototype circuits comprising irreducible dipoles (multimode resonators) with 3, 4 or more elements including more than one inductance (for example for prototypes obtained by low pass—pass band transformations). However, it is generally possible to make transformations considering several consecutive arms of the filter, to create an equivalent structure comprising only arms composed of a capacitance or resonators with a single inductance (Saal and Ulbrich transformation, Colin transformation, etc.).

Furthermore, the same type of transformation as that described above is possible by dividing inductances. The use of two types of transformation then enables useful generalisations.

In the above description, the capacitances are separated into three parts to eliminate internal transformers (or possibly into two parts in some cases for the ends) by a Norton transformation (like that shown diagrammatically particularly in FIGS. 7a and 7b). However, this invention is not limited to these particular transformations. FIGS. 49 and 50 diagrammatically show equivalent transformations that could be used within the context of this invention. If these transformations result in negative capacitances, they should be recombined with similar positive capacitances.

FIG. 49 diagrammatically shows the transformation of a circuit comprising an impedance Z in parallel on the input of a transformer with ratio 1/n into a T circuit comprising a first impedance (1−n)Z and a second impedance n(n−1)Z in its horizontal branch, and an impedance nZ in its vertical branch.

FIG. 50 diagrammatically shows the transformation of a circuit comprising an impedance Z in series on the input to a transformer with a ratio n/1 into a Π circuit comprising an impedance Z/(1−n) in its first vertical branch, an impedance Z/n in its horizontal branch, and an impedance Z/n(n−1) in its second vertical branch.

Obviously, this invention is not limited to the particular embodiments that have just been described, but can be extended to include any variants conform with its spirit.

In particular, this invention is applicable to the design of components for mobile radio communications and satellite communications within the 0.5–3 GHz frequency range (filters and multiplexers using surface wave resonators or dielectric resonators in particular) and transmission by cable. It also enables new solutions for filtering in multi-band or multi-standard terminals.

Bibliography
Filter Classification, Properties and Synthesis

[1] J. K Skwirzynski. On the synthesis of filters IEEE Trans. Circuit Theory vol. CT-18 p 152-16 Jan. 3, 1971.

[2] R. Saal, E. Ulbrich. On the design of filters by synthesis. IRE Trans. on circuit theory CT-5 pp 284–317, December 1958

[3] A. I. Zverev. Handbook of filter synthesis. Wiley New York 1967

[4] P. Amstutz. Elliptic approximation and elliptic filter design on small computers. IEEE Trans. on Circuits and Systems vol. CAS25 pp 1001–1011 1978

[5] M. Hasler, J. Neyrinck. *Filtres Electriques* (Electrical Filters). Electricity treatise volume XIX. Presses Universitaires Romandes, Lausanne 1982

[6] P. Bildstein, *Synthèse des filtres LC* (Synthesis of LC filters). Doc E3120-3, Engineering Techniques. Electronics Treatise vol E3, 21p.

Filters Using Impedance Inverters

[7] P. Amstutz. Filtres à bandes étroites (Narrow band filters). Cable and Transmission; vol. 2 pp 88–97, 1967

[8] R. J Cameron. Fast generation of Chebyshev filter prototypes with asymmetrically-prescribed transmission zeros. ESA Journal vol. 6, pp 83–95, 1982

[9] R. J Cameron. General prototype Network Synthesis method for microwave filters. ESA Journal vol.6, pp 196–206, 1982

[10] G. Macchiarella. An original approach to the design of bandpass cavity filters with multiple couplings. IEEE Trans. MTT, vol.45 No. 2, pp 179–187, February 1997.

Dielectric Resonators, Particularly TEM or quasi TEM Resonators, and Filters Using Them for Applications to Cell Phones

[11] D; Kahfez, P. Guillon. Dielectric resonators. Artech House, London 1986

[12] C. Veyres: *Circuits pour Hyperfréquence* (Circuits for Hyperfrequency) (Documents E620.3, E621.1, E622.1, E623.1, E624.1, E625.1; *Techniques de l'ingénieur, Traité d'électronique* (Engineering Techniques, Electronics Treatise): Vol E1.

[13] Jeong-Soo Lim, Dong Chui Park. A modified Chebyshev Bandpass Filter with attenuation poles in the Stopband. IEEE Trans. MTT, vol. 45 No. 6, pp 898–904, June 1997.

[14] T. Nishikawa. RF front end circuit components—Telephones IEICE Transactions E 74 No. 6, pp 156–162, June 1991

[15] H. Matsumoto et al. Miniaturized duplexer. Telephone IEICE Transactions E 74 No. 5, pp 1214–1220, May 1991

Principle and Properties of Crystal Resonators and Filters Using Crystal Resonators with Bulk or Surface Waves

[16] D; Royer, E. Dieulesaint. *Ondes Elastiques dans les Solides* (Elastic waves in Solids), volumes 1 & 2, Masson, Paris, 1999.

[17] E. A Gerber, A. Ballato, Precision frequency Control, volume 1, chapter 5, Piezoelectric and Electromechanical filters. Academic Press, New York 1985

[18] R. G. Kinsman. Crystal Filters John Wiley, New York 1987

[19] J. Détaint, Optimisation of AT berlinite and quartz thickness shear resonators for VHF filter applications. Proc. 1991 IEEE Int. Frequency Control Symposium, pp 166–180

[20] M. Feldmann, J. Henaff. *Dispositif de Traitement du Signal à Ondes de Surface* (Surface Wave Signal Processing Device), Masson, Paris 1983

[21] C. C. W. Ruppel, R. Dill, A. Fisherauer, G. Fisherauer et al. SAW devices for consumer communication applications. IEEE Trans. Ultrason. Ferroelectrics & Frequency Control V. 40 No. 5, pp 438–450, 1993

[22] C. K. Campbell. Surface Acoustic Wave for Mobile and Wireless Communications. Academics Press, Boston, 1998.

Circuit Theory and Circuit Transformations

[23] M. Feldmann. *Théorie des réseaux et des systèmes linéaires* (Theory of networks and linear systems). Eyrolles, Paris, 1981)

[24] A. B. Williams, F. J. Taylor. Electronic Filter Design Handbook. MacGraw Hill, N.Y., 1992

[25] S. Stephanescu. *Filtres Electriques* (Electric filters). Masson. Paris, 1972

[26] J. E. colin. *Transformation des quadripoles permettant l'introduction des cristaux piezo-électriques dans les filtres passe-bande en échelle* (Transformation of quadripoles enabling the introduction of piezoelectric crystals in ladder pass band filters). *Cable et Transmission* (Cable and Transmission) v.21 No. 2 (1967) (Many other articles on circuit transformations by this author).

Connection Filters

[27] G. Szentimaï (editor). Computer aided filter design. IEEE press 1973. (Collection of basic articles on different questions about this theme including several by J. W Bandler).

[28] J. W. Bandler, S. Daijavad, Q. J. Zhang, "Exact simulation and sensitivity analysis of multiplexing network". IEEE Trans. Microwave Theory, vol. MMT-34, pp 93–102, 1986

[29] M. K Chahine. *Conception de multiplexeur hyperfréquence pour charge utile de satellite de télécommunication* (Design of hyperfrequency multiplexer for telecommunication satellite payload). University of Paris VI thesis presented on May 12, 1994.

What is claimed is:

1. Process for optimisation of the elements of a narrow or intermediate pass band filter for which the LC prototype has been determined, characterised by the fact that it includes the following steps:
   i) decompose resonators with X elements into several parallel or series capacitances
   ii) insert pairs of transformers between the first separate element and the rest of the resonator,
   iii) displace transformers to modify resonator impedance levels, and
   iv) absorb residual transformers by transformation.

2. Process according to claim 1, characterised by the fact that the decomposition step i) comprises decomposing X-element resonators into two parallel or series capacitances.

3. Process according to claim 1, characterised by the fact that the decomposition step i) comprises decomposing X-element resonators into three parallel or series capacitances.

4. Process according to one of claims 1 to 3, characterised by the fact that the decomposition step i) is applicable to two-element resonators.

5. Process according to claim 4, characterised by the fact that the decomposition step i) comprises replacing a parallel circuit comprising an inductance $L_p$ in parallel with a capacitance $C_p$ by a circuit comprising an inductance $L_p$ in parallel with three capacitances $C_{pu}$, $C_{pv}$ and $C_{pw}$.

6. Process according to claim 4, characterised by the fact that the decomposition step i) comprises replacing a series circuit comprising an inductance $L_s$ in series with a capacitance $C_s$ by a circuit comprising an inductance $L_s$ in series with three capacitances $C_{su}$, $C_{sv}$ and $C_{sw}$.

7. Process according to one of claims 1 to 3, characterised by the fact that the decomposition step i) is applicable to three-element resonators.

8. Process according to claim 7, characterised by the fact that the decomposition step i) comprises replacing a circuit comprising a capacitance $C_s$ in series with a resonator formed from an inductance $M_p$ in parallel with a capacitance $C_p$, by a circuit comprising two capacitances $C_{su}$, $C_{sw}$, in series on the input side of a resonator formed from an inductance $M_p$ in parallel with a capacitance $C_p$ and a third capacitance $C_{sw}$ in series on the output side of this resonator.

9. Process according to claim 7, characterised by the fact that the decomposition step i) comprises replacing a circuit comprising capacitance Cp in parallel with a resonator formed by an inductance Ls in series with a capacitance Cs, by a circuit comprising three capacitances Cpu, Cpv and Cpw in parallel with a resonator formed by an inductance Ls in series with a capacitance Cs.

10. Process according to claim 1, characterised by the fact that the transformer insertion step ii) comprises inserting pairs of transformers with ratios 1/mi and mi/1.

11. Process according to claim 1, characterised by the fact that the transformer displacement step iii) comprises making transformers with ratios such as $m_1/m_2=1$, then $m_2/m_3=1$ then $m_3/m_4=1$, . . . , etc. appear.

12. Process according to claim 1, characterised by the fact that the transformer elimination step iv) comprises replacing a transformer and two capacitances, by two other capacitances.

13. Process according to claim 12, characterised by the fact that the transformer elimination step iv) comprises replacing a circuit comprising a parallel capacitance $C_p$ on the input side and a parallel transformer on the output side, connected through a series capacitance $C_s$ on the head line by a circuit comprising a series capacitance $C_{st}$ on the input side and a parallel capacitance $C_{pt}$ on the output side.

14. Process according to claim 12, characterised by the fact that the transformer elimination step iv) comprises replacing a circuit comprising a series capacitance $C_p$ on the input side and a parallel capacitance C'p on the input side of a parallel transformer on the output side, by a circuit comprising a parallel capacitance $C'_{pt}$ on the input side and a series capacitance $C'_{st}$ on the output side.

15. Process according to claim 1, characterised by the fact that the transformer elimination step iv) further comprises eliminating end transformers.

16. Process according to claim 15, characterised by the fact that the end transformer elimination step iv) comprises replacing an end transformer by two impedances with opposite signs.

17. Process according to claim 15, characterised by the fact that during the step to eliminate an end transformer, one of the end components is absorbed by this transformation or is replaced by another component with the same nature and with a different value.

18. Process according to claim 15, characterised by the fact that the end transformer elimination step iv) comprises doing a match using two impedances $Z_1$ and $Z_2$ with opposite signs, defined by:

$$Z_1 = \pm j\sqrt{Z_0(Z^* - Z_0)} \quad \text{and} \quad Z_2 = \pm jZ^* \sqrt{\frac{Z_0}{Z^* - Z_0}}.$$

and in these relations:

$Z_0$ is the required termination impedance, and $Z^*$ is the termination impedance after displacement of transformers at the ends.

19. Process according to claim 18, characterised by the fact that one of the impedances (Z1) is a capacitance, while the other impedance (Z1) is a parallel inductance.

20. Process according to claim 18, characterised by the fact that one of the impedances (Z1) is a capacitance, while the other impedance (Z2) is a negative capacitance.

21. Process according to claim 15, characterised by the fact that the end transformer elimination step iv) comprises making a match using two impedances $Z_1$ and $Z_2$ with opposite signs, defined by:

$$Z_1 = \pm j\sqrt{Z_0(Z^* - Z_0)} \quad \text{and} \quad Z_2 = \mp jZ_0 \sqrt{\frac{Z^*}{Z_0 - Z^*}}.$$

relations in which:

$Z_0$ is the required termination impedance, and $Z^*$ is the termination impedance after displacement of transformers at the ends.

22. Process according to claim 1, characterised by the fact that it uses a two-step optimisation process:

a first step that comprises choosing some auxiliary parameters such as the ratios of the capacitances of three-element resonators and one of the capacitances output from the decomposition of the two-element resonator at one end, to determine the range in which a solution exists for at least one chosen value of the inductances, and a second step which comprises limiting variations of parameters in this range, starting from one end of the filter, to solve equations by choosing at least one of the impedance translation capacitances located between the resonators from a table of standard values, using an algorithm making use of the calculated value at the centre of the range.

23. Process according to claim 1, characterised by the fact that for the design of a multiplexer with several filters and for the ends of the filters, the capacitances of the series resonators of the arms joining the point common to the two filters is divided into two parts, and this division is made such that the transformation ratios are equal.

24. Process according to claim 1, characterised by the fact that it is used for the design of filters based on bulk wave resonators.

25. Process according to claim 1, characterised by the fact that it is used for the design of filters based on surface wave resonators.

26. Process according to claim 1, characterised by the fact that it is used for the design of filters based on piezoelectric crystal resonators, for example with lithium tantalate, or thin piezoelectric layers, for example zinc oxide.

27. Process according to claim 1, characterised by the fact that it is used for the design of a pass band filter for which all the inductances are made equal to a fixed value.

28. Process according to claim 1, characterised by the fact that it is used for the design of a pass band filter with dielectric resonators in TEM mode.

29. Process according to claim 1, characterised by the fact that it is used with at least one resonator in series, one of the accesses being on the central core of the resonator and the other access of the quadripole being on the external metallisation of the resonator.

30. Process according to claim 1, characterised by the fact that it is used for the design of a filter in which at least some capacitances are brought to fixed values, for example standardized.

31. Process according to claim 1, characterised by the fact that it is used for the design of a filter with dielectric resonators with the same characteristic impedance.

32. Process according to claim 1, characterised by the fact that it is used for the design of a filter with piezoelectric resonators with at least approximately the same ratio of capacitances and at least similar inductances.

33. Process according to claim 1, characterised by the fact that it is used for the design of a hybrid filter or multiplexer using inductances and dielectric resonators and/or piezoelectric resonators.

34. Process according to claim 1, characterised by the fact that it is used for the design of a ladder pass band filter.

35. Process according to claim 1; characterised by the fact that it is used for the design of a polynomial filter formed of a succession of series LC dipoles in the horizontal arms and parallel LC dipoles in the vertical arms.

36. Process according to claim 1, characterised by the fact that it is used on bulk or surface wave piezoelectric crystal resonator filters, or piezoelectric resonators using non-crystalline materials, such that the ratios of parallel C/series C elements in the equivalent resonator circuit remain within a given range or are equal to a given value, and that the inductances of these resonators are equal to a given value adapted to economic, easy and high performance production of these resonators.

37. Process according to claim 1, characterised by the fact that it is used to make connection filters composed of filters connecting n input accesses to p output accesses, only allowing a finite number of frequency bands to pass from one input to one output.

38. Process according to claim 1, characterised by the fact that it is used for the design of matchable filters for which it is required to limit the variation of coupling capacitances between resonators while keeping a pass band with an approximately constant value.

39. Process according to claim 1, characterised by the fact that the optimisation applies to a circuit composed of only part of a filter.

40. Process according to claim 1, characterised by the fact that it comprises the step comprising transforming a T circuit into a Π circuit.

41. Process according to claim 1, characterised by the fact that it comprises the step comprising transforming a Π circuit into a T circuit.

42. Pass band filter obtained by using a process which includes the following steps:

i) decomposing resonators with X elements into several parallel or series capacitances, ii) inserting pairs of transformers between the first separate element and the rest of the resonator, iii) displacing transformers to modify resonator impedance levels, and iv) absorbing residual transformers by transformation.

43. Filters according to claim 42, characterised by the fact that they are grouped for making pass band multiplexers formed from several filters connecting n input accesses to p outputs, only allowing a finite number of frequency bands to pass from an input to an output.

44. Filters according to claim 43, characterised by the fact that they comprise a 2-channel to 1-channel duplexer or a 1-channel to 2-channel duplexer.

* * * * *